(12) United States Patent
Rajan et al.

(10) Patent No.: US 10,013,371 B2
(45) Date of Patent: *Jul. 3, 2018

(54) CONFIGURABLE MEMORY CIRCUIT SYSTEM AND METHOD

(71) Applicant: Google LLC, Mountain View, CA (US)

(72) Inventors: Suresh Natarajan Rajan, San Jose, CA (US); Keith R. Schakel, San Jose, CA (US); Michael John Sebastian Smith, Palo Alto, CA (US); David T. Wang, Thousand Oaks, CA (US); Frederick Daniel Weber, San Jose, CA (US)

(73) Assignee: Google LLC, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/358,335

(22) Filed: Nov. 22, 2016

(65) Prior Publication Data

US 2017/0075831 A1 Mar. 16, 2017

Related U.S. Application Data

(60) Continuation of application No. 14/922,388, filed on Oct. 26, 2015, now Pat. No. 9,507,739, which is a
(Continued)

(51) Int. Cl.
*G06F 13/16* (2006.01)
*G06F 13/40* (2006.01)
(Continued)

(52) U.S. Cl.
CPC ...... *G06F 13/1689* (2013.01); *G06F 13/4068* (2013.01); *G11C 5/04* (2013.01);
(Continued)

(58) Field of Classification Search
CPC ............ G06F 13/1689; G06F 13/4068; G11C 11/4076; G11C 11/4093; G11C 2207/2272; G11C 5/04; G11C 5/063
See application file for complete search history.

(56) References Cited

U.S. PATENT DOCUMENTS 3,800,292 A 3/1974 Curley et al.
4,069,452 A 1/1978 Conway et al.
(Continued)

FOREIGN PATENT DOCUMENTS

DE 102004051345 5/2006
DE 102004053316 5/2006
(Continued)

OTHER PUBLICATIONS

BIOS and Kernel Developer's Guide (BKDG) Family 10th Processor, Sep. 7, 2007, Published for Processor Family Purchasers.
(Continued)

*Primary Examiner* — Yaima Rigol
(74) *Attorney, Agent, or Firm* — Fish & Richardson P.C.

(57) ABSTRACT

A memory circuit system and method are provided in the context of various embodiments. In one embodiment, an interface circuit remains in communication with a plurality of memory circuits and a system. The interface circuit is operable to interface the memory circuits and the system for performing various functionality (e.g. power management, simulation/emulation, etc.).

20 Claims, 35 Drawing Sheets

Related U.S. Application Data continuation of application No. 14/090,342, filed on Nov. 26, 2013, now Pat. No. 9,171,585, which is a continuation-in-part of application No. 13/367,182, filed on Feb. 6, 2012, now Pat. No. 8,868,829, which is a continuation of application No. 11/929,636, filed on Oct. 30, 2007, now Pat. No. 8,244,971, which is a continuation of application No. PCT/US2007/016385, filed on Jul. 18, 2007, which is a continuation-in-part of application No. 11/461,439, filed on Jul. 31, 2006, now Pat. No. 7,580,312, and a continuation-in-part of application No. 11/524,811, filed on Sep. 20, 2006, now Pat. No. 7,590,796, and a continuation-in-part of application No. 11/524,730, filed on Sep. 20, 2006, now Pat. No. 7,472,220, and a continuation-in-part of application No. 11/524,812, filed on Sep. 20, 2006, now Pat. No. 7,386,656, and a continuation-in-part of application No. 11/524,716, filed on Sep. 20, 2006, now Pat. No. 7,392,338, and a continuation-in-part of application No. 11/538,041, filed on Oct. 2, 2006, now abandoned, and a continuation-in-part of application No. 11/584,179, filed on Oct. 20, 2006, now Pat. No. 7,581,127, and a continuation-in-part of application No. 11/762,010, filed on Jun. 12, 2007, now Pat. No. 8,041,881, and a continuation-in-part of application No. 11/762,013, filed on Jun. 12, 2007, now Pat. No. 8,090,897, said application No. 14/090,342 is a continuation-in-part of application No. 12/507,682, filed on Jul. 22, 2009, now Pat. No. 8,949,519, which is a continuation of application No. 11/461,427, filed on Jul. 31, 2006, now Pat. No. 7,609,567, which is a continuation-in-part of application No. 11/474,075, filed on Jun. 23, 2006, now Pat. No. 7,515,453, said application No. 14/090,342 is a continuation of application No. 11/672,921, filed on Feb. 8, 2007, now Pat. No. 9,542,352, which is a continuation-in-part of application No. 11/461,437, filed on Jul. 31, 2006, now Pat. No. 8,077,535, which is a continuation-in-part of application No. 11/702,981, filed on Feb. 5, 2007, now Pat. No. 8,089,795, which is a continuation-in-part of application No. 11/702,960, filed on Feb. 5, 2007, said application No. 14/090,342 is a continuation-in-part of application No. 13/620,425, filed on Sep. 14, 2012, now Pat. No. 8,797,779, which is a continuation of application No. 13/341,844, filed on Dec. 30, 2011, now Pat. No. 8,566,556, which is a division of application No. 11/702,981, filed on Feb. 5, 2007, now Pat. No. 8,089,795, which is a continuation-in-part of application No. 11/461,437, filed on Jul. 31, 2006, now Pat. No. 8,077,535, said application No. 14/090,342 is a continuation-in-part of application No. 13/615,008, filed on Sep. 13, 2012, now Pat. No. 8,631,220, which is a continuation of application No. 11/939,440, filed on Nov. 13, 2007, now Pat. No. 8,327,104, which is a continuation-in-part of application No. 11/524,811, filed on Sep. 20, 2006, now Pat. No. 7,590,796, which is a continuation-in-part of application No. 11/461,439, filed on Jul. 31, 2006, now Pat. No. 7,580,312, said application No. 14/090,342 is a continuation-in-part of application No. 13/618,246, filed on Sep. 14, 2012, now Pat. No. 8,615,679, which is a continuation of application No. 13/280,251, filed on Oct. 24, 2011, now Pat. No. 8,386,833, which is a continuation of application No. 11/763,365, filed on Jun. 14, 2007, now Pat. No. 8,060,774, which is a continuation-in-part of application No. 11/474,076, filed on Jun. 23, 2006, now abandoned, said application No. 11/763,365 is a continuation-in-part of application No. 11/515,223, filed on Sep. 1, 2006, now Pat. No. 8,619,452, which is a continuation-in-part of application No. 13/620,565, filed on Sep. 14, 2012, now Pat. No. 8,811,065, which is a continuation of application No. 11/515,223, filed on Sep. 1, 2006, now Pat. No. 8,619,452, said application No. 14/090,342 is a continuation-in-part of application No. 13/620,645, filed on Sep. 14, 2012, now abandoned, which is a continuation of application No. 11/929,655, filed on Oct. 30, 2007, now abandoned, which is a continuation of application No. 11/828,181, filed on Jul. 25, 2007, now abandoned, which is a continuation-in-part of application No. 11/584,179, filed on Oct. 20, 2006, now Pat. No. 7,581,127, which is a continuation of application No. 11/524,811, filed on Sep. 20, 2006, now Pat. No. 7,590,796, which is a continuation-in-part of application No. 11/461,439, filed on Jul. 31, 2006, now Pat. No. 7,580,312, said application No. 14/090,342 is a continuation-in-part of application No. 13/473,827, filed on May 17, 2012, now Pat. No. 8,631,193, which is a division of application No. 12/378,328, filed on Feb. 14, 2009, now Pat. No. 8,438,328, said application No. 14/090,342 is a continuation-in-part of application No. 13/620,793, filed on Sep. 15, 2012, now Pat. No. 8,977,806, which is a continuation of application No. 12/057,306, filed on Mar. 27, 2008, now Pat. No. 8,397,013, which is a continuation-in-part of application No. 11/611,374, filed on Dec. 15, 2006, now Pat. No. 8,055,833, said application No. 14/090,342 is a continuation-in-part of application No. 13/620,424, filed on Sep. 14, 120, now Pat. No. 8,751,732, which is a continuation of application No. 13/276,212, filed on Oct. 18, 2011, now Pat. No. 8,370,566, which is a continuation of application No. 11/611,374, filed on Dec. 15, 2006, now Pat. No. 8,055,833, said application No. 14/090,342 is a continuation-in-part of application No. 13/597,895, filed on Aug. 29, 2012, now Pat. No. 8,675,429, which is a continuation of application No. 13/367,259, filed on Feb. 6, 2012, now Pat. No. 8,279,690, which is a division of application No. 11/941,589, filed on Nov. 16, 2007, now Pat. No. 8,111,566, said application No. 14/090,342 is a continuation-in-part of application No. 13/455,691, filed on Apr. 25, 2012, now Pat. No. 8,710,862, which is a continuation of application No. 12/797,557, filed on Jun. 9, 2010, now Pat. No. 8,169,233, said application No. 14/090,342 is a continuation-in-part of application No. 13/620,412, filed on Sep. 14, 2012, now Pat. No. 8,705,240, which is a continuation of application No. 13/279,068, filed on Oct. 21, 2011, now Pat. No. 8,730,670, which is a division of application No. 12/203,100, filed on Sep. 2, 2008, now Pat. No. 8,081,474, said application No. 14/090,342 is a continuation-in-part of application No. 13/898,002, filed on May 20, 2013, now Pat. No. 8,760,936, which is a continuation of application No. 13/411,489, filed on Mar. 2, 2012, now Pat. No. 8,446,781, which is a continuation of application No. 11/939,432, filed on Nov. 13, 2007, now Pat. No. 8,130,560, said application No. 14/090,342 is a continuation-in-part of application No. 11/515,167, filed on Sep. 1, 2006, now Pat. No. 8,796,830, which is a continuation-in-part of application No. 13/620,199, filed on Sep. 14, 2012, now Pat. No. 8,762,675, which is a continuation of application No. 12/144,396, filed on Jun. 23, 2008, now Pat. No. 8,386,722, said application No. 14/090,342 is a continuation-in-part of application No. 13/620,207, filed on Sep. 14, 2012, now Pat. No. 8,819,356, which is a continuation of application No. 12/508,496, filed on Jul. 23, 2009, now Pat. No. 8,335,894.

(60) Provisional application No. 14/090,342, provisional application No. 61/185,585, filed on Jun. 9, 2009, provisional application No. 61/030,534, filed on Feb. 21, 2008, provisional application No. 61/083,878, filed on Jul. 25, 2008, provisional application No. 61/014,740, filed on Dec. 18, 2007, provisional application No. 60/865,624, filed on Nov. 13, 2006, provisional application No. 60/865,623, filed on Nov. 13, 2006, provisional application No. 60/865,627, filed on Nov. 13, 2006, provisional application No. 60/849,631, filed on Oct. 5, 2006, provisional application No. 60/823,229, filed on Aug. 22, 2006, provisional application No. 60/814,234, filed on Jun. 16, 2006, provisional application No. 60/772,414, filed on Feb. 9, 2006, provisional application No. 60/713,815, filed on Sep. 2, 2005, provisional application No. 60/693,631, filed on Jun. 24, 2005.

(51) Int. Cl.
G11C 11/4093 (2006.01)
G11C 5/04 (2006.01)
G11C 5/06 (2006.01)
G11C 11/4076 (2006.01)

(52) U.S. Cl.
CPC .......... *G11C 5/063* (2013.01); *G11C 11/4076* (2013.01); *G11C 11/4093* (2013.01); *G11C 2207/2272* (2013.01)

(56) References Cited

U.S. PATENT DOCUMENTS

| | | |
|---|---|---|
| 4,323,965 A | 4/1982 | Johnson et al. |
| 4,334,307 A | 6/1982 | Bourgeois et al. |
| 4,345,319 A | 8/1982 | Bernardini et al. |
| 4,392,212 A | 7/1983 | Miyasaka et al. |
| 4,500,958 A | 2/1985 | Manton et al. |
| 4,525,921 A | 7/1985 | Carson et al. |
| 4,566,082 A | 1/1986 | Anderson |
| 4,592,019 A | 5/1986 | Huang et al. |
| 4,628,407 A | 12/1986 | August et al. |
| 4,646,128 A | 2/1987 | Carson et al. |
| 4,698,748 A | 10/1987 | Juzswik et al. |
| 4,706,166 A | 11/1987 | Go |
| 4,710,903 A | 12/1987 | Hereth et al. |
| 4,764,846 A | 8/1988 | Go |
| 4,780,843 A | 10/1988 | Tietjen |
| 4,794,597 A | 12/1988 | Ooba et al. |
| 4,796,232 A | 1/1989 | House |
| 4,807,191 A | 2/1989 | Flannagan |
| 4,841,440 A | 6/1989 | Yonezu et al. |
| 4,862,347 A | 8/1989 | Rudy |
| 4,884,237 A | 11/1989 | Mueller et al. |
| 4,887,240 A | 12/1989 | Garverick et al. |
| 4,888,687 A | 12/1989 | Allison et al. |
| 4,899,107 A | 2/1990 | Corbett et al. |
| 4,912,678 A | 3/1990 | Mashiko |
| 4,916,575 A | 4/1990 | VanAsten |
| 4,922,451 A | 5/1990 | Lo et al. |
| 4,935,734 A | 6/1990 | Austin |
| 4,937,791 A | 6/1990 | Steele et al. |
| 4,956,694 A | 9/1990 | Eide |
| 4,982,265 A | 1/1991 | Watanabe et al. |
| 4,983,533 A | 1/1991 | Go |
| 5,025,364 A | 6/1991 | Zellmer |
| 5,072,424 A | 12/1991 | Brent et al. |
| 5,083,266 A | 1/1992 | Watanabe |
| 5,104,820 A | 4/1992 | Go et al. |
| 5,193,072 A | 3/1993 | Frenkil et al. |
| 5,212,666 A | 5/1993 | Takeda |
| 5,220,672 A | 6/1993 | Nakao et al. |
| 5,222,014 A | 6/1993 | Lin |
| 5,241,266 A | 8/1993 | Ahmad et al. |
| 5,257,233 A | 10/1993 | Schaefer |
| 5,278,796 A | 1/1994 | Tillinghast et al. |
| 5,282,177 A | 1/1994 | McLaury |
| 5,332,922 A | 7/1994 | Oguchi et al. |
| 5,347,428 A | 9/1994 | Carson et al. |
| 5,369,749 A | 11/1994 | Baker et al. |
| 5,384,745 A | 1/1995 | Konishi et al. |
| 5,388,265 A | 2/1995 | Volk |
| 5,390,078 A | 2/1995 | Taylor |
| 5,390,334 A | 2/1995 | Harrison |
| 5,392,251 A | 2/1995 | Manning |
| 5,408,190 A | 4/1995 | Wood et al. |
| 5,432,729 A | 7/1995 | Carson et al. |
| 5,438,536 A | 8/1995 | Salzman |
| 5,448,511 A | 9/1995 | Paurus et al. |
| 5,467,455 A | 11/1995 | Gay et al. |
| 5,483,497 A | 1/1996 | Mochizuki et al. |
| 5,498,886 A | 3/1996 | Hsu et al. |
| 5,502,333 A | 3/1996 | Bertin et al. |
| 5,502,667 A | 3/1996 | Bertin et al. |
| 5,513,135 A | 4/1996 | Dell et al. |
| 5,513,339 A | 4/1996 | Agrawal et al. |
| 5,519,832 A | 5/1996 | Warchol |
| 5,526,320 A | 6/1996 | Zagar et al. |
| 5,530,836 A | 6/1996 | Busch et al. |
| 5,550,781 A | 8/1996 | Sugawara et al. |
| 5,559,990 A | 9/1996 | Cheng et al. |
| 5,561,622 A | 10/1996 | Bertin et al. |
| 5,563,086 A | 10/1996 | Bertin et al. |
| 5,566,344 A | 10/1996 | Hall et al. |
| 5,581,498 A | 12/1996 | Ludwig et al. |
| 5,581,779 A | 12/1996 | Hall et al. |
| 5,590,071 A | 12/1996 | Kolor et al. |
| 5,598,376 A | 1/1997 | Merritt et al. |
| 5,604,714 A | 2/1997 | Manning et al. |
| 5,606,710 A | 2/1997 | Hall et al. |
| 5,608,262 A | 3/1997 | Degani et al. |
| 5,610,864 A | 3/1997 | Manning |
| 5,623,686 A | 4/1997 | Hall et al. |
| 5,627,791 A | 5/1997 | Wright et al. |
| 5,640,337 A | 6/1997 | Huang et al. |
| 5,640,364 A | 6/1997 | Merritt et al. |
| 5,652,724 A | 7/1997 | Manning |
| 5,654,204 A | 8/1997 | Anderson |
| 5,661,677 A | 8/1997 | Rondeau et al. |
| 5,661,695 A | 8/1997 | Zagar et al. |
| 5,668,773 A | 9/1997 | Zagar et al. |
| 5,675,549 A | 10/1997 | Ong et al. |
| 5,680,342 A | 10/1997 | Frankeny |
| 5,682,354 A | 10/1997 | Manning |
| 5,692,121 A | 11/1997 | Bozso et al. |
| 5,692,202 A | 11/1997 | Kardach et al. |
| 5,696,732 A | 12/1997 | Zagar et al. |
| 5,696,929 A | 12/1997 | Hasbun et al. |
| 5,702,984 A | 12/1997 | Bertin et al. |
| 5,702,987 A | 12/1997 | Bertin et al. |
| 5,703,813 A | 12/1997 | Manning et al. |
| 5,706,247 A | 1/1998 | Merritt et al. |
| RE35,733 E | 2/1998 | Hernandez et al. |
| 5,717,654 A | 2/1998 | Manning |
| 5,721,859 A | 2/1998 | Manning |
| 5,724,288 A | 3/1998 | Cloud et al. |
| 5,729,503 A | 3/1998 | Manning |
| 5,729,504 A | 3/1998 | Cowles |
| 5,742,792 A | 4/1998 | Yanai et al. |

(56) References Cited

U.S. PATENT DOCUMENTS

| | | |
|---|---|---|
| 5,748,914 A | 5/1998 | Barth et al. |
| 5,752,045 A | 5/1998 | Chen |
| 5,757,703 A | 5/1998 | Merritt et al. |
| 5,760,478 A | 6/1998 | Bozso et al. |
| 5,761,703 A | 6/1998 | Bolyn |
| 5,765,203 A | 6/1998 | Sangha |
| 5,781,766 A | 7/1998 | Davis |
| 5,787,457 A | 7/1998 | Miller et al. |
| 5,798,961 A | 8/1998 | Heyden et al. |
| 5,802,010 A | 9/1998 | Zagar et al. |
| 5,802,395 A | 9/1998 | Connolly et al. |
| 5,802,555 A | 9/1998 | Shigeeda |
| 5,812,488 A | 9/1998 | Zagar et al. |
| 5,818,788 A | 10/1998 | Kimura et al. |
| 5,819,065 A | 10/1998 | Chilton et al. |
| 5,831,833 A | 11/1998 | Shirakawa et al. |
| 5,831,931 A | 11/1998 | Manning |
| 5,831,932 A | 11/1998 | Merritt et al. |
| 5,834,838 A | 11/1998 | Anderson |
| 5,835,435 A | 11/1998 | Bogin et al. |
| 5,838,165 A | 11/1998 | Chatter |
| 5,838,177 A | 11/1998 | Keeth |
| 5,841,580 A | 11/1998 | Farmwald et al. |
| 5,843,799 A | 12/1998 | Hsu et al. |
| 5,843,807 A | 12/1998 | Burns |
| 5,845,108 A | 12/1998 | Yoo et al. |
| 5,850,368 A | 12/1998 | Ong et al. |
| 5,859,792 A | 1/1999 | Rondeau et al. |
| 5,860,106 A | 1/1999 | Domen et al. |
| 5,870,347 A | 2/1999 | Keeth et al. |
| 5,870,350 A | 2/1999 | Bertin |
| 5,872,907 A | 2/1999 | Griess et al. |
| 5,875,142 A | 2/1999 | Chevallier |
| 5,878,279 A | 3/1999 | Athenes |
| 5,884,088 A | 3/1999 | Kardach et al. |
| 5,901,105 A | 5/1999 | Ong et al. |
| 5,903,500 A | 5/1999 | Tsang et al. |
| 5,905,688 A | 5/1999 | Park |
| 5,907,512 A | 5/1999 | Parkinson et al. |
| 5,910,010 A | 6/1999 | Nishizawa et al. |
| 5,913,072 A | 6/1999 | Wierenga |
| 5,915,105 A | 6/1999 | Farmwald et al. |
| 5,915,167 A | 6/1999 | Leedy |
| 5,917,758 A | 6/1999 | Keeth |
| 5,923,611 A | 7/1999 | Ryan |
| 5,924,111 A | 7/1999 | Huang et al. |
| 5,926,435 A | 7/1999 | Park et al. |
| 5,929,650 A | 7/1999 | Pappert et al. |
| 5,943,254 A | 8/1999 | Bakeman, Jr. et al. |
| 5,946,265 A | 8/1999 | Cowles |
| 5,949,254 A | 9/1999 | Keeth |
| 5,953,215 A | 9/1999 | Karabatsos |
| 5,953,263 A | 9/1999 | Farmwald et al. |
| 5,954,804 A | 9/1999 | Farmwald et al. |
| 5,956,233 A | 9/1999 | Yew et al. |
| 5,959,923 A | 9/1999 | Matteson et al. |
| 5,960,468 A | 9/1999 | Paluch |
| 5,963,429 A | 10/1999 | Chen |
| 5,963,463 A | 10/1999 | Rondeau et al. |
| 5,963,464 A | 10/1999 | Dell et al. |
| 5,963,504 A | 10/1999 | Manning |
| 5,966,724 A | 10/1999 | Ryan |
| 5,966,727 A | 10/1999 | Nishino |
| 5,969,996 A | 10/1999 | Muranaka et al. |
| 5,973,392 A | 10/1999 | Senba et al. |
| 5,978,304 A | 11/1999 | Crafts |
| 5,995,424 A | 11/1999 | Lawrence et al. |
| 5,995,443 A | 11/1999 | Farmwald et al. |
| 6,001,671 A | 12/1999 | Fjelstad |
| 6,002,613 A | 12/1999 | Cloud et al. |
| 6,002,627 A | 12/1999 | Chevallier |
| 6,014,339 A | 1/2000 | Kobayashi et al. |
| 6,016,282 A | 1/2000 | Keeth |
| 6,026,027 A | 2/2000 | Terrell, II et al. |
| 6,026,050 A | 2/2000 | Baker et al. |
| 6,029,250 A | 2/2000 | Keeth |
| 6,032,214 A | 2/2000 | Farmwald et al. |
| 6,032,215 A | 2/2000 | Farmwald et al. |
| 6,034,916 A | 3/2000 | Lee |
| 6,034,918 A | 3/2000 | Farmwald et al. |
| 6,035,365 A | 3/2000 | Farmwald et al. |
| 6,038,195 A | 3/2000 | Farmwald et al. |
| 6,038,673 A | 3/2000 | Benn et al. |
| 6,044,028 A | 3/2000 | Kumagai et al. |
| 6,044,032 A | 3/2000 | Li |
| 6,047,073 A | 4/2000 | Norris et al. |
| 6,047,344 A | 4/2000 | Kawasumi et al. |
| 6,047,361 A | 4/2000 | Ingenio et al. |
| 6,053,948 A | 4/2000 | Vaidyanathan et al. |
| 6,058,451 A | 5/2000 | Bermingham et al. |
| 6,065,092 A | 5/2000 | Roy |
| 6,069,504 A | 5/2000 | Keeth |
| 6,070,217 A | 5/2000 | Connolly et al. |
| 6,073,223 A | 6/2000 | McAllister et al. |
| 6,075,730 A | 6/2000 | Barth et al. |
| 6,075,744 A | 6/2000 | Tsem et al. |
| 6,078,546 A | 6/2000 | Lee |
| 6,079,025 A | 6/2000 | Fung |
| 6,084,434 A | 7/2000 | Keeth |
| 6,088,290 A | 7/2000 | Ohtake et al. |
| 6,091,251 A | 7/2000 | Wood et al. |
| RE36,839 E | 8/2000 | Simmons et al. |
| 6,101,152 A | 8/2000 | Farmwald et al. |
| 6,101,564 A | 8/2000 | Athenes et al. |
| 6,101,612 A | 8/2000 | Jeddeloh |
| 6,108,795 A | 8/2000 | Jeddeloh |
| 6,111,812 A | 8/2000 | Gans et al. |
| 6,125,072 A | 9/2000 | Wu |
| 6,134,638 A | 10/2000 | Olarig et al. |
| 6,154,370 A | 11/2000 | Degani et al. |
| 6,166,991 A | 12/2000 | Phelan |
| 6,181,640 B1 | 1/2001 | Kang |
| 6,182,184 B1 | 1/2001 | Farmwald et al. |
| 6,199,151 B1 | 3/2001 | Williams et al. |
| 6,208,168 B1 | 3/2001 | Rhee |
| 6,216,246 B1 | 4/2001 | Shau |
| 6,222,739 B1 | 4/2001 | Bhakta et al. |
| 6,226,709 B1 | 5/2001 | Goodwin et al. |
| 6,226,730 B1 | 5/2001 | Murdoch et al. |
| 6,233,192 B1 | 5/2001 | Tanaka |
| 6,233,650 B1 | 5/2001 | Johnson et al. |
| 6,240,048 B1 | 5/2001 | Matsubara |
| 6,243,282 B1 | 6/2001 | Rondeau et al. |
| 6,252,807 B1 | 6/2001 | Suzuki et al. |
| 6,253,278 B1 | 6/2001 | Ryan |
| 6,260,097 B1 | 7/2001 | Farmwald et al. |
| 6,260,154 B1 | 7/2001 | Jeddeloh |
| 6,262,938 B1 | 7/2001 | Lee et al. |
| 6,266,285 B1 | 7/2001 | Farmwald et al. |
| 6,266,292 B1 | 7/2001 | Tsem et al. |
| 6,274,395 B1 | 8/2001 | Weber |
| 6,279,069 B1 | 8/2001 | Robinson et al. |
| 6,295,572 B1 | 9/2001 | Wu |
| 6,297,966 B1 | 10/2001 | Lee et al. |
| 6,298,426 B1 | 10/2001 | Ajanovic |
| 6,304,511 B1 | 10/2001 | Gans et al. |
| 6,307,769 B1 | 10/2001 | Nuxoll et al. |
| 6,314,051 B1 | 11/2001 | Farmwald et al. |
| 6,317,352 B1 | 11/2001 | Halbert et al. |
| 6,317,381 B1 | 11/2001 | Gans et al. |
| 6,324,120 B2 | 11/2001 | Farmwald et al. |
| 6,326,810 B1 | 12/2001 | Keeth |
| 6,327,664 B1 | 12/2001 | Dell et al. |
| 6,330,683 B1 | 12/2001 | Jeddeloh |
| 6,336,174 B1 | 1/2002 | Li et al. |
| 6,338,108 B1 | 1/2002 | Motomura |
| 6,338,113 B1 | 1/2002 | Kubo et al. |
| 6,341,347 B1 | 1/2002 | Joy et al. |
| 6,343,019 B1 | 1/2002 | Jiang et al. |
| 6,343,042 B1 | 1/2002 | Tsem et al. |
| 6,353,561 B1 | 3/2002 | Funyu et al. |
| 6,356,105 B1 | 3/2002 | Volk |
| 6,356,500 B1 | 3/2002 | Cloud et al. |
| 6,362,656 B2 | 3/2002 | Rhee |

(56) References Cited

U.S. PATENT DOCUMENTS

| | | |
|---|---|---|
| 6,363,031 B2 | 3/2002 | Phelan |
| 6,378,020 B2 | 4/2002 | Farmwald et al. |
| 6,381,188 B1 | 4/2002 | Choi et al. |
| 6,381,668 B1 | 4/2002 | Lunteren |
| 6,389,514 B1 | 5/2002 | Rokicki |
| 6,392,304 B1 | 5/2002 | Butler |
| 6,414,868 B1 | 7/2002 | Wong et al. |
| 6,418,034 B1 | 7/2002 | Weber et al. |
| 6,421,754 B1 | 7/2002 | Kau et al. |
| 6,424,532 B2 | 7/2002 | Kawamura |
| 6,426,916 B2 | 7/2002 | Farmwald et al. |
| 6,429,029 B1 | 8/2002 | Eldridge et al. |
| 6,430,103 B2 | 8/2002 | Nakayama et al. |
| 6,434,660 B1 | 8/2002 | Lambert et al. |
| 6,437,600 B1 | 8/2002 | Keeth |
| 6,438,057 B1 | 8/2002 | Ruckerbauer |
| 6,442,666 B1 | 8/2002 | Stracovsky |
| 6,442,698 B2 | 8/2002 | Nizar |
| 6,445,591 B1 | 9/2002 | Kwong |
| 6,452,826 B1 | 9/2002 | Kim et al. |
| 6,452,863 B2 | 9/2002 | Farmwald et al. |
| 6,453,400 B1 | 9/2002 | Maesako et al. |
| 6,453,402 B1 | 9/2002 | Jeddeloh |
| 6,453,434 B2 | 9/2002 | Delp et al. |
| 6,455,348 B1 | 9/2002 | Yamaguchi |
| 6,457,095 B1 | 9/2002 | Volk |
| 6,459,651 B1 | 10/2002 | Lee et al. |
| 6,470,417 B1 | 10/2002 | Kolor et al. |
| 6,473,831 B1 | 10/2002 | Schade |
| 6,476,476 B1 | 11/2002 | Glenn |
| 6,480,929 B1 | 11/2002 | Gauthier et al. |
| 6,487,102 B1 | 11/2002 | Halbert et al. |
| 6,489,669 B2 | 12/2002 | Shimada et al. |
| 6,490,161 B1 | 12/2002 | Johnson |
| 6,492,726 B1 | 12/2002 | Quek et al. |
| 6,493,789 B2 | 12/2002 | Ware et al. |
| 6,496,440 B2 | 12/2002 | Manning |
| 6,496,897 B2 | 12/2002 | Ware et al. |
| 6,498,766 B2 | 12/2002 | Lee et al. |
| 6,510,097 B2 | 1/2003 | Fukuyama |
| 6,510,503 B2 | 1/2003 | Gillingham et al. |
| 6,512,392 B2 | 1/2003 | Fleury et al. |
| 6,521,984 B2 | 2/2003 | Matsuura |
| 6,526,471 B1 | 2/2003 | Shimomura et al. |
| 6,526,473 B1 | 2/2003 | Kim |
| 6,526,484 B1 | 2/2003 | Stacovsky et al. |
| 6,545,895 B1 | 4/2003 | Li et al. |
| 6,546,446 B2 | 4/2003 | Farmwald et al. |
| 6,553,450 B1 | 4/2003 | Dodd et al. |
| 6,560,158 B2 | 5/2003 | Choi et al. |
| 6,563,337 B2 | 5/2003 | Dour |
| 6,563,759 B2 | 5/2003 | Yahata et al. |
| 6,564,281 B2 | 5/2003 | Farmwald et al. |
| 6,564,285 B1 | 5/2003 | Mills et al. |
| 6,574,150 B2 | 6/2003 | Suyama et al. |
| 6,584,036 B2 | 6/2003 | Kurjanowicz et al. |
| 6,584,037 B2 | 6/2003 | Farmwald et al. |
| 6,587,912 B2 | 7/2003 | Leddige et al. |
| 6,590,822 B2 | 7/2003 | Hwang et al. |
| 6,594,770 B1 | 7/2003 | Sato et al. |
| 6,597,616 B2 | 7/2003 | Tsem et al. |
| 6,597,617 B2 | 7/2003 | Ooishi et al. |
| 6,614,700 B2 | 9/2003 | Dietrich et al. |
| 6,618,267 B1 | 9/2003 | Dalal et al. |
| 6,618,791 B1 | 9/2003 | Dodd et al. |
| 6,621,760 B1 | 9/2003 | Ahmad et al. |
| 6,628,538 B2 | 9/2003 | Funaba et al. |
| 6,629,282 B1 | 9/2003 | Sugamori et al. |
| 6,630,729 B2 | 10/2003 | Huang |
| 6,631,086 B1 | 10/2003 | Bill et al. |
| 6,639,820 B1 | 10/2003 | Khandekar et al. |
| 6,646,939 B2 | 11/2003 | Kwak |
| 6,650,588 B2 | 11/2003 | Yamagata |
| 6,650,594 B1 | 11/2003 | Lee et al. |
| 6,657,634 B1 | 12/2003 | Sinclair et al. |
| 6,657,918 B2 | 12/2003 | Foss et al. |
| 6,657,919 B2 | 12/2003 | Foss et al. |
| 6,658,016 B1 | 12/2003 | Dai et al. |
| 6,658,530 B1 | 12/2003 | Robertson et al. |
| 6,659,512 B1 | 12/2003 | Harper et al. |
| 6,664,625 B2 | 12/2003 | Hiruma |
| 6,665,224 B1 | 12/2003 | Lehmann et al. |
| 6,665,227 B2 | 12/2003 | Fetzer |
| 6,668,242 B1 | 12/2003 | Reynov et al. |
| 6,674,154 B2 | 1/2004 | Minamio et al. |
| 6,683,372 B1 | 1/2004 | Wong et al. |
| 6,684,292 B2 | 1/2004 | Piccirillo et al. |
| 6,690,191 B2 | 2/2004 | Wu et al. |
| 6,697,295 B2 | 2/2004 | Farmwald et al. |
| 6,701,446 B2 * | 3/2004 | Tsern .................. G06F 1/3225 713/501 |
| 6,705,877 B1 | 3/2004 | Li et al. |
| 6,708,144 B1 | 3/2004 | Merryman et al. |
| 6,710,430 B2 | 3/2004 | Minamio et al. |
| 6,711,043 B2 | 3/2004 | Friedman et al. |
| 6,713,856 B2 | 3/2004 | Tsai et al. |
| 6,714,433 B2 | 3/2004 | Doblar et al. |
| 6,714,891 B2 | 3/2004 | Dendinger |
| 6,724,684 B2 | 4/2004 | Kim |
| 6,730,540 B2 | 5/2004 | Siniaguine |
| 6,731,009 B1 | 5/2004 | Jones et al. |
| 6,731,527 B2 | 5/2004 | Brown |
| 6,742,098 B1 | 5/2004 | Halbert et al. |
| 6,744,687 B2 | 6/2004 | Koo et al. |
| 6,747,887 B2 | 6/2004 | Halbert et al. |
| 6,751,113 B2 | 6/2004 | Bhakta et al. |
| 6,751,696 B2 | 6/2004 | Farmwald et al. |
| 6,754,129 B2 | 6/2004 | Khatri et al. |
| 6,754,132 B2 | 6/2004 | Kyung |
| 6,757,751 B1 | 6/2004 | Gene |
| 6,762,948 B2 | 7/2004 | Kyun et al. |
| 6,765,812 B2 | 7/2004 | Anderson |
| 6,766,469 B2 | 7/2004 | Larson et al. |
| 6,771,526 B2 | 8/2004 | LaBerge |
| 6,772,359 B2 | 8/2004 | Kwak et al. |
| 6,779,097 B2 | 8/2004 | Gillingham et al. |
| 6,785,767 B2 | 8/2004 | Coulson |
| 6,791,877 B2 | 9/2004 | Miura et al. |
| 6,795,899 B2 | 9/2004 | Dodd et al. |
| 6,799,241 B2 | 9/2004 | Kahn et al. |
| 6,801,989 B2 | 10/2004 | Johnson et al. |
| 6,807,598 B2 | 10/2004 | Farmwald et al. |
| 6,807,650 B2 | 10/2004 | Lamb et al. |
| 6,807,655 B1 | 10/2004 | Rehani et al. |
| 6,810,475 B1 | 10/2004 | Tardieux |
| 6,816,991 B2 | 11/2004 | Sanghani |
| 6,819,602 B2 | 11/2004 | Seo et al. |
| 6,819,617 B2 | 11/2004 | Hwang et al. |
| 6,820,163 B1 | 11/2004 | McCall et al. |
| 6,820,169 B2 | 11/2004 | Wilcox et al. |
| 6,826,104 B2 | 11/2004 | Kawaguchi et al. |
| 6,839,290 B2 | 1/2005 | Ahmad et al. |
| 6,844,754 B2 | 1/2005 | Yamagata |
| 6,845,027 B2 | 1/2005 | Mayer et al. |
| 6,845,055 B1 | 1/2005 | Koga et al. |
| 6,847,582 B2 | 1/2005 | Pan |
| 6,850,449 B2 | 2/2005 | Takahashi |
| 6,854,043 B2 | 2/2005 | Hargis et al. |
| 6,862,202 B2 | 3/2005 | Schaefer |
| 6,862,249 B2 | 3/2005 | Kyung |
| 6,862,653 B1 | 3/2005 | Dodd et al. |
| 6,873,534 B2 | 3/2005 | Bhakta et al. |
| 6,878,570 B2 | 4/2005 | Lyu et al. |
| 6,894,933 B2 | 5/2005 | Kuzmenka et al. |
| 6,898,683 B2 | 5/2005 | Nakamura |
| 6,906,407 B2 | 6/2005 | Byers et al. |
| 6,908,314 B2 | 6/2005 | Brown |
| 6,912,778 B2 | 7/2005 | Ahn et al. |
| 6,914,786 B1 | 7/2005 | Paulsen et al. |
| 6,917,219 B2 | 7/2005 | New |
| 6,922,371 B2 | 7/2005 | Takahashi et al. |
| 6,930,900 B2 | 8/2005 | Bhakta et al. |
| 6,930,903 B2 | 8/2005 | Bhakta et al. |
| 6,938,119 B2 | 8/2005 | Kohn et al. |

(56) References Cited

U.S. PATENT DOCUMENTS

| | | |
|---|---|---|
| 6,943,450 B2 | 9/2005 | Fee et al. |
| 6,944,748 B2 | 9/2005 | Sanches et al. |
| 6,947,341 B2 | 9/2005 | Stubbs et al. |
| 6,951,982 B2 | 10/2005 | Chye et al. |
| 6,952,794 B2 | 10/2005 | Lu |
| 6,961,281 B2 | 11/2005 | Wong et al. |
| 6,968,416 B2 | 11/2005 | Moy |
| 6,968,419 B1 | 11/2005 | Holman |
| 6,970,968 B1 | 11/2005 | Holman |
| 6,980,021 B1 | 12/2005 | Srivastava et al. |
| 6,986,118 B2 | 1/2006 | Dickman |
| 6,992,501 B2 | 1/2006 | Rapport |
| 6,992,950 B2 | 1/2006 | Foss et al. |
| 7,000,062 B2 | 2/2006 | Perego et al. |
| 7,003,618 B2 | 2/2006 | Perego et al. |
| 7,003,639 B2 | 2/2006 | Tsem et al. |
| 7,007,095 B2 | 2/2006 | Chen et al. |
| 7,007,175 B2 | 2/2006 | Chang et al. |
| 7,010,642 B2 | 3/2006 | Perego et al. |
| 7,010,736 B1 | 3/2006 | Teh et al. |
| 7,024,518 B2 | 4/2006 | Halbert et al. |
| 7,026,708 B2 | 4/2006 | Cady et al. |
| 7,028,215 B2 | 4/2006 | Depew et al. |
| 7,028,234 B2 | 4/2006 | Huckaby et al. |
| 7,033,861 B1 | 4/2006 | Partridge et al. |
| 7,035,150 B2 | 4/2006 | Streif et al. |
| 7,043,599 B1 | 5/2006 | Ware et al. |
| 7,043,611 B2 | 5/2006 | McClannahan et al. |
| 7,045,396 B2 | 5/2006 | Crowley et al. |
| 7,045,901 B2 | 5/2006 | Lin et al. |
| 7,046,538 B2 | 5/2006 | Kinsley et al. |
| 7,053,470 B1 | 5/2006 | Sellers et al. |
| 7,053,478 B2 | 5/2006 | Roper et al. |
| 7,058,776 B2 | 6/2006 | Lee |
| 7,058,863 B2 | 6/2006 | Kouchi et al. |
| 7,061,784 B2 | 6/2006 | Jakobs et al. |
| 7,061,823 B2 | 6/2006 | Faue et al. |
| 7,062,689 B2 | 6/2006 | Slobodnik |
| 7,066,741 B2 | 6/2006 | Burns et al. |
| 7,075,175 B2 | 7/2006 | Kazi et al. |
| 7,079,396 B2 | 7/2006 | Gates et al. |
| 7,079,441 B1 | 7/2006 | Partsch et al. |
| 7,079,446 B2 | 7/2006 | Murtagh et al. |
| 7,085,152 B2 | 8/2006 | Ellis et al. |
| 7,085,941 B2 | 8/2006 | Li |
| 7,089,438 B2 | 8/2006 | Raad |
| 7,093,101 B2 | 8/2006 | Aasheim et al. |
| 7,103,730 B2 | 9/2006 | Saxena et al. |
| 7,110,322 B2 | 9/2006 | Farmwald et al. |
| 7,111,143 B2 | 9/2006 | Walker |
| 7,117,309 B2 | 10/2006 | Bearden |
| 7,119,428 B2 | 10/2006 | Tanie et al. |
| 7,120,727 B2 | 10/2006 | Lee et al. |
| 7,126,399 B1 | 10/2006 | Lee |
| 7,127,567 B2 | 10/2006 | Ramakrishnan et al. |
| 7,133,960 B1 | 11/2006 | Thompson et al. |
| 7,136,978 B2 | 11/2006 | Miura et al. |
| 7,138,823 B2 | 11/2006 | Janzen et al. |
| 7,149,145 B2 | 12/2006 | Kim et al. |
| 7,149,824 B2 | 12/2006 | Johnson |
| 7,173,863 B2 | 2/2007 | Conley et al. |
| 7,177,206 B2 | 2/2007 | Lee |
| 7,200,021 B2 | 4/2007 | Raghuram |
| 7,205,789 B1 | 4/2007 | Karabatsos |
| 7,210,059 B2 | 4/2007 | Jeddeloh |
| 7,215,561 B2 | 5/2007 | Park et al. |
| 7,218,566 B1 | 5/2007 | Totolos, Jr. et al. |
| 7,224,595 B2 | 5/2007 | Dreps et al. |
| 7,228,264 B2 | 6/2007 | Barrenscheen et al. |
| 7,231,562 B2 | 6/2007 | Ohlhoff et al. |
| 7,233,541 B2 | 6/2007 | Yamamoto et al. |
| 7,234,081 B2 | 6/2007 | Nguyen et al. |
| 7,243,185 B2 | 7/2007 | See et al. |
| 7,245,541 B2 | 7/2007 | Janzen |
| 7,254,036 B2 | 8/2007 | Pauley et al. |
| 7,266,639 B2 | 9/2007 | Raghuram |
| 7,269,042 B2 | 9/2007 | Kinsley et al. |
| 7,269,708 B2 | 9/2007 | Ware |
| 7,274,583 B2 | 9/2007 | Park et al. |
| 7,277,333 B2 | 10/2007 | Schaefer |
| 7,286,436 B2 | 10/2007 | Bhakta et al. |
| 7,289,386 B2 | 10/2007 | Bhakta et al. |
| 7,296,754 B2 | 11/2007 | Nishizawa et al. |
| 7,299,330 B2 | 11/2007 | Gillingham et al. |
| 7,302,598 B2 | 11/2007 | Suzuki et al. |
| 7,307,863 B2 | 12/2007 | Yen et al. |
| 7,317,250 B2 | 1/2008 | Koh et al. |
| 7,327,613 B2 | 2/2008 | Lee |
| 7,336,490 B2 | 2/2008 | Harris et al. |
| 7,337,293 B2 | 2/2008 | Brittain et al. |
| 7,363,422 B2 | 4/2008 | Perego et al. |
| 7,366,947 B2 | 4/2008 | Gower et al. |
| 7,379,316 B2 | 5/2008 | Rajan |
| 7,386,656 B2 | 6/2008 | Rajan et al. |
| 7,392,338 B2 | 6/2008 | Rajan et al. |
| 7,408,393 B1 | 8/2008 | Jain et al. |
| 7,409,492 B2 | 8/2008 | Tanaka et al. |
| 7,414,917 B2 | 8/2008 | Ruckerbauer et al. |
| 7,428,644 B2 | 9/2008 | Jeddeloh et al. |
| 7,437,579 B2 | 10/2008 | Jeddeloh et al. |
| 7,441,064 B2 | 10/2008 | Gaskins |
| 7,457,122 B2 | 11/2008 | Lai et al. |
| 7,464,225 B2 | 12/2008 | Tsern |
| 7,472,220 B2 | 12/2008 | Rajan et al. |
| 7,474,576 B2 | 1/2009 | Co et al. |
| 7,480,147 B2 | 1/2009 | Hoss et al. |
| 7,480,774 B2 | 1/2009 | Ellis et al. |
| 7,496,777 B2 | 2/2009 | Kapil |
| 7,499,281 B2 | 3/2009 | Harris et al. |
| 7,515,453 B2 | 4/2009 | Rajan |
| 7,532,537 B2 | 5/2009 | Solomon et al. |
| 7,539,800 B2 | 5/2009 | Dell et al. |
| 7,573,136 B2 | 8/2009 | Jiang et al. |
| 7,580,312 B2 | 8/2009 | Rajan et al. |
| 7,581,121 B2 | 8/2009 | Barth et al. |
| 7,581,127 B2 | 8/2009 | Rajan et al. |
| 7,590,796 B2 | 9/2009 | Rajan et al. |
| 7,599,205 B2 | 10/2009 | Rajan |
| 7,606,245 B2 | 10/2009 | Ma et al. |
| 7,609,567 B2 | 10/2009 | Rajan et al. |
| 7,613,880 B2 | 11/2009 | Miura et al. |
| 7,619,912 B2 | 11/2009 | Bhakta et al. |
| 7,724,589 B2 | 5/2010 | Rajan et al. |
| 7,730,338 B2 | 6/2010 | Rajan et al. |
| 7,738,252 B2 | 6/2010 | Schuette et al. |
| 7,761,724 B2 | 7/2010 | Rajan et al. |
| 7,791,889 B2 | 9/2010 | Belady et al. |
| 7,911,798 B2 | 3/2011 | Chang et al. |
| 7,934,070 B2 | 4/2011 | Brittain et al. |
| 7,990,797 B2 | 8/2011 | Moshayedi et al. |
| 8,019,589 B2 | 9/2011 | Rajan et al. |
| 8,041,881 B2 | 10/2011 | Rajan et al. |
| 8,080,874 B1 | 12/2011 | Werner et al. |
| 8,081,474 B1 | 12/2011 | Zohni et al. |
| 8,111,566 B1 | 2/2012 | Wang et al. |
| 8,116,144 B2 | 2/2012 | Shaw et al. |
| 8,130,560 B1 | 3/2012 | Rajan et al. |
| 8,169,233 B2 | 5/2012 | Ferolito et al. |
| 8,335,894 B1 | 12/2012 | Rajan et al. |
| 8,340,953 B2 | 12/2012 | Rajan et al. |
| 8,386,722 B1 | 2/2013 | Wang et al. |
| 8,397,013 B1 | 3/2013 | Rosenband et al. |
| 8,796,830 B1 | 8/2014 | Fjelstad |
| 2001/0000822 A1 | 5/2001 | Dell et al. |
| 2001/0003198 A1 | 6/2001 | Wu |
| 2001/0011322 A1 | 8/2001 | Stolt et al. |
| 2001/0019509 A1 | 9/2001 | Aho et al. |
| 2001/0021106 A1 | 9/2001 | Weber et al. |
| 2001/0021137 A1 | 9/2001 | Kai et al. |
| 2001/0046129 A1 | 11/2001 | Broglia et al. |
| 2001/0046163 A1 | 11/2001 | Yaganawa |
| 2001/0052062 A1 | 12/2001 | Lipovski |
| 2002/0002662 A1 | 1/2002 | Olarig et al. |
| 2002/0004897 A1 | 1/2002 | Kao et al. |

(56) References Cited

U.S. PATENT DOCUMENTS

| | | |
|---|---|---|
| 2002/0015340 A1 | 2/2002 | Batinovich |
| 2002/0019961 A1 | 2/2002 | Blodgett |
| 2002/0034068 A1 | 3/2002 | Weber et al. |
| 2002/0038405 A1 | 3/2002 | Leddige et al. |
| 2002/0040416 A1 | 4/2002 | Tsem et al. |
| 2002/0041507 A1 | 4/2002 | Woo et al. |
| 2002/0051398 A1 | 5/2002 | Mizugaki |
| 2002/0060945 A1 | 5/2002 | Ikeda |
| 2002/0060948 A1 | 5/2002 | Chang et al. |
| 2002/0064073 A1 | 5/2002 | Chien |
| 2002/0064083 A1 | 5/2002 | Ryu et al. |
| 2002/0089831 A1 | 7/2002 | Forthun |
| 2002/0089970 A1 | 7/2002 | Asada et al. |
| 2002/0094671 A1 | 7/2002 | Distefano et al. |
| 2002/0121650 A1 | 9/2002 | Minamio et al. |
| 2002/0124195 A1 | 9/2002 | Nizar |
| 2002/0129204 A1 | 9/2002 | Leighnor et al. |
| 2002/0145900 A1 | 10/2002 | Schaefer |
| 2002/0165706 A1 | 11/2002 | Raynham |
| 2002/0167092 A1 | 11/2002 | Fee et al. |
| 2002/0172024 A1 | 11/2002 | Hui et al. |
| 2002/0174274 A1 | 11/2002 | Wu et al. |
| 2002/0184438 A1 | 12/2002 | Usui |
| 2003/0002262 A1 | 1/2003 | Benisek et al. |
| 2003/0011993 A1 | 1/2003 | Summers et al. |
| 2003/0021175 A1 | 1/2003 | Tae Kwak |
| 2003/0026155 A1 | 2/2003 | Yamagata |
| 2003/0026159 A1 | 2/2003 | Frankowsky et al. |
| 2003/0035312 A1 | 2/2003 | Halbert et al. |
| 2003/0039158 A1 | 2/2003 | Horiguchi et al. |
| 2003/0041295 A1 | 2/2003 | Hou et al. |
| 2003/0061458 A1 | 3/2003 | Wilcox et al. |
| 2003/0061459 A1 | 3/2003 | Aboulenein et al. |
| 2003/0083855 A1 | 5/2003 | Fukuyama |
| 2003/0088743 A1 | 5/2003 | Rader |
| 2003/0093614 A1 | 5/2003 | Kohn et al. |
| 2003/0101392 A1 | 5/2003 | Lee |
| 2003/0105932 A1 | 6/2003 | David et al. |
| 2003/0110339 A1 | 6/2003 | Calvignac et al. |
| 2003/0117875 A1 | 6/2003 | Lee et al. |
| 2003/0123389 A1 | 7/2003 | Russell et al. |
| 2003/0126338 A1 | 7/2003 | Dodd et al. |
| 2003/0127737 A1 | 7/2003 | Takahashi |
| 2003/0131160 A1 | 7/2003 | Hampel et al. |
| 2003/0145163 A1 | 7/2003 | Seo et al. |
| 2003/0158995 A1 | 8/2003 | Lee et al. |
| 2003/0164539 A1 | 9/2003 | Yau |
| 2003/0164543 A1 | 9/2003 | Kheng Lee |
| 2003/0174569 A1 | 9/2003 | Amidi |
| 2003/0182513 A1 | 9/2003 | Dodd et al. |
| 2003/0183934 A1 | 10/2003 | Barrett |
| 2003/0189868 A1 | 10/2003 | Riesenman et al. |
| 2003/0189870 A1 | 10/2003 | Wilcox |
| 2003/0191888 A1 | 10/2003 | Klein |
| 2003/0191915 A1 | 10/2003 | Saxena et al. |
| 2003/0200382 A1 | 10/2003 | Wells et al. |
| 2003/0200474 A1 | 10/2003 | Li |
| 2003/0205802 A1 | 11/2003 | Segaram et al. |
| 2003/0206476 A1 | 11/2003 | Joo |
| 2003/0212884 A1 | 11/2003 | Lee et al. |
| 2003/0217303 A1 | 11/2003 | Chua-Eoan et al. |
| 2003/0223290 A1 | 12/2003 | Park et al. |
| 2003/0227798 A1 | 12/2003 | Pax |
| 2003/0229821 A1 | 12/2003 | Ma |
| 2003/0230801 A1 | 12/2003 | Jiang et al. |
| 2003/0231540 A1 | 12/2003 | Lazar et al. |
| 2003/0231542 A1 | 12/2003 | Zaharinova-Papazova et al. |
| 2004/0000708 A1 | 1/2004 | Rapport et al. |
| 2004/0016994 A1 | 1/2004 | Huang |
| 2004/0027902 A1 | 2/2004 | Ooishi et al. |
| 2004/0034732 A1 | 2/2004 | Valin et al. |
| 2004/0034755 A1 | 2/2004 | LaBerge et al. |
| 2004/0037133 A1 | 2/2004 | Park et al. |
| 2004/0042503 A1 | 3/2004 | Shaeffer et al. |
| 2004/0044808 A1 | 3/2004 | Salmon et al. |
| 2004/0047228 A1 | 3/2004 | Chen |
| 2004/0049624 A1 | 3/2004 | Salmonsen |
| 2004/0057317 A1 | 3/2004 | Schaefer |
| 2004/0064647 A1 | 4/2004 | De Whitt et al. |
| 2004/0064767 A1 | 4/2004 | Huckaby et al. |
| 2004/0083324 A1 | 4/2004 | Rabinovitz et al. |
| 2004/0088475 A1 | 5/2004 | Streif et al. |
| 2004/0117723 A1 | 6/2004 | Foss |
| 2004/0123173 A1 | 6/2004 | Emberling et al. |
| 2004/0125635 A1 | 7/2004 | Kuzmenka |
| 2004/0133374 A1 | 7/2004 | Kattan |
| 2004/0133375 A1 | 7/2004 | Kattan |
| 2004/0133736 A1 | 7/2004 | Kyung |
| 2004/0139359 A1 | 7/2004 | Samson et al. |
| 2004/0145963 A1 | 7/2004 | Byon |
| 2004/0151038 A1 | 8/2004 | Ruckerbauer et al. |
| 2004/0174765 A1 | 9/2004 | Seo et al. |
| 2004/0177079 A1 | 9/2004 | Gluhovsky et al. |
| 2004/0178824 A1 | 9/2004 | Pan |
| 2004/0184324 A1 | 9/2004 | Pax |
| 2004/0186956 A1 | 9/2004 | Perego et al. |
| 2004/0188704 A1 | 9/2004 | Halbert et al. |
| 2004/0195682 A1 | 10/2004 | Kimura |
| 2004/0196732 A1 | 10/2004 | Lee |
| 2004/0205433 A1 | 10/2004 | Gower et al. |
| 2004/0208173 A1 | 10/2004 | Di Gregorio |
| 2004/0225858 A1 | 11/2004 | Brueggen |
| 2004/0228166 A1 | 11/2004 | Braun et al. |
| 2004/0228203 A1 | 11/2004 | Koo |
| 2004/0230932 A1 | 11/2004 | Dickmann |
| 2004/0236877 A1 | 11/2004 | Burton |
| 2004/0250989 A1 | 12/2004 | Im et al. |
| 2004/0256638 A1 | 12/2004 | Perego et al. |
| 2004/0257847 A1 | 12/2004 | Matsui et al. |
| 2004/0257857 A1 | 12/2004 | Yamamoto et al. |
| 2004/0260957 A1* | 12/2004 | Jeddeloh ............... G06F 1/206 713/300 |
| 2004/0264255 A1 | 12/2004 | Royer |
| 2004/0268161 A1 | 12/2004 | Ross |
| 2005/0018495 A1 | 1/2005 | Bhakta et al. |
| 2005/0021874 A1 | 1/2005 | Georgiou et al. |
| 2005/0024963 A1 | 2/2005 | Jakobs et al. |
| 2005/0027928 A1 | 2/2005 | Avraham et al. |
| 2005/0028038 A1 | 2/2005 | Pomaranski et al. |
| 2005/0034004 A1 | 2/2005 | Bunker et al. |
| 2005/0036350 A1 | 2/2005 | So et al. |
| 2005/0041504 A1 | 2/2005 | Perego et al. |
| 2005/0044302 A1 | 2/2005 | Pauley et al. |
| 2005/0044303 A1 | 2/2005 | Perego et al. |
| 2005/0044305 A1 | 2/2005 | Jakobs et al. |
| 2005/0047192 A1 | 3/2005 | Matsui et al. |
| 2005/0071543 A1 | 3/2005 | Ellis et al. |
| 2005/0078532 A1 | 4/2005 | Ruckerbauer et al. |
| 2005/0081085 A1 | 4/2005 | Ellis et al. |
| 2005/0086548 A1 | 4/2005 | Haid et al. |
| 2005/0099834 A1 | 5/2005 | Funaba et al. |
| 2005/0102590 A1 | 5/2005 | Norris et al. |
| 2005/0105318 A1 | 5/2005 | Funaba et al. |
| 2005/0108460 A1 | 5/2005 | David |
| 2005/0127531 A1 | 6/2005 | Tay et al. |
| 2005/0132158 A1 | 6/2005 | Hampel et al. |
| 2005/0135176 A1 | 6/2005 | Ramakrishnan et al. |
| 2005/0138267 A1 | 6/2005 | Bains et al. |
| 2005/0138304 A1 | 6/2005 | Ramakrishnan et al. |
| 2005/0139977 A1 | 6/2005 | Nishio et al. |
| 2005/0141199 A1 | 6/2005 | Chiou et al. |
| 2005/0149662 A1 | 7/2005 | Perego et al. |
| 2005/0152212 A1 | 7/2005 | Yang et al. |
| 2005/0156934 A1 | 7/2005 | Perego et al. |
| 2005/0166026 A1 | 7/2005 | Ware et al. |
| 2005/0193163 A1 | 9/2005 | Perego et al. |
| 2005/0193183 A1 | 9/2005 | Barth et al. |
| 2005/0194676 A1 | 9/2005 | Fukuda et al. |
| 2005/0194991 A1 | 9/2005 | Dour et al. |
| 2005/0195629 A1 | 9/2005 | Leddige et al. |
| 2005/0201063 A1 | 9/2005 | Lee et al. |
| 2005/0204111 A1 | 9/2005 | Natarajan |
| 2005/0207255 A1 | 9/2005 | Perego et al. |
| 2005/0210196 A1 | 9/2005 | Perego et al. |

(56) References Cited

U.S. PATENT DOCUMENTS

| | | |
|---|---|---|
| 2005/0223179 A1 | 10/2005 | Perego et al. |
| 2005/0224948 A1 | 10/2005 | Lee et al. |
| 2005/0232049 A1 | 10/2005 | Park |
| 2005/0235119 A1 | 10/2005 | Sechrest et al. |
| 2005/0235131 A1 | 10/2005 | Ware |
| 2005/0237838 A1 | 10/2005 | Kwak et al. |
| 2005/0243635 A1 | 11/2005 | Schaefer |
| 2005/0246558 A1 | 11/2005 | Ku |
| 2005/0249011 A1 | 11/2005 | Maeda |
| 2005/0259504 A1 | 11/2005 | Murtugh et al. |
| 2005/0263312 A1 | 12/2005 | Bolken et al. |
| 2005/0265506 A1 | 12/2005 | Foss et al. |
| 2005/0269715 A1 | 12/2005 | Yoo |
| 2005/0278474 A1 | 12/2005 | Perersen et al. |
| 2005/0281096 A1 | 12/2005 | Bhakta et al. |
| 2005/0281123 A1 | 12/2005 | Bell et al. |
| 2005/0283572 A1 | 12/2005 | Ishihara |
| 2005/0285174 A1 | 12/2005 | Saito et al. |
| 2005/0286334 A1 | 12/2005 | Saito et al. |
| 2005/0289292 A1 | 12/2005 | Morrow et al. |
| 2005/0289317 A1 | 12/2005 | Liou et al. |
| 2006/0002201 A1 | 1/2006 | Janzen |
| 2006/0010339 A1 | 1/2006 | Klein |
| 2006/0026484 A1 | 2/2006 | Hollums |
| 2006/0038597 A1 | 2/2006 | Becker et al. |
| 2006/0039204 A1 | 2/2006 | Cornelius |
| 2006/0039205 A1 | 2/2006 | Cornelius |
| 2006/0041711 A1 | 2/2006 | Miura et al. |
| 2006/0041730 A1 | 2/2006 | Larson |
| 2006/0044909 A1 | 3/2006 | Kinsley et al. |
| 2006/0044913 A1 | 3/2006 | Klein et al. |
| 2006/0049502 A1 | 3/2006 | Goodwin et al. |
| 2006/0050574 A1 | 3/2006 | Streif et al. |
| 2006/0056244 A1 | 3/2006 | Ware |
| 2006/0062047 A1 | 3/2006 | Bhakta et al. |
| 2006/0067141 A1 | 3/2006 | Perego et al. |
| 2006/0085616 A1 | 4/2006 | Zeighami et al. |
| 2006/0087900 A1 | 4/2006 | Bucksch et al. |
| 2006/0090031 A1 | 4/2006 | Kirshenbaum et al. |
| 2006/0090054 A1 | 4/2006 | Choi et al. |
| 2006/0106951 A1 | 5/2006 | Bains |
| 2006/0112214 A1 | 5/2006 | Yeh |
| 2006/0112219 A1 | 5/2006 | Chawla et al. |
| 2006/0117152 A1 | 6/2006 | Amidi et al. |
| 2006/0117160 A1 | 6/2006 | Jackson et al. |
| 2006/0118933 A1 | 6/2006 | Haba |
| 2006/0120193 A1 | 6/2006 | Casper |
| 2006/0123265 A1 | 6/2006 | Ruckerbauer et al. |
| 2006/0126369 A1 | 6/2006 | Raghuram |
| 2006/0129712 A1 | 6/2006 | Raghuram |
| 2006/0129740 A1 | 6/2006 | Ruckerbauer et al. |
| 2006/0129755 A1 | 6/2006 | Raghuram |
| 2006/0133173 A1 | 6/2006 | Jain et al. |
| 2006/0136791 A1 | 6/2006 | Nier le |
| 2006/0149857 A1 | 7/2006 | Holman |
| 2006/0149982 A1 | 7/2006 | Vogt |
| 2006/0174082 A1 | 8/2006 | Bellows et al. |
| 2006/0176744 A1 | 8/2006 | Stave |
| 2006/0179262 A1 | 8/2006 | Brittain et al. |
| 2006/0179333 A1 | 8/2006 | Brittain et al. |
| 2006/0179334 A1 | 8/2006 | Brittain et al. |
| 2006/0180926 A1 | 8/2006 | Mullen et al. |
| 2006/0181953 A1 | 8/2006 | Rotenberg et al. |
| 2006/0195631 A1 | 8/2006 | Rajamani |
| 2006/0198178 A1 | 9/2006 | Kinsley et al. |
| 2006/0203590 A1 | 9/2006 | Mori et al. |
| 2006/0206738 A1 | 9/2006 | Jeddeloh et al. |
| 2006/0233012 A1 | 10/2006 | Sekiguchi et al. |
| 2006/0236165 A1 | 10/2006 | Cepulis et al. |
| 2006/0236201 A1 | 10/2006 | Gower et al. |
| 2006/0248261 A1 | 11/2006 | Jacob et al. |
| 2006/0248387 A1 | 11/2006 | Nicholson et al. |
| 2006/0262586 A1 | 11/2006 | Solomon et al. |
| 2006/0262587 A1 | 11/2006 | Matsui et al. |
| 2006/0277355 A1 | 12/2006 | Ellsberty et al. |
| 2006/0294295 A1 | 12/2006 | Fukuzo |
| 2007/0005998 A1 | 1/2007 | Jain et al. |
| 2007/0011421 A1 | 1/2007 | Keller et al. |
| 2007/0050530 A1 | 3/2007 | Rajan |
| 2007/0058471 A1 | 3/2007 | Rajan et al. |
| 2007/0070669 A1 | 3/2007 | Tsem |
| 2007/0088995 A1 | 4/2007 | Tsem et al. |
| 2007/0091696 A1 | 4/2007 | Niggemeier et al. |
| 2007/0106860 A1 | 5/2007 | Foster, Sr. et al. |
| 2007/0136537 A1 | 6/2007 | Doblar et al. |
| 2007/0152313 A1 | 7/2007 | Periaman et al. |
| 2007/0162700 A1 | 7/2007 | Fortin et al. |
| 2007/0188997 A1 | 8/2007 | Hockanson et al. |
| 2007/0192563 A1 | 8/2007 | Rajan et al. |
| 2007/0195613 A1 | 8/2007 | Rajan et al. |
| 2007/0204075 A1 | 8/2007 | Rajan et al. |
| 2007/0216445 A1 | 9/2007 | Raghavan et al. |
| 2007/0247194 A1 | 10/2007 | Jain |
| 2007/0279084 A1 | 12/2007 | Oh et al. |
| 2007/0285895 A1 | 12/2007 | Gruendler et al. |
| 2007/0288683 A1 | 12/2007 | Panabaker et al. |
| 2007/0288686 A1 | 12/2007 | Arcedera et al. |
| 2007/0288687 A1 | 12/2007 | Panabaker et al. |
| 2007/0290333 A1 | 12/2007 | Saini et al. |
| 2008/0002447 A1 | 1/2008 | Gulachenski et al. |
| 2008/0010435 A1 | 1/2008 | Smith et al. |
| 2008/0025108 A1 | 1/2008 | Rajan et al. |
| 2008/0025122 A1 | 1/2008 | Schakel et al. |
| 2008/0025136 A1 | 1/2008 | Rajan et al. |
| 2008/0025137 A1 | 1/2008 | Rajan et al. |
| 2008/0027697 A1 | 1/2008 | Rajan et al. |
| 2008/0027702 A1 | 1/2008 | Rajan et al. |
| 2008/0027703 A1 | 1/2008 | Rajan et al. |
| 2008/0028135 A1 | 1/2008 | Rajan et al. |
| 2008/0028136 A1 | 1/2008 | Schakel et al. |
| 2008/0028137 A1 | 1/2008 | Schakel et al. |
| 2008/0031030 A1 | 2/2008 | Rajan et al. |
| 2008/0031072 A1 | 2/2008 | Rajan et al. |
| 2008/0034130 A1 | 2/2008 | Perego et al. |
| 2008/0037353 A1 | 2/2008 | Rajan et al. |
| 2008/0056014 A1 | 3/2008 | Rajan et al. |
| 2008/0062773 A1 | 3/2008 | Rajan et al. |
| 2008/0065820 A1 | 3/2008 | Gillingham et al. |
| 2008/0082763 A1 | 4/2008 | Rajan et al. |
| 2008/0086588 A1 | 4/2008 | Danilak et al. |
| 2008/0089034 A1 | 4/2008 | Hoss et al. |
| 2008/0098277 A1 | 4/2008 | Hazelzet |
| 2008/0103753 A1 | 5/2008 | Rajan et al. |
| 2008/0104314 A1 | 5/2008 | Rajan et al. |
| 2008/0109206 A1 | 5/2008 | Rajan et al. |
| 2008/0109595 A1 | 5/2008 | Rajan et al. |
| 2008/0109597 A1 | 5/2008 | Schakel et al. |
| 2008/0109598 A1 | 5/2008 | Schakel et al. |
| 2008/0115006 A1 | 5/2008 | Smith et al. |
| 2008/0120443 A1 | 5/2008 | Rajan et al. |
| 2008/0120458 A1 | 5/2008 | Gillingham et al. |
| 2008/0123459 A1 | 5/2008 | Rajan et al. |
| 2008/0126624 A1 | 5/2008 | Prete et al. |
| 2008/0126687 A1 | 5/2008 | Rajan et al. |
| 2008/0126688 A1 | 5/2008 | Rajan et al. |
| 2008/0126689 A1 | 5/2008 | Rajan et al. |
| 2008/0126690 A1 | 5/2008 | Rajan et al. |
| 2008/0126692 A1 | 5/2008 | Rajan et al. |
| 2008/0130364 A1 | 6/2008 | Guterman et al. |
| 2008/0133825 A1 | 6/2008 | Rajan et al. |
| 2008/0155136 A1 | 6/2008 | Hishino |
| 2008/0159027 A1 | 7/2008 | Kim |
| 2008/0170425 A1 | 7/2008 | Rajan |
| 2008/0195894 A1 | 8/2008 | Schreck et al. |
| 2008/0215832 A1 | 9/2008 | Allen et al. |
| 2008/0239857 A1 | 10/2008 | Rajan et al. |
| 2008/0239858 A1 | 10/2008 | Rajan et al. |
| 2008/0256282 A1 | 10/2008 | Guo et al. |
| 2008/0282084 A1 | 11/2008 | Hatakeyama |
| 2008/0282341 A1 | 11/2008 | Hatakeyama |
| 2009/0024789 A1 | 1/2009 | Rajan et al. |
| 2009/0024790 A1 | 1/2009 | Rajan et al. |
| 2009/0049266 A1 | 2/2009 | Kuhne |
| 2009/0063865 A1 | 3/2009 | Berenbaum et al. |

(56) References Cited

U.S. PATENT DOCUMENTS

| | | | |
|---|---|---|---|
| 2009/0063896 | A1 | 3/2009 | Lastras-Montano et al. |
| 2009/0070520 | A1 | 3/2009 | Mizushima |
| 2009/0089480 | A1 | 4/2009 | Wah et al. |
| 2009/0109613 | A1 | 4/2009 | Legen et al. |
| 2009/0180926 | A1 | 7/2009 | Petruno et al. |
| 2009/0216939 | A1 | 8/2009 | Smith et al. |
| 2009/0285031 | A1 | 11/2009 | Rajan et al. |
| 2009/0290442 | A1 | 11/2009 | Rajan |
| 2010/0005218 | A1 | 1/2010 | Gower et al. |
| 2010/0020585 | A1 | 1/2010 | Rajan |
| 2010/0257304 | A1 | 10/2010 | Rajan et al. |
| 2010/0271888 | A1 | 10/2010 | Rajan et al. |
| 2010/0281280 | A1 | 11/2010 | Rajan et al. |

FOREIGN PATENT DOCUMENTS

| | | |
|---|---|---|
| DE | 102005036528 | 2/2007 |
| EP | 0132129 | 1/1985 |
| EP | 0644547 | 3/1995 |
| JP | 62121978 | 6/1987 |
| JP | 01-171047 | 7/1989 |
| JP | 03-29357 | 2/1991 |
| JP | 03-276487 | 12/1991 |
| JP | 03-286234 | 12/1991 |
| JP | 05-274227 | 10/1993 |
| JP | 05-298192 | 11/1993 |
| JP | 07-141870 | 6/1995 |
| JP | 08-77097 | 3/1996 |
| JP | 2008-179994 | 7/1996 |
| JP | 09-231127 | 9/1997 |
| JP | 10-233091 | 9/1998 |
| JP | 10-260895 | 9/1998 |
| JP | 10233091 | 10/1998 |
| JP | 11-073773 | 3/1999 |
| JP | 11-096081 | 4/1999 |
| JP | 11-149775 | 6/1999 |
| JP | 11-224221 | 8/1999 |
| JP | 2001-167001 | 6/2001 |
| JP | 22025255 | 1/2002 |
| JP | 3304893 | 5/2002 |
| JP | 2002-288037 | 10/2002 |
| JP | 2002288037 | 10/2002 |
| JP | 2003-023349 | 1/2003 |
| JP | 04-327474 | 11/2004 |
| JP | 2005062914 | 3/2005 |
| JP | 2005108224 | 4/2005 |
| JP | 2006236388 | 9/2006 |
| KR | 1999-0076659 | 10/1999 |
| KR | 1020040062717 | 7/2004 |
| KR | 2005120344 | 12/2005 |
| WO | 1995/05676 | 2/1995 |
| WO | 1997/25674 | 7/1997 |
| WO | 99/000734 | 1/1999 |
| WO | 9900734 | 1/1999 |
| WO | 2000/45270 | 8/2000 |
| WO | 2001/37090 | 5/2001 |
| WO | 2001/90900 | 11/2001 |
| WO | 2001/97160 | 12/2001 |
| WO | 2004/044754 | 5/2004 |
| WO | 2004/051645 | 6/2004 |
| WO | 2006/072040 | 7/2006 |
| WO | 2007/002324 | 1/2007 |
| WO | 2007/028109 | 3/2007 |
| WO | 2007/038225 | 4/2007 |
| WO | 2007/095080 | 8/2007 |
| WO | 2008/063251 | 5/2008 |

OTHER PUBLICATIONS

Using Two Chip Selects to Enable Quad Rank, Retrieved on Feb. 26, 2008 From IP.COM# 000132468D.
Wu et al., "eNVy: A Non-Volatile, Main Memory Storage System", ASPLOS-VI Proceedings, Oct. 4-7, 1994. SIGARCH Computer Architecture News 22 (Special Issue Oct. 1994), pp. 86-97.
Search Report and Written Opinion From PCT Application No. PCT/US07/03460 dated Feb. 14, 2008.
International Preliminary Examination Report From PCT Application No. PCT /US07/016385 dated Feb. 3, 2009.
Kellerbauer, R. "Die Schnelle Million," with translation, "The Quick Million: Memory Expansion for 1040 ST and Mega ST 1," Dec. 1991.
Skerlj et al. "Buffer Device for Memory Modules". 2006, p. 1.
Preliminary Report on Patentability From PCT Application No. PCT/US06/24360 dated Jan. 10, 2008.
Written Opinion From PCT Application No. PCT/US06/24360 dated Jan. 8, 2007.
International Search Report From PCT Application No. PCT/US06/34390 dated Nov. 21, 2007.
Written Opinion From PCT Application No. PCT/US06/34390 dated Nov. 21, 2007.
Final Office Action from U.S. Appl. No. 11/461,430 dated Sep. 8, 2008.
Notice of Allowance from U.S. Appl. No. 11/474,075 dated Nov. 26, 2008.
Non-Final Office Action from U.S. Appl. No. 11/474,076 dated Nov. 3, 2008.
Non-Final Office Action from U.S. Appl. No. 11/524,811 dated Sep. 17, 2008.
Non-Final Office Action from U.S. Appl. No. 11/461,430 dated Feb. 19, 2009.
Non-Final Office Action from U.S. Appl. No. 11/461,437 dated Jan. 26, 2009.
Final Office Action from U.S. Appl. No. 11/461,435 dated Jan. 28, 2009.
Non-Final Office Action from U.S. Appl. No. 11/939,432 dated Feb. 6, 2009.
Non-Final Office Action from U.S. Appl. No. 11/461,427 dated Sep. 5, 2008.
Non-Final Office Action from U.S. Appl. No. 11/461,441 dated Apr. 2, 2009.
Non-Final Office Action from U.S. Appl. No. 11/611,374 dated Mar. 23, 2009.
Non-Final Office Action from U.S. Appl. No. 11/702,981 dated Mar. 11, 2009.
Non-Final Office Action from U.S. Appl. No. 11/762,010 dated Mar. 20, 2009.
German Office Action from German Patent Application No. 11 2006 001 810.8-55 dated Feb. 18, 2009 (With Translation).
German Office Action from German Patent Application No. 11 2006 002 300.4-55 dated May 11, 2009 (With Translation).
Non-Final Office Action from U.S. Appl. No. 12/111,828 dated Apr. 17, 2009.
Non-Final Office Action from U.S. Appl. No. 12/111,819 dated Apr. 27, 2009.
"Buffer Device for Memory Modules (DIMM)", IP.com Prior Art Database, [retrieved on Sep. 9, 2008] Retrieved from the Internet: <URL: <http://www.priorartdatabase.com/IPCOM/00014850/>, 2 pp.
Final Office Action from U.S. Appl. No. 11/939,432 dated Feb. 19, 2009.
"Buffer Device for Memory Modules (DIMM)", IP.com Prior Art Database, <URL:http://ip.com/IPCOM/000144850>, Feb. 10, 2007, 1 pg.
Supplemental European Search Report and Search Opinion dated Sep. 21, 2009 in European Application No. 07870726.2, 8 pp.
Form A0-120 as filed in U.S. Pat. No. 7,472,220 on Jun. 17, 2009.
Fang et al., W. Power Complexity Analysis of Adiabatic SRAM, 6th Int. Conference on ASIC, vol. 1, Oct. 2005, pp. 334-337.
Pavan et al., P. A Complete Model Of E2PROM Memory Cells for Circuit Simulations, IEEE Transactions on Computer-Aided Design of Integrated Circuits and Systems, vol. 22, No. 8, Aug. 2003, pp. 1072-1079.
Non-Final Office Action from U.S. Appl. No. 11/538,041 dated Jun. 10, 2009.
Non-Final Office Action from U.S. Appl. No. 11/553,372 dated Jun. 25, 2009.

(56) References Cited

OTHER PUBLICATIONS

Non-Final Office Action from U.S. Appl. No. 11/553,399 dated Jul. 7, 2009.
Non-Final Office Action from U.S. Appl. No. 11/461,420 dated Jul. 23, 2009.
Non-Final Office Action from U.S. Appl. No. 11/461,435 dated Aug. 5, 2009.
Non-Final Office Action from Application No. 11/762,013 dated Jun. 5, 2009.
Non-Final Office Action from U.S. Appl. No. 11/858,518 dated Aug. 14, 2009.
Non-Final Office Action from U.S. Appl. No. 11/702,981 dated Aug. 19, 2009.
Non-Final Office Action from U.S. Appl. No. 11/553,390 dated Sep. 9, 2009.
Non-Final Office Action from U.S. Appl. No. 11/929,500 dated Oct. 13, 2009.
Notice of Allowance from U.S. Appl. No. 11/553,399 dated Oct. 13, 2009.
Non-Final Office Action from U.S. Appl. No. 11/941,589 dated Oct. 1, 2009.
Notice of Allowance from U.S. Appl. No. 11/553,372 dated Sep. 30, 2009.
Non-Final Office Action from U.S. Appl. No. 11/702,960 dated Sep. 25, 2009.
Non-Final Office Action from U.S. Appl. No. 11/515,167 dated Sep. 25, 2009.
Notice of Allowance from U.S. Appl. No. 11/939,432 dated Sep. 24, 2009.
Non-Final Office Action from U.S. Appl. No. 11/515,223 dated Sep. 22, 2009.
Notice of Allowance from U.S. Appl. No. 11/461,430 dated Sep. 9, 2009.
Notice of Allowance from U.S. Appl. No. 11/611,374 dated Sep. 15, 2009.
Non-Final Office Action from U.S. Appl. No. 11/763,365 dated Oct. 28, 2009.
Final Rejection From U.S. Appl. No. 11/461,437 dated Nov. 10, 2009.
Notice of Allowance from U.S. Appl. No. 11/611,374 dated Nov. 30, 2009.
Non-Final Rejection From U.S. Appl. No. 11/672,921 dated Dec. 8, 2009.
Non-Final Rejection From U.S. Appl. No. 11/672,924 dated Dec. 14, 2009.
Final Rejection From U.S. Appl. No. 11/762,010 dated Dec. 4, 2009.
Non-Final Rejection From U.S. Appl. No. 11/929,225 dated Dec. 14, 2009.
Non-Final Rejection From Application No. 11/929,261 dated Dec. 14, 2009.
Notice of Allowance from Application No. 12/111,819 dated Nov. 20, 2009.
Notice of Allowance from Application No. 12/111,828 dated Dec. 15, 2009.
Notice of Allowance from U.S. Appl. No. 11/939,432 dated Dec. 1, 2009.
Notice of Allowance from U.S. Appl. No. 12/111,819 dated Mar. 10, 2010.
Notice of Allowance from U.S. Appl. No. 11/553,372 dated Mar. 12, 2010.
Notice of Allowance from U.S. Appl. No. 11/553,399 dated Mar. 22, 2010.
Notice of Allowance from U.S. Appl. No. 11/611,374 dated Apr. 5, 2010.
Final Office Action from U.S. Appl. No. 11/858,518 dated Apr. 21, 2010.
Non-Final Office Action from U.S. Appl. No. 11/929,571 dated Mar. 3, 2010.
Non-Final Office Action from U.S. Appl. No. 11/929,655 dated Mar. 3, 2010.
Non-Final Office Action from U.S. Appl. No. 11/929,631 dated Mar. 3, 2010.
Non-Final Office Action from U.S. Appl. No. 12/507,682 dated Mar. 8, 2010.
Non-Final Office Action from U.S. Appl. No. 11/929,636 dated Mar. 9, 2010.
Non-Final Office Action from U.S. Appl. No. 11/828,182 dated Mar. 29, 2010.
Non-Final Office Action from U.S. Appl. No. 11/939,432 dated Apr. 12, 2010.
Non-Final Office Action from U.S. Appl. No. 11/929,432 dated Jan. 14, 2010.
Great Britain Office Action from GB Patent Application No. GB0800734.6 dated Mar. 1, 2010.
Final Office Action from U.S. Appl. No. 11/461,420 dated Apr. 28, 2010.
Non-Final Office Action from U.S. Appl. No. 11/828,181 dated Mar. 2, 2010.
Non-Final Office Action from U.S. Appl. No. 11/588,739 dated Dec. 29, 2009.
Final Office Action from U.S. Appl. No. 11/929,500 dated Jun. 24, 2010.
Final Office Action from U.S. Appl. No. 11/461,435 dated May 13, 2010.
Final Office Action from U.S. Appl. No. 11/515,167 dated Jun. 3, 2010.
Final Office Action from U.S. Appl. No. 11/702,960 dated Jun. 21, 2010.
Final Office Action from U.S. Appl. No. 11/553,390 dated Jun. 24, 2010.
Non-Final Office Action from U.S. Appl. No. 12/574,628 dated Jun. 10, 2010.
Great Britain Office Action from GB Patent Application No. GB08039 13.3 dated Mar. 1, 2010.
Notice of Allowance from U.S. Appl. No. 11/763,365 dated Jun. 29, 2010.
Notice of Allowance from U.S. Appl. No. 11/762,010 dated Jul. 2, 2010.
Notice of Allowance from U.S. Appl. No. 11/611,374 dated Jul. 19, 2010.
Final Office Action from U.S. Appl. No. 11/672,921 dated Jul. 23, 2010.
Notice of Allowance from U.S. Appl. No. 11/515,223 dated Jul. 30, 2010.
Notice of Allowance from U.S. Appl. No. 11/553,372 dated Aug. 4, 2010.
Notice of Allowance from U.S. Appl. No. 11/762,013 dated Aug. 17, 2010.
Final Office Action from U.S. Appl. No. 11/929,286 dated Aug. 20, 2010.
Final Office Action from U.S. Appl. No. 11/929,432 dated Aug. 20, 2010.
Final Office Action from U.S. Appl. No. 11/929,450 dated Aug. 20, 2010.
Non-Final Office Action from U.S. Appl. No. 12/838,896 dated Sep. 3, 2010.
Final Office Action from U.S. Appl. No. 11/672,924 dated Sep. 7, 2010.
Final Office Action from U.S. Appl. No. 11/929,261 dated Sep. 7, 2010.
Final Office Action from U.S. Appl. No. 11/929,403 dated Aug. 31, 2010.
Final Office Action from U.S. Appl. No. 11/929,417 dated Aug. 31, 2010.
Final Office Action from U.S. Appl. No. 11/929,225 dated Aug. 27, 2010.
Non-Final Office Action from U.S. Appl. No. 11/858,518 dated Sep. 8, 2010.
Non-Final Office Action from U.S. Appl. No. 11/855,805 dated Sep. 21, 2010.

(56) References Cited

OTHER PUBLICATIONS

Non-Final Office Action from U.S. Appl. No. 11/939,440 dated Sep. 17, 2010.
Notice of Allowance from U.S. Appl. No. 11/929,320 dated Sep. 29, 2010.
Non-Final Office Action from U.S. Appl. No. 12/057,306 dated Oct. 8, 2010.
Notice of Allowance from U.S. Appl. No. 11/762,010 dated Oct. 22, 2010.
Notice of Allowance from U.S. Appl. No. 11/763,365 dated Oct. 20, 2010.
Notice of Allowance from U.S. Appl. No. 11/929,483 dated Oct. 7, 2010.
Notice of Allowance from U.S. Appl. No. 11/941,589 dated Oct. 25, 2010.
Notice of Allowance from U.S. Appl. No. 11/611,374 dated Oct. 29, 2010.
Non-Final Office Action from U.S. Appl. No. 12/769,428 dated Nov. 8, 2010.
Final Office Action from U.S. Appl. No. 11/929,631 dated Nov. 18, 2010.
Final Office Action from U.S. Appl. No. 11/929,655 dated Nov. 22, 2010.
Non-Final Office Action from U.S. Appl. No. 12/203,100 dated Dec. 1, 2010.
Notice of Allowance from U.S. Appl. No. 11/553,399 dated Dec. 3, 2010.
Notice of Allowance from U.S. Appl. No. 11/762,013 dated Dec. 7, 2010.
Final Office Action from U.S. Appl. No. 11/588,739 dated Dec. 15, 2010.
Final Office Action from U.S. Appl. No. 11/828,182 dated Dec. 22, 2010.
Non-Final Office Action from U.S. Appl. No. 11/553,372 dated Jan. 5, 2011.
Non-Final Office Action from U.S. Appl. No. 11/461,437 dated Jan. 4, 2011.
Non-Final Office Action from U.S. Appl. No. 11/855,826 dated Jan. 13, 2011.
Notice of Allowance from U.S. Appl. No. 11/515,223 dated Feb. 4, 2011.
Notice of Allowance from U.S. Appl. No. 12/144,396 dated Feb. 1, 2011.
Non-Final Office Action from U.S. Appl. No. 12/816,756 dated Feb. 7, 2011.
Notice of Allowance from U.S. Appl. No. 11/939,432 dated Feb. 18, 2011.
Notice of Allowance from U.S. Appl. No. 11/762,010 dated Feb. 18, 2011.
Notice of Allowance from U.S. Appl. No. 11/762,013 dated Feb. 22, 2011.
Notice of Allowance from U.S. Appl. No. 11/929,500 dated Feb. 24, 2011.
Notice of Allowance from U.S. Appl. No. 11/763,365 dated Mar. 1, 2011.
Final Office Action from U.S. Appl. No. 12/574,628 dated Mar. 3, 2011.
Final Office Action from U.S. Appl. No. 11/929,571 dated Mar. 3, 2011.
Notice of Allowance from U.S. Appl. No. 11/611,374 dated Mar. 4, 2011.
Notice of Allowance from U.S. Appl. No. 11/929,483 dated Mar. 4, 2011.
Notice of Allowance from U.S. Appl. No. 11/553,399 dated Mar. 18, 2011.
Final Office Action from U.S. Appl. No. 12/507,682 dated Mar. 29, 2011.
Non-Final Office Action from U.S. Appl. No. 11/929,403 dated Mar. 31, 2011.
Office Action from U.S. Appl. No. 11/929,417 dated Mar. 31, 2011.
Notice of Allowance from U.S. Appl. No. 12/838,896 dated Apr. 19, 2011.
Notice of Allowance from U.S. Appl. No. 11/702,981 dated Apr. 25, 2011.
Notice of Allowance from U.S. Appl. No. 11/929,320 dated May 5, 2011.
Final Office Action from U.S. Appl. No. 11/939,440 dated May 19, 2011.
Final Office Action from U.S. Appl. No. 11/855,805, dated May 26, 2011.
Non-Final Office Action from U.S. Appl. No. 11/672,921 dated May 27, 2011.
Notice of Allowance from U.S. Appl. No. 11/762,010 dated Jun. 8, 2011.
Non-Final Office Action from U.S. Appl. No. 11/672,924 dated Jun. 8, 2011.
Non-Final Office Action from U.S. Appl. No. 11/929,225 dated Jun. 8, 2011.
Notice of Allowance from U.S. Appl. No. 11/929,500 dated Jun. 13, 2011.
Notice of Allowance from U.S. Appl. No. 11/941,589 dated Jun. 15, 2011.
Final Office Action from U.S. Appl. No. 12/057,306 dated Jun. 15, 2011.
Final Office Action from U.S. Appl. No. 12/769,428 dated Jun. 16, 2011.
Notice of Allowance from U.S. Appl. No. 12/203,100 dated Jun. 17, 2011.
Notice of Allowance from U.S. Appl. No. 11/762,013 dated Jun. 20, 2011.
Non-Final Office Action from U.S. Appl. No. 12/797,557 dated Jun. 21, 2011.
Notice of Allowance from U.S. Appl. No. 11/929,483 dated Jun. 23, 2011.
Non-Final Office Action from U.S. Appl. No. 11/702,960 dated Jun. 23, 2011.
Non-Final Office Action from U.S. Appl. No. 11/929,655 dated Jun. 24, 2011.
Notice of Allowance from U.S. Appl. No. 11/763,365 dated Jun. 24, 2011.
Notice of Allowance from U.S. Appl. No. 11/611,374 dated Jun. 24, 2011.
Non-Final Office Action from U.S. Appl. No. 11/828,182 dated Jun. 27, 2011.
Non-Final Office Action from U.S. Appl. No. 11/828,181 dated Jun. 27, 2011.
Non-Final Office Action from U.S. Appl. No. 12/378,328 dated Jul. 15, 2011.
Final Office Action from U.S. Appl. No. 11/461,420 dated Jul. 20, 2011.
Notice of Allowance from U.S. Appl. No. 11/461,437 dated Jul. 25, 2011.
Notice of Allowance from U.S. Appl. No. 11/702,981 dated Aug. 5, 2011.
Notice of Allowability from U.S. Appl. No. 11/855,826 dated Aug. 15, 2011.
Non-Final Office Action from U.S. Appl. No. 12/574,628 dated Sep. 20, 2011.
Non-Final Office Action from U.S. Appl. No. 11/858,518 dated Sep. 27, 2011.
Notice of Allowance from U.S. Appl. No. 11/929,571 dated Sep. 27, 2011.
Notice of Allowance from U.S. Appl. No. 11/929,500 dated Sep. 27, 2011.
Notice of Allowance from U.S. Appl. No. 11/941,589 dated Sep. 30, 2011.
Notice of Allowance from U.S. Appl. No. 12/816,756 dated Oct. 3, 2011.
Non-Final Office Action from U.S. Appl. No. 12/508,496 dated Oct. 11, 2011.
Non-Final Office Action from U.S. Appl. No. 11/588,739 dated Oct. 13, 2011.

(56) References Cited

OTHER PUBLICATIONS

Notice of Allowance from U.S. Appl. No. 11/939,432 dated Oct. 24, 2011.
Non-Final Office Action from U.S. Appl. No. 11/929,631 dated Nov. 1, 2011.
Non-Final Office Action from U.S. Appl. No. 11/553,372 dated Nov. 14, 2011.
Notice of Allowance from U.S. Appl. No. 11/515,223 dated Nov. 29, 2011.
Notice of Allowance from U.S. Appl. No. 12/769,428 dated Nov. 28, 2011.
Final Office Action from U.S. Appl. No. 11/939,440 dated Dec. 12, 2011.
Notice of Allowance from U.S. Appl. No. 12/797,557 dated Dec. 28, 2011.
Office Action, including English translation, from co-pending Japanese application No. 2008-529353, dated Jan. 10, 2012.
Notice of Allowance from U.S. Appl. No. 12/838,896 dated Jan. 18, 2012.
Final Office Action from U.S. Appl. No. 11/929,655 dated Jan. 19, 2012.
Final Office Action from U.S. Appl. No. 12/378,328 dated Feb. 3, 2012.
Final Office Action from U.S. Appl. No. 11/672,921 dated Feb. 16, 2012.
Final Office Action from U.S. Appl. No. 11/672,924 dated Feb. 16, 2012.
Final Office Action from U.S. Appl. No. 11/929,225 dated Feb. 16, 2012.
International Search Report for Application No. EP12150807 dated Feb. 16, 2012.
Final Office Action from U.S. Appl. No. 11/828,181 dated Feb. 23, 2012.
Non-Final Office Action from U.S. Appl. No. 11/461,520 dated Feb. 29, 2012.
Notice of Allowance from U.S. Appl. No. 12/574,628 dated Mar. 6, 2012.
Non-Final Office Action from U.S. Appl. No. 13/276,212 dated Mar. 15, 2012.
Non-Final Office Action from U.S. Appl. No. 13/343,612 dated Mar. 29, 2012.
Notice of Allowance from U.S. Appl. No. 11/939,440 dated Mar. 30, 2012.
European Search Report from co-pending European application No. 11194876.6-2212/2450798, dated Apr. 12, 2012.
European Search Report from co-pending European application No. 11194862.6-2212/2450800, dated Apr. 12, 2012.
Notice of Allowance from U.S. Appl. No. 11/929,636, dated Apr. 17, 2012.
Final Office Action from U.S. Appl. No. 11/858,518, dated Apr. 17, 2012.
European Search Report from co-pending European application No. 11194883.2-2212, dated Apr. 27, 2012.
Non-Final Office Action from U.S. Appl. No. 11/553,372, dated May 3, 2012.
Notice of Allowance from U.S. Appl. No. 11/929,631, dated May 3, 2012.
Non-Final Office Action from U.S. Appl. No. 13/165,713, dated May 22, 2012.
Non-Final Office Action from U.S. Appl. No. 12/144,396, dated May 29, 2012.
Non-Final Office Action from U.S. Appl. No. 13/165,713, dated May 31, 2012.
Non-Final Office Action from U.S. Appl. No. 13/280,251, dated Jun. 12, 2012.
Final Office Action from U.S. Appl. No. 11/855,805, dated Jun. 14, 2012.
Office Action, including English translation, from co-pending Japanese application No. 2008-529353, dated Jul. 31, 2012.
Final Office Action from U.S. Appl. No. 13/315,933, dated Aug. 24, 2012.
Final Office Action from U.S. Appl. No. 13/276,212, dated Aug. 30, 2012.
Non-Final Office Action from U.S. Appl. No. 13/367,182, dated Aug. 31, 2012.
Notice of Allowance from U.S. Appl. No. 11/461,420, dated Sep. 5, 2012.
Final Office Action from U.S. Appl. No. 13/280,251, dated Sep. 12, 2012.
Non-Final Office Action from U.S. Appl. No. 11/929,225, dated Sep. 17, 2012.
Notice of Allowance from U.S. Appl. No. 12/508,496, dated Sep. 17, 2012.
Non-Final Office Action from U.S. Appl. No. 11/672,921, dated Oct. 1, 2012.
Notice of Allowance from U.S. Appl. No. 12/057,306, dated Oct. 10, 2012.
Notice of Allowance from U.S. Appl. No. 12/144,396, dated Oct. 11, 2012.
Non-Final Office Action from U.S. Appl. No. 13/411,489, dated Oct. 17, 2012.
Non-Final Office Action from U.S. Appl. No. 13/471,283, dated Dec. 7, 2012.
English translation of Office Action from co-pending Korean patent application No. KR1020087005172, dated Dec. 20, 2012.
Office Action, including English translation, from co-pending Japanese application No. 2008-529353, dated Dec. 27, 2012.
Office Action from co-pending European patent application No. EP12150798, dated Jan. 3, 2013.
Final Office Action from U.S. Appl. No. 11/672,924, dated Feb. 1, 2013.
Non-Final Office Action from U.S. Appl. No. 13/260,650, dated Feb. 1, 2013.
Notice of Allowance from U.S. Appl. No. 13/141,844, dated Feb. 5, 2013.
Notice of Allowance from U.S. Appl. No. 13/473,827, dated Feb. 15, 2013.
Notice of Allowance from U.S. Appl. No. 12/378,328, dated Feb. 27, 2013.
Non-Final Office Action from U.S. Appl. No. 13/536,093, dated Mar. 1, 2013.
Office Action from co-pending Japanese patent application No. 2012-132119, dated Mar. 6, 2013.
Notice of Allowance from U.S. Appl. No. 11/461,435, dated Mar. 6, 2013.
Notice of Allowance from U.S. Appl. No. 11/515,223, dated Mar. 18, 2013.
Notice of Allowance from U.S. Appl. No. 13/471,283, dated Mar. 21, 2013.
Extended European Search Report for co-pending European patent application No. EP12150807.1, dated Feb. 1, 2013, mailed Mar. 22, 2013.
Notice of Allowance from U.S. Appl. No. 13/181,716, dated Apr. 3, 2013.
English translation of Office Action from co-pending Korean patent application No. KR1020087019582, dated Mar. 13, 2013.
Notice of Allowance from U.S. Appl. No. 13/618,246, dated Apr. 23, 2013.
Notice of Allowance from U.S. Appl. No. 13/182,234, dated May 1, 2013.
Final Office Action from U.S. Appl. No. 13/315,933, dated May 3, 2013.
English Translation of Office Action from co-pending Korean patent application No. 10-2013-7004006, dated Apr. 12, 2013.
EPO Communication for Co-pending European patent application No. EP11194862.6, dated May 5, 2013.
Non-Final Office Action from U.S. Appl. No. 13/620,793, dated May 6, 2013.
Non-Final Office Action from U.S. Appl. No. 13/620,565, dated May 24, 2013.
Final Office Action from U.S. Appl. No. 11/929,225, dated May 24, 2013.

(56) References Cited

OTHER PUBLICATIONS

Final Office Action from U.S. Appl. No. 11/672,921, dated May 24, 2013.
Notice of Allowance from U.S. Appl. No. 11/929,631, dated May 28, 2013.
Notice of Allowance from U.S. Appl. No. 13/620,424, dated May 29, 2013.
Notice of Allowance from U.S. Appl. No. 13/341,844, dated May 30, 2013.
CNon-Final Office Action from U.S. Appl. No. 13/455,691, dated Jun. 4, 2013.
Non-Final Office Action from U.S. Appl. No. 13/620,199, dated Jun. 17, 2013.
Non-Final Office Action from U.S. Appl. No. 13/620,207, dated Jun. 20, 2013.
Non-Final Office Action from U.S. Appl. No. 11/828, 182, dated Jun. 20, 2013.
Final Office Action from U.S. Appl. No. 11/828,181, dated Jun. 20, 2013.
Non-Final Office Action from U.S. Appl. No. 11/929,655, dated Jun. 21, 2013.
Notice of Allowance from U.S. Appl. No. 13/597,895, dated Jun. 25, 2013.
Non-Final Office Action from U.S. Appl. No. 13/620,645, dated Jun. 26, 2013.
Notice of Allowance from U.S. Appl. No. 13/471,283, dated Jun. 28, 2013.
Notice of Allowance from U.S. Appl. No. 13/181,747, dated Jul. 9, 2013.
Notice of Allowance from U.S. Appl. No. 11/515,223, dated Jul. 18, 2013.
Notice of Allowance from U.S. Appl. No. 13/182,234, dated Jul. 22, 2013.
Notice of Allowance from U.S. Appl. No. 13/181,716, dated Jul. 22, 2013.
Non-Final Office Action from U.S. Appl. No. 13/620,233, dated Aug. 2, 2013.
Final Office Action from U.S. Appl. No. 13/367,182, dated Aug. 8, 2013.
Notice of Allowance from U.S. Appl. No. 13/615,008, dated Aug. 15, 2013.
Notice of Allowance from U.S. Appl. No. 13/620,425, dated Aug. 20, 2013.
Non-Final Office Action from U.S. Appl. No. 13/620,601, dated Aug. 23, 2013.
Non-Final Office Action from U.S. Appl. No. 12/507,683, dated Aug. 27, 2013.
Non-Final Office Action from U.S. Appl. No. 13/315,933, dated Aug. 27, 2013.
Final Office Action from U.S. Appl. No. 13/620,650, dated Aug. 30, 2013.
Notice of Allowance from U.S. Appl. No. 13/620,424, dated Sep. 11, 2013.
Non-Final Office Action from U.S. Appl. No. 13/620,291, dated Sep. 12, 2013.
Notice of Allowance from U.S. Appl. No. 13/34L844, dated Sep. 17, 2013.
Notice of Allowance from U.S. Appl. No. 13/620,412, dated Sep. 25, 2013.
Non-Final Office Action from U.S. Appl. No. 13/343,852, dated Sep. 27, 2013.
English Translation of Office Action from co-pending Korean patent application No. 10-2008-7019582, dated Sep. 16, 2013.
Notice of Allowance from U.S. Appl. No. 13/620,565, dated Sep. 27, 2013.
Non-Final Office Action from U.S. Appl. No. 13/279,068, dated Sep. 30, 2013.
Notice of Allowance from U.S. Appl. No. 13/620,207, dated Oct. 9, 2013.
Non-Final Office Action from U.S. Appl. No. 13/898,002, dated Oct. 10, 2013.
Notice of Allowance from U.S. Appl. No. 13/471,283, dated Oct. 15, 2013.
Notice of Allowance from U.S. Appl. No. 11/515,223, dated Oct. 24, 2013.
Notice of Allowance from U.S. Appl. No. 13/181,747, dated Oct. 28, 2013.
Notice of Allowance from U.S. Appl. No. 13/597,895, dated Oct. 29, 2013.
Notice of Allowance from U.S. Appl. No. 13/620,199, dated Nov. 13, 2013.
Final Office Action from U.S. Appl. No. 13/620,793, dated Nov. 13, 2013.
Notice of Allowance from U.S. Appl. No. 13/618,246, dated Nov. 14, 2013.
Notice of Allowance from U.S. Appl. No. 13/473,827, dated Nov. 20, 2013.
Notice of Allowance from U.S. Appl. No. 13/615,008, dated Dec. 3, 2013.
Notice of Allowance from U.S. Appl. No. 13/620,425, dated Dec. 11, 2013.
English Translation of Office Action from co-pending Japanese patent application No. P2012-197675, dated Dec. 3, 2013.
English Translation of Office Action from co-pending Japanese patent application No. P2012-197678, dated Dec. 3, 2013.
Notice of Allowance from U.S. Appl. No. 13/455,691, dated Dec. 31, 2013.
Non-Final Office Action from U.S. Appl. No. 11/553,390, dated Dec. 31, 2013.
English Translation of Office Action from co-pending Korean patent application No. 10-2013-7004006, dated Dec. 26, 2013.
Search Report from co-pending European Patent Application No. 13191794, dated Dec. 12, 2013.
English Translation of Office Action from co-pending Japanese patent application No. No. 2012-132119, dated Jan. 7, 2014.
Notice of Allowance from U.S. Appl. No. 13/620,425, dated Jan. 13, 2014.
Office Action from co-pending Korean patent application No. 10-2013-7029741, dated Dec. 20, 2013.
Notice of Allowance from U.S. Appl. No. 13/279,068, dated Jan. 21, 2014.
Notice of Allowance from U.S. Appl. No. 13/620,412, dated Jan. 21, 2014.
Non-Final Office Action from U.S. Appl. No. 13/367,182, dated Jan. 29, 2014.
Notice of Allowance from U.S. Appl. No. 13/898,002, dated Feb. 3, 2014.
Search Report from co-pending European Patent Application No. 13191796, dated Feb. 10, 2014.
"JEDEC Standard, DDR2 SDRAM Specification", Jan. 31, 2005 (Jan. 31, 2005), pp. 1-113, XP055099338, Retrieved from the Internet: URL:http://cs.ecs.baylor.edu/"maurer/CS15338/JESD79-2B.pdf [retrieved on Jan. 30, 2014].
Notice of Allowance from U.S. Appl. No. 13/620,424, dated Feb. 11, 2014.
Notice of Allowance from U.S. Appl. No. 13/620,565, dated Feb. 24,2014.
Notice of Allowance from U.S. Appl. No. 13/315,933, dated Feb. 26, 2014.
Final Office Action from U.S. Appl. No. 13/620,601, dated Mar. 3, 2014.
Notice of Allowance from U.S. Appl. No. 13/620,207, dated Mar. 6, 2014.
Notice of Allowance from U.S. Appl. No. 13/455,691, dated Mar. 10, 2014.
Notice of Allowance from U.S. Appl. No. 13/620,199, dated Mar. 11, 2014.
Notice of Allowance from U.S. Appl. No. 13/620,425, dated Mar. 31, 2014.
Final Office Action from U.S. Appl. No. 13/367,182, dated Apr. 1, 2014.

(56) References Cited

OTHER PUBLICATIONS

Final Office Action from U.S. Appl. No. 12/507,682, dated Apr. 2, 2014.
Notice of Allowance from U.S. Appl. No. 11/515,167, dated Apr. 2, 2014.
Non-Final Office Action from U.S. Appl. No. 13/620,793, dated Apr. 9, 2014.
Woo et al. ("An Optimized 3D, Stacked Memory Architecture by Exploiting Excessive, High,Density TSV Bandwidth, by Dong Hyuk Woo," 987-1-4244-5659—Aug. 9, 2009, IEEE, 2009 doi:1O.1 109/HPCA.2010.5416628), 12 pages.
Final Office Action from U.S. Appl. No. 13/343,852, dated Apr. 18, 2014.
Final Office Action from U.S. Appl. No. 11/672,924, dated May 8, 2014.
Office Action from co-pending Korean patent application No. 10-2014-7005128, dated Apr. 10, 2014.
Notice of Allowance from U.S. Appl. No. 13/620,565, dated Jun. 4, 2014.
Non-Final Office Action from U.S. Appl. No. 11/553,390, dated Jul. 8, 2014.
Notice of Allowance from U.S. Appl. No. 13/367,182, dated Jul. 18, 2014.
Non-Final Office Action from U.S. Appl. No. 14/090,342, dated Aug. 13, 2014.
Notice of Allowance from U.S. Appl. No. 13/620,601, dated Aug. 13, 2014.
Office Action from Japanese Application No. JP2012-197678, dated Jul. 29, 2014.
Office Action from Japanese Application No. JP2012-197675, dated Jul. 29, 2014.
Notice of Allowance from U.S. Appl. No. 12/507,682, dated Sep. 26, 2014.
Notice of Allowance from U.S. Appl. No. 13/620,793, dated Oct. 9, 2014.
Notice of Allowance from U.S. Appl. No. 11/553,390, dated Nov. 21, 2014.
Notice of Allowance from U.S. Appl. No. 14/090,342, dated Dec. 11, 2014.
Notice of Allowance from U.S. Appl. No. 13/620,601, dated Jan. 7, 2015.
Notice of Allowance from U.S. Appl. No. 13/620,793, dated Jan. 22, 2015.
Notice of Allowance from U.S. Appl. No. 11/553,390, dated Mar. 11, 2015.
Notice of Allowance from U.S. Appl. No. 14/090,342, dated Jun. 1, 2015.
Office Action from co-pending European Patent Application No. 13191796.5, dated Jun. 9, 2015.
Office Action from co-pending Japanese Application No. P2014-096048, dated Jul. 28, 2015.
Notice of Allowance from U.S. Appl. No. 11/672,921, dated Dec. 9, 2016, 5 pages.
Office Action from co-pending European Patent Application No. 12150807.1, dated Jun. 8, 2016, 8 pages.
Notice of Allowance from U.S. Appl. No. 11/672,924, dated Dec. 30, 2016, 5 pages.
Summons to Attend Oral Proceedings from Application No. 12150807.1, dated Nov. 20, 2017, 11 pages.
Decision to refuse from European Application No. 13191796.5, dated Mar. 9, 2017, 9 pages.
Extended European Search Report issued in European Application No. 17171824.0, dated Oct. 16, 2017, 8 pages.

* cited by examiner

CONFIGURABLE MEMORY CIRCUIT SYSTEM AND METHOD

CROSS-REFERENCE TO RELATED APPLICATIONS

The present application is a continuation of, and claims priority to, U.S. application Ser. No. 14/922,388, for "CONFIGURABLE MEMORY CIRCUIT SYSTEM AND METHOD," to Suresh Rajan, Keith R. Schakel, Michael John Sebastian Smith, David T. Wang, and Frederick Daniel Weber, filed on Oct. 26, 2015, which is a continuation of, and claims priority to, U.S. application Ser. No. 14/090,342, for "CONFIGURABLE MEMORY CIRCUIT SYSTEM AND METHOD," to Suresh Rajan, Keith R. Schakel, Michael John Sebastian Smith, David T. Wang, and Frederick Daniel Weber, filed on Nov. 26, 2013, now U.S. Pat. No. 9,171,585, which is incorporated herein by reference in its entirety.

U.S. application Ser. No. 14/090,342 is a continuation-in-part of U.S. application Ser. No. 13/367,182, filed Feb. 6, 2012, now U.S. Pat. No. 8,868,829, which is a continuation of U.S. application Ser. No. 11/929,636 filed Oct. 30, 2007, now U.S. Pat. No. 8,244,971, which is a continuation of PCT application serial no. PCT/US2007/016385 filed Jul. 18, 2007, which is a continuation-in-part of each of U.S. application Ser. No. 11/461,439, filed Jul. 31, 2006, now U.S. Pat. No. 7,580,312, U.S. application Ser. No. 11/524,811, filed Sep. 20, 2006, now U.S. Pat. No. 7,590,796, U.S. application Ser. No. 11/524,730, filed Sep. 20, 2006, now U.S. Pat. No. 7,472,220, U.S. application Ser. No. 11/524,812 filed Sep. 20, 2006, now U.S. Pat. No. 7,386,656, U.S. application Ser. No. 11/524,716, filed Sep. 20, 2006, now U.S. Pat. No. 7,392,338, U.S. application Ser. No. 11/538,041, filed Oct. 2, 2006, now abandoned, U.S. application Ser. No. 11/584,179, filed Oct. 20, 2006, now U.S. Pat. No. 7,581,127, U.S. application Ser. No. 11/762,010, filed Jun. 12, 2007, now U.S. Pat. No. 8,041,881, and U.S. application Ser. No. 11/762,013, filed Jun. 12, 2007, now U.S. Pat. No. 8,090,897, each of which is incorporated herein by reference.

U.S. application Ser. No. 14/090,342 is also a continuation-in-part of U.S. application Ser. No. 12/507,682 filed on Jul. 22, 2009, now U.S. Pat. No. 8,949,519, which is a continuation of U.S. application Ser. No. 11/461,427, filed Jul. 31, 2006, now U.S. Pat. No. 7,609,567, which is a continuation-in-part of U.S. application Ser. No. 11/474,075 filed Jun. 23, 2006 now U.S. Pat. No. 7,515,453 which claims benefit of U.S. provisional application 60/693,631 filed Jun. 24, 2005, each of which is incorporated herein by reference.

U.S. application Ser. No. 14/090,342 is also a continuation-in-part of U.S. application Ser. No. 11/672,921 filed on Feb. 8, 2007, which claims the benefit of U.S. provisional application 60/772,414, filed Feb. 9, 2006 and U.S. provisional application 60/865,624 filed Nov. 13, 2006 and which is a continuation-in-part of each of: U.S. application Ser. No. 11/461,437 filed Jul. 31, 2006 now U.S. Pat. No. 8,077,535; U.S. application Ser. No. 11/702,981 filed Feb. 5, 2007 now U.S. Pat. No. 8,089,795; and U.S. application Ser. No. 11/702,960 filed Feb. 5, 2007, each of which is incorporated herein by reference.

U.S. application Ser. No. 14/090,342 is also a continuation-in-part of U.S. application Ser. No. 13/620,425, filed on Sep. 14, 2012, now U.S. Pat. No. 8,797,779, which is a continuation of U.S. application Ser. No. 13/341,844, filed on Dec. 30, 2011, now U.S. Pat. No. 8,566,556, which is a divisional of U.S. application Ser. No. 11/702,981, filed on Feb. 5, 2007 now U.S. Pat. No. 8,089,795, which claims the benefit of U.S. provisional application 60/865,624, filed Nov. 13, 2006, and claims the benefit of U.S. provisional application 60/772,414, filed on Feb. 9, 2006. U.S. application Ser. No. 11/702,981 is also a continuation-in-part of U.S. application Ser. No. 11/461,437, filed Jul. 31, 2006 now U.S. Pat. No. 8,077,535, each of which is incorporated herein by reference.

U.S. application Ser. No. 14/090,342 is also a continuation-in-part of U.S. application Ser. No. 13/615,008, now U.S. Pat. No. 8,631,220, filed on Sep. 13, 2012, which is a continuation application of U.S. application Ser. No. 11/939,440, filed Nov. 13, 2007, now U.S. Pat. No. 8,327,104, which is continuation-in-part of U.S. application Ser. No. 11/524,811, filed Sep. 20, 2006, now U.S. Pat. No. 7,590,796, which is a continuation-in-part of U.S. application Ser. No. 11/461,439, filed Jul. 31, 2006, now U.S. Pat. No. 7,580,312. U.S. application Ser. No. 11/939,440, also claims the benefit of priority to U.S. provisional application 60/865,627, filed Nov. 13, 2006, each of which is incorporated herein by reference.

U.S. application Ser. No. 14/090,342 is also a continuation-in-part of U.S. application Ser. No. 13/618,246, now U.S. Pat. No. 8,615,679, filed on Sep. 13, 2012, which is a continuation of U.S. patent application Ser. No. 13/280,251, filed Oct. 24, 2011, now U.S. Pat. No. 8,386,833, which is continuation of U.S. patent application Ser. No. 11/763,365, filed Jun. 14, 2007, now U.S. Pat. No. 8,060,774, which is a continuation-in part of U.S. patent application Ser. No. 11/474,076, filed on Jun. 23, 2006, which claims the benefit of U.S. provisional patent application 60/693,631, filed on Jun. 24, 2005. U.S. patent application Ser. No. 11/763,365 is also a continuation-in-part of U.S. patent application Ser. No. 11/515,223, filed on Sep. 1, 2006, now U.S. Pat. No. 8,619,452, which claims the benefit of U.S. provisional patent application 60/713,815, filed on Sep. 2, 2005. U.S. patent application Ser. No. 11/763,365 also claimed the benefit of U.S. provisional patent application 60/814,234, filed on Jun. 16, 2006, each of which is incorporated herein by reference.

U.S. application Ser. No. 14/090,342 is also a continuation-in-part of U.S. application Ser. No. 13/620,565, filed on Sep. 14, 2012, now U.S. Pat. No. 8,811,065, which is a continuation of U.S. application Ser. No. 11/515,223, filed on Sep. 1, 2006, now U.S. Pat. No. 8,619,452, which claims the benefit of U.S. provisional patent application 60/713,815, filed Sep. 2, 2005, each of which is incorporated herein by reference.

U.S. application Ser. No. 14/090,342 is also a continuation-in-part of U.S. application Ser. No. 13/620,645, filed on Sep. 14, 2012, now abandoned, which is a continuation of U.S. application Ser. No. 11/929,655, filed on Oct. 30, 2007, now abandoned, which is a continuation of U.S. application Ser. No. 11/828,181, filed on Jul. 25, 2007, now abandoned, which claims the benefit of U.S. provisional application 60/823,229, filed Aug. 22, 2006, and which is a continuation-in-part of U.S. application Ser. No. 11/584,179, filed on Oct. 20, 2006, now U.S. Pat. No. 7,581,127, which is a continuation of U.S. application Ser. No. 11/524,811, filed on Sep. 20, 2006, now U.S. Pat. No. 7,590,796, and is a continuation-in-part of U.S. application Ser. No. 11/461,439, filed on Jul. 31, 2006, now U.S. Pat. No. 7,580,312, each of which is incorporated herein by reference.

U.S. application Ser. No. 14/090,342 is also a continuation-in-part of U.S. application Ser. No. 13/473,827, filed May 17, 2012, now U.S. Pat. No. 8,631,193, which is a divisional of U.S. application Ser. No. 12/378,328, filed Feb. 14, 2009, now U.S. Pat. No. 8,438,328, which claims the benefit of U.S. provisional application 61/030,534, filed on Feb. 21, 2008, each of which is incorporated herein by reference.

U.S. application Ser. No. 14/090,342 is also a continuation-in-part of U.S. application Ser. No. 13/620,793, filed on Sep. 15, 2012, now U.S. Pat. No. 8,977,806, which is a continuation of U.S. application Ser. No. 12/057,306, filed Mar. 27, 2008, now U.S. Pat. No. 8,397,013, which is a continuation-in-part of U.S. application Ser. No. 11/611,374, filed on Dec. 15, 2006, now U.S. Pat. No. 8,055,833, which claims the benefit of U.S. provisional application 60/849,631, filed Oct. 5, 2006, each of which is incorporated herein by reference.

U.S. application Ser. No. 14/090,342 is also a continuation-in-part of U.S. application Ser. No. 13/620,424, filed on Sep. 14, 2012, now U.S. Pat. No. 8,751,732, which is a continuation of U.S. application Ser. No. 13/276,212, filed Oct. 18, 2011, now U.S. Pat. No. 8,370,566, which is a continuation of U.S. application Ser. No. 11/611,374, filed Dec. 15, 2006, now U.S. Pat. No. 8,055,833, which claims the benefit of U.S. provisional application 60/849,631, filed Oct. 5, 2006, each of which is incorporated herein by reference.

U.S. application Ser. No. 14/090,342 is also a continuation-in-part of U.S. application Ser. No. 13/597,895, filed Aug. 29, 2012, now U.S. Pat. No. 8,675,429, which is a continuation of U.S. application Ser. No. 13/367,259, filed Feb. 6, 2012, now U.S. Pat. No. 8,279,690, which is a divisional of U.S. application Ser. No. 11/941,589, filed Nov. 16, 2007, now U.S. Pat. No. 8,111,566, each of which is incorporated herein by reference.

U.S. application Ser. No. 14/090,342 is also a continuation-in-part of U.S. application Ser. No. 13/455,691, filed Apr. 25, 2012, now U.S. Pat. No. 8,710,862, which is a continuation of U.S. patent application Ser. No. 12/797,557 filed Jun. 9, 2010, now U.S. Pat. No. 8,169,233, which claims the benefit of U.S. provisional application 61/185,585, filed on Jun. 9, 2009, each of which is incorporated herein by reference.

U.S. application Ser. No. 14/090,342 is also a continuation-in-part of U.S. application Ser. No. 13/620,412, filed Sep. 14, 2012, now U.S. Pat. No. 8,705,240, which is a continuation of U.S. patent application Ser. No. 13/279,068, filed Oct. 21, 2011, now U.S. Pat. No. 8,730,670, which is a divisional of U.S. patent application Ser. No. 12/203,100, filed Sep. 2, 2008, now U.S. Pat. No. 8,081,474, which claims the benefit of U.S. provisional application 61/014,740, filed Dec. 18, 2007, each of which is incorporated herein by reference.

U.S. application Ser. No. 14/090,342 is also a continuation-in-part of U.S. application Ser. No. 13/898,002, filed May 20, 2013, now U.S. Pat. No. 8,760,936, which is a continuation of U.S. application Ser. No. 13/411,489, filed Mar. 2, 2012, now U.S. Pat. No. 8,446,781, which is a continuation of U.S. application Ser. No. 11/939,432, filed Nov. 13, 2007, now U.S. Pat. No. 8,130,560, which claims the benefit of U.S. provisional application 60/865,623, filed Nov. 13, 2006, each of which is incorporated herein by reference.

U.S. application Ser. No. 14/090,342 is also a continuation-in-part of U.S. application Ser. No. 11/515,167, filed Sep. 1, 2006, now U.S. Pat. No. 8,796,830, each of which is incorporated herein by reference.

U.S. application Ser. No. 14/090,342 is also a continuation-in-part of U.S. application Ser. No. 13/620,199, filed Sep. 14, 2012, now U.S. Pat. No. 8,762,675, which is a continuation of U.S. application Ser. No. 12/144,396, filed Jun. 23, 2008, now U.S. Pat. No. 8,386,722, each of which is incorporated herein by reference.

U.S. application Ser. No. 14/090,342 is also a continuation-in-part of U.S. application Ser. No. 13/620,207, filed Sep. 14, 2012, now U.S. Pat. No. 8,819,356, which is a continuation of U.S. application Ser. No. 12/508,496, filed Jul. 23, 2009, now U.S. Pat. No. 8,335,894, which claims the benefit of U.S. provisional application 61/083,878, filed Jul. 25, 2008, each of which is incorporated herein by reference.

BACKGROUND AND FIELD OF THE INVENTION

This invention relates generally to memory.

SUMMARY

In one embodiment, a memory subsystem is provided including an interface circuit adapted for coupling with a plurality of memory circuits and a system. The interface circuit is operable to interface the memory circuits and the system for emulating at least one memory circuit with at least one aspect that is different from at least one aspect of at least one of the plurality of memory circuits. Such aspect includes a signal, a capacity, a timing, and/or a logical interface.

In another embodiment, a memory subsystem is provided including an interface circuit adapted for communication with a system and a majority of address or control signals of a first number of memory circuits. The interface circuit includes emulation logic for emulating at least one memory circuit of a second number.

In yet another embodiment, a memory circuit power management system and method are provided. In use, an interface circuit is in communication with a plurality of physical memory circuits and a system. The interface circuit is operable to interface the physical memory circuits and the system for simulating at least one virtual memory circuit with a first power behavior that is different from a second power behavior of the physical memory circuits.

In still yet another embodiment, a memory circuit power management system and method are provided. In use, an interface circuit is in communication with a plurality of memory circuits and a system. The interface circuit is operable to interface the memory circuits and the system for performing a power management operation in association with at least a portion of the memory circuits. Such power management operation is performed during a latency associated with one or more commands directed to at least a portion of the memory circuits.

In even another embodiment, an apparatus and method are provided for communicating with a plurality of physical memory circuits. In use, at least one virtual memory circuit is simulated where at least one aspect (e.g. power-related aspect, etc.) of such virtual memory circuit(s) is different from at least one aspect of at least one of the physical memory circuits. Further, in various embodiments, such simulation may be carried out by a system (or component thereof), an interface circuit, etc.

In another embodiment, an power saving system and method are provided. In use, at least one of a plurality of memory circuits is identified that is not currently being accessed. In response to the identification of the at least one memory circuit, a power saving operation is initiated in association with the at least one memory circuit.

The present application is a continuation of U.S. application Ser. No. 14/090,342, filed Nov. 26, 2013, which is incorporated herein by reference in its entirety.

DETAILED DESCRIPTION

Various embodiments are set forth below. It should be noted that the claims corresponding to each of such embodiments should be construed in terms of the relevant description set forth herein. If any definitions, etc. set forth herein are contradictory with respect to terminology of certain claims, such terminology should be construed in terms of the relevant description.

The present application is a continuation of U.S. application Ser. No. 14/090,342, filed Nov. 26, 2013, which is incorporated herein by reference in its entirety.

Figure 1:
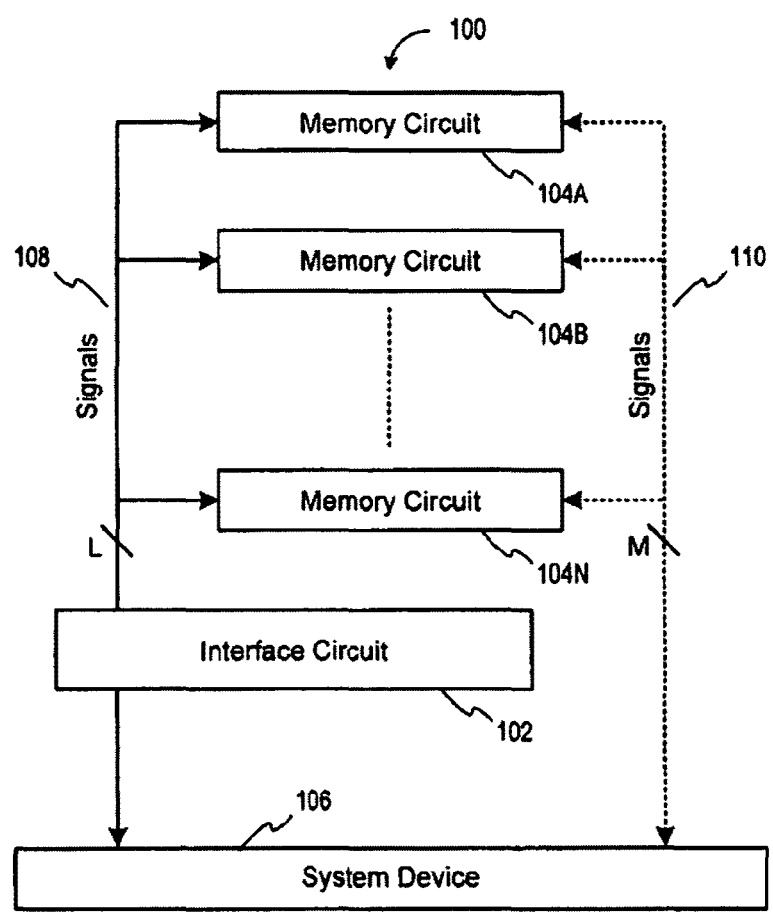
FIG. 1 shows a system coupled to multiple memory circuits and an interface circuit according to one embodiment of this invention.

FIG. 1 illustrates a system 100 including a system device 106 coupled to an interface circuit 102, which is in turn coupled to a plurality of physical memory circuits 104A-N. The physical memory circuits may be any type of memory circuits. In some embodiments, each physical memory circuit is a separate memory chip. For example, each may be a DDR2 DRAM. In some embodiments, the memory circuits may be symmetrical, meaning each has the same capacity, type, speed, etc., while in other embodiments they may be asymmetrical. For ease of illustration only, three such memory circuits are shown, but actual embodiments may use any plural number of memory circuits. As will be discussed below, the memory chips may optionally be coupled to a memory module (not shown), such as a DIMM.

The system device may be any type of system capable of requesting and/or initiating a process that results in an access of the memory circuits. The system may include a memory controller (not shown) through which it accesses the memory circuits.

The interface circuit may include any circuit or logic capable of directly or indirectly communicating with the memory circuits, such as a buffer chip, advanced memory buffer (AMB) chip, etc. The interface circuit interfaces a plurality of signals 108 between the system device and the memory circuits. Such signals may include, for example, data signals, address signals, control signals, clock signals, and so forth. In some embodiments, all of the signals communicated between the system device and the memory circuits are communicated via the interface circuit. In other embodiments, some other signals 110 are communicated directly between the system device (or some component thereof, such as a memory controller, an AMB, or a register) and the memory circuits, without passing through the interface circuit. In some such embodiments, the majority of signals are communicated via the interface circuit, such that L>M.

As will be explained in greater detail below, the interface circuit presents to the system device an interface to emulated memory devices which differ in some aspect from the physical memory circuits which are actually present. For example, the interface circuit may tell the system device that the number of emulated memory circuits is different than the actual number of physical memory circuits. The terms "emulating", "emulated", "emulation", and the like will be used in this disclosure to signify emulation, simulation, disguising, transforming, converting, and the like, which results in at least one characteristic of the memory circuits appearing to the system device to be different than the actual, physical characteristic. In some embodiments, the emulated characteristic may be electrical in nature, physical in nature, logical in nature (e.g. a logical interface, etc.), pertaining to a protocol, etc. An example of an emulated electrical characteristic might be a signal, or a voltage level. An example of an emulated physical characteristic might be a number of pins or wires, a number of signals, or a memory capacity. An example of an emulated protocol characteristic might be a timing, or a specific protocol such as DDR3.

In the case of an emulated signal, such signal may be a control signal such as an address signal, a data signal, or a control signal associated with an activate operation, precharge operation, write operation, mode register read operation, refresh operation, etc. The interface circuit may emulate the number of signals, type of signals, duration of signal assertion, and so forth. It may combine multiple signals to emulate another signal.

The interface circuit may present to the system device an emulated interface to e.g. DDR3 memory, while the physical memory chips are, in fact, DDR2 memory. The interface circuit may emulate an interface to one version of a protocol such as DDR2 with 5-5-5 latency timing, while the physical memory chips are built to another version of the protocol such as DDR2 with 3-3-3 latency timing. The interface circuit may emulate an interface to a memory having a first capacity that is different than the actual combined capacity of the physical memory chips.

An emulated timing may relate to latency of e.g. a column address strobe (CAS) latency, a row address to column address latency (tRCD), a row precharge latency (tRP), an activate to precharge latency (tRAS), and so forth. CAS latency is related to the timing of accessing a column of data. tRCD is the latency required between the row address strobe (RAS) and CAS. tRP is the latency required to terminate an open row and open access to the next row. tRAS is the latency required to access a certain row of data between an activate operation and a precharge operation.

The interface circuit may be operable to receive a signal from the system device and communicate the signal to one or more of the memory circuits after a delay (which may be hidden from the system device). Such delay may be fixed, or in some embodiments it may be variable. If variable, the delay may depend on e.g. a function of the current signal or a previous signal, a combination of signals, or the like. The delay may include a cumulative delay associated with any one or more of the signals. The delay may result in a time shift of the signal forward or backward in time with respect to other signals. Different delays may be applied to different signals. The interface circuit may similarly be operable to receive a signal from a memory circuit and communicate the signal to the system device after a delay.

The interface circuit may take the form of, or incorporate, or be incorporated into, a register, an AMB, a buffer, or the like, and may comply with Joint Electron Device Engineering Council (JEDEC) standards, and may have forwarding, storing, and/or buffering capabilities.

In some embodiments, the interface circuit may perform operations without the system device's knowledge. One particularly useful such operation is a power-saving operation. The interface circuit may identify one or more of the memory circuits which are not currently being accessed by the system device, and perform the power saving operation on those. In one such embodiment, the identification may involve determining whether any page (or other portion) of memory is being accessed. The power saving operation may be a power down operation, such as a precharge power down operation.

The interface circuit may include one or more devices which together perform the emulation and related operations. The interface circuit may be coupled or packaged with the memory devices, or with the system device or a component thereof, or separately. In one embodiment, the memory circuits and the interface circuit are coupled to a DIMM.

Figure 2:
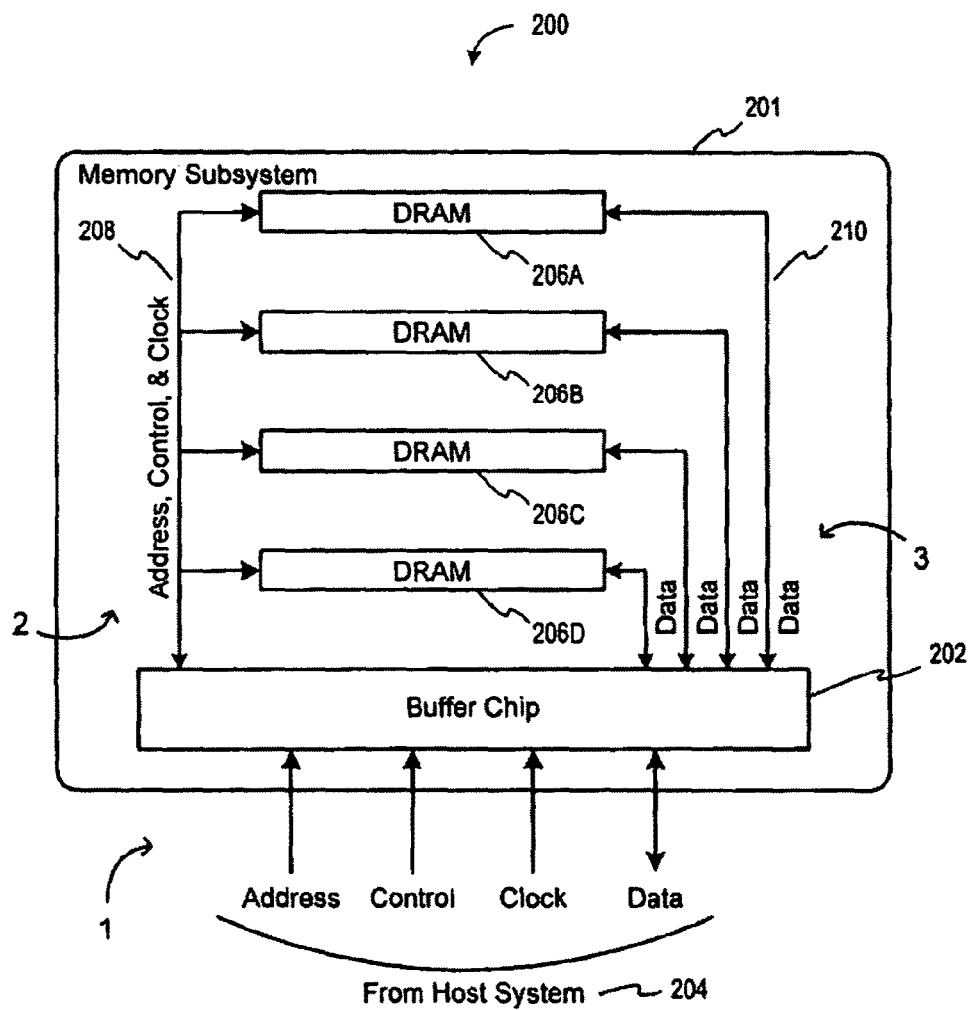
FIG. 2 shows a buffered stack of DRAM circuits each having a dedicated data path from the buffer chip and sharing a single address, control, and clock bus.

FIG. 2 illustrates one embodiment of a system 200 including a system device (e.g. host system 204, etc.) which communicates address, control, clock, and data signals with a memory subsystem 201 via an interface.

The memory subsystem includes a buffer chip 202 which presents the host system with emulated interface to emulated memory, and a plurality of physical memory circuits which, in the example shown, are DRAM chips 206A-D. In one embodiment, the DRAM chips are stacked, and the buffer chip is placed electrically between them and the host system. Although the embodiments described here show the stack consisting of multiple DRAM circuits, a stack may refer to any collection of memory circuits (e.g. DRAM circuits, flash memory circuits, or combinations of memory circuit technologies, etc.).

The buffer chip buffers communicates signals between the host system and the DRAM chips, and presents to the host system an emulated interface to present the memory as though it were a smaller number of larger capacity DRAM chips, although in actuality there is a larger number of smaller capacity DRAM chips in the memory subsystem. For example, there may be eight 512 Mb physical DRAM chips, but the buffer chip buffers and emulates them to appear as a single 4 Gb DRAM chip, or as two 2 Gb DRAM chips. Although the drawing shows four DRAM chips, this is for ease of illustration only; the invention is, of course, not limited to using four DRAM chips.

In the example shown, the buffer chip is coupled to send address, control, and clock signals 208 to the DRAM chips via a single, shared address, control, and clock bus, but each DRAM chip has its own, dedicated data path for sending and receiving data signals 210 to/from the buffer chip.

Throughout this disclosure, the reference number 1 will be used to denote the interface between the host system and the buffer chip, the reference number 2 will be used to denote the address, control, and clock interface between the buffer chip and the physical memory circuits, and the reference number 3 will be used to denote the data interface between the buffer chip and the physical memory circuits, regardless of the specifics of how any of those interfaces is implemented in the various embodiments and configurations described below. In the configuration shown in FIG. 2, there is a single address, control, and clock interface channel 2 and four data interface channels 3; this implementation may thus be said to have a "1A4D" configuration (wherein "1A" means one address, control, and clock channel in interface 2, and "4D" means four data channels in interface 3).

In the example shown, the DRAM chips are physically arranged on a single side of the buffer chip. The buffer chip may, optionally, be a part of the stack of DRAM chips, and may optionally be the bottommost chip in the stack. Or, it may be separate from the stack.

Figure 3:
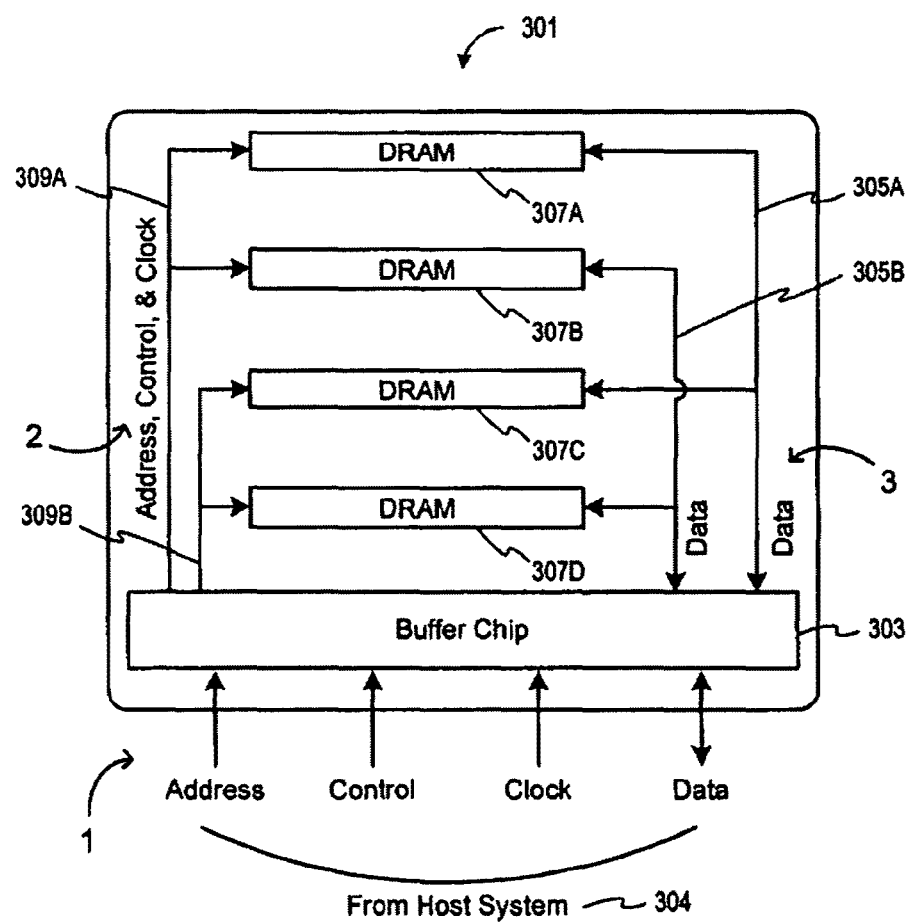
FIG. 3 shows a buffered stack of DRAM circuits having two address, control, and clock busses and two data busses.

FIG. 3 illustrates another embodiment of a system 301 in which the buffer chip 303 is interfaced to a host system 304 and is coupled to the DRAM chips 307A-307D somewhat differently than in the system of FIG. 2. There are a plurality of shared address, control, and clock busses 309A and 309B, and a plurality of shared data busses 305A and 305B. Each shared bus has two or more DRAM chips coupled to it. As shown, the sharing need not necessarily be the same in the data busses as it is in the address, control, and clock busses. This embodiment has a "2A2D" configuration.

Figure 4:
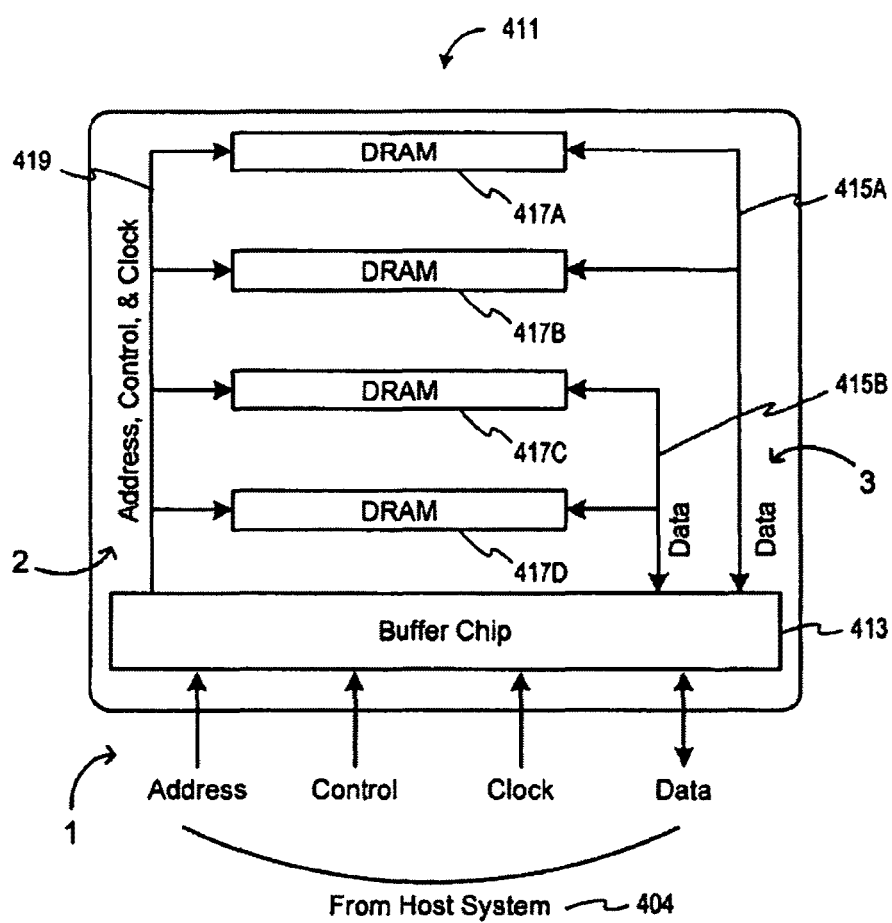
FIG. 4 shows a buffered stack of DRAM circuits having one address, control, and clock bus and two data busses.

FIG. 4 illustrates another embodiment of a system 411 in which the buffer chip 413 is interfaced to a host system 404 and is coupled to the DRAM chips 417A-417D somewhat differently than in the system of FIG. 2 or 3. There is a shared address, control, and clock bus 419, and a plurality of shared data busses 415A and 415B. Each shared bus has two or more DRAM chips coupled to it. This implementation has a "1A2D" configuration.

Figure 5:
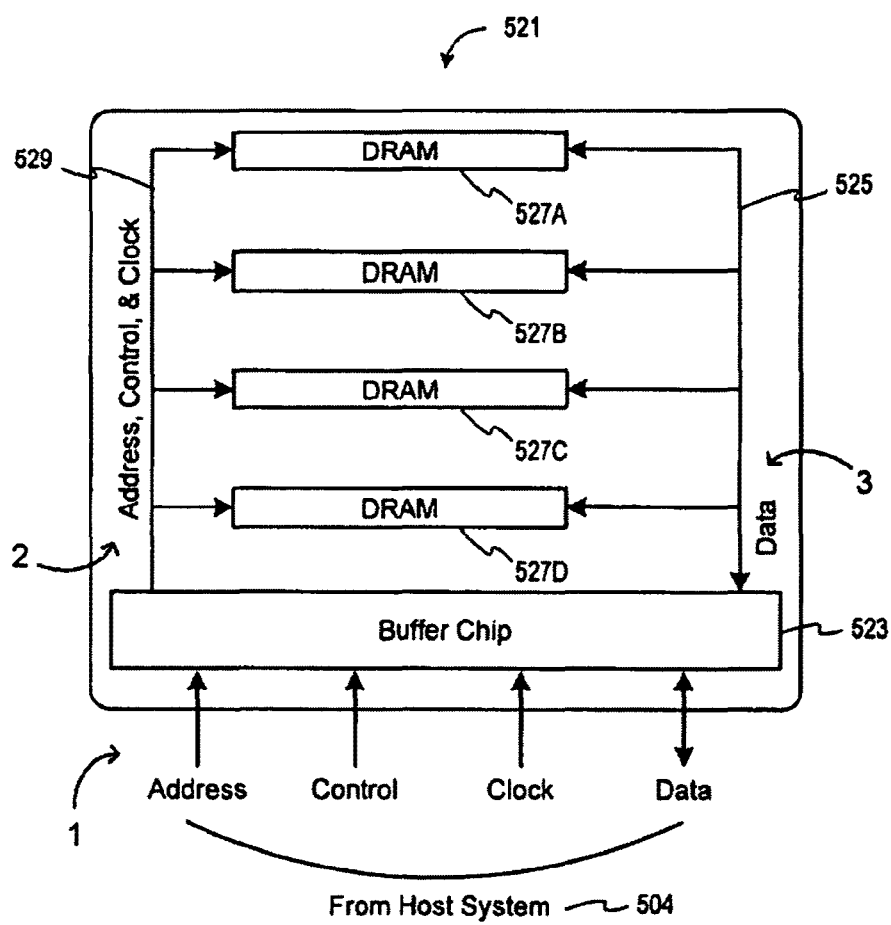
FIG. 5 shows a buffered stack of DRAM circuits having one address, control, and clock bus and one data bus.

FIG. 5 illustrates another embodiment of a system 521 in which the buffer chip 523 is interfaced to a host system 504 and is coupled to the DRAM chips 527A-527D somewhat differently than in the system of FIGS. 2 through 4. There is a shared address, control, and clock bus 529, and a shared data bus 525. This implementation has a "1A1D" configuration.

Figure 6:
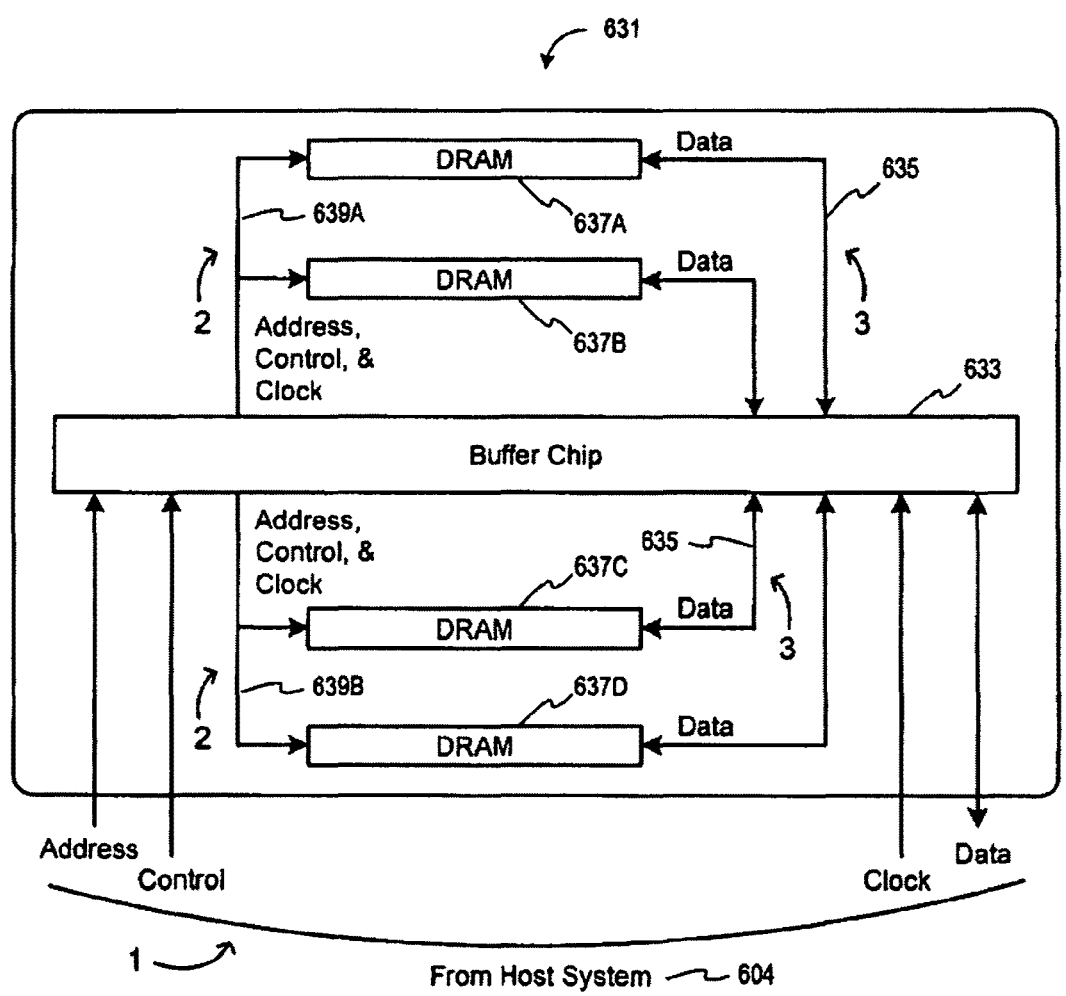
FIG. 6 shows a buffered stack of DRAM circuits in which the buffer chip is located in the middle of the stack of DRAM chips.

FIG. 6 illustrates another embodiment of a system 631 in which the buffer chip 633 is interfaced to a host system 604 and is coupled to the DRAM chips 637A-637D somewhat differently than in the system of FIGS. 2 through 5. There is a plurality of shared address, control, and clock busses 639A and 639B, and a plurality of dedicated data paths 635.

Each shared bus has two or more DRAM chips coupled to it. Further, in the example shown, the DRAM chips are physically arranged on both sides of the buffer chip. There may be, for example, sixteen DRAM chips, with the eight DRAM chips on each side of the buffer chip arranged in two stacks of four chips each. This implementation has a "2A4D" configuration.

FIGS. 2 through 6 are not intended to be an exhaustive listing of all possible permutations of data paths, busses, and buffer chip configurations, and are only illustrative of some ways in which the host system device can be in electrical contact only with the load of the buffer chip and thereby be isolated from whatever physical memory circuits, data paths, busses, etc. exist on the (logical) other side of the buffer chip.

Figure 7:
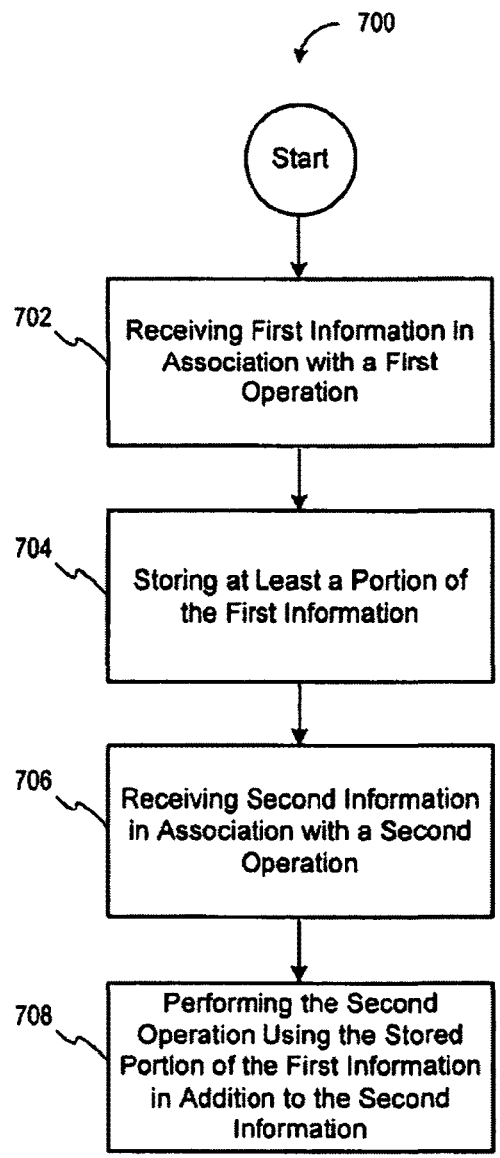
FIG. 7 is a flow chart showing one method of storing information.

FIG. 7 illustrates one embodiment of a method 700 for storing at least a portion of information received in association with a first operation, for use in performing a second operation. Such a method may be practiced in a variety of systems, such as, but not limited to, those of FIGS. 1-6. For example, the method may be performed by the interface circuit of FIG. 1 or the buffer chip of FIG. 2.

Initially, first information is received (702) in association with a first operation to be performed on at least one of the memory circuits (DRAM chips). Depending on the particular implementation, the first information may be received prior to, simultaneously with, or subsequent to the instigation of the first operation. The first operation may be, for example, a row operation, in which case the first information may include e.g. address values received by the buffer chip via the address bus from the host system. At least a portion of the first information is then stored (704).

The buffer chip also receives (706) second information associated with a second operation. For convenience, this receipt is shown as being after the storing of the first information, but it could also happen prior to or simultaneously with the storing. The second operation may be, for example, a column operation.

Then, the buffer chip performs (708) the second operation, utilizing the stored portion of the first information, and the second information.

If the buffer chip is emulating a memory device which has a larger capacity than each of the physical DRAM chips in the stack, the buffer chip may receive from the host system's memory controller more address bits than are required to address any given one of the DRAM chips. In this instance, the extra address bits may be decoded by the buffer chip to individually select the DRAM chips, utilizing separate chip select signals (not shown) to each of the DRAM chips in the stack.

For example, a stack of four ×4 1 Gb DRAM chips behind the buffer chip may appear to the host system as a single ×4 4 Gb DRAM circuit, in which case the memory controller may provide sixteen row address bits and three bank address bits during a row operation (e.g. an activate operation), and provide eleven column address bits and three bank address bits during a column operation (e.g. a read or write operation). However, the individual DRAM chips in the stack may require only fourteen row address bits and three bank address bits for a row operation, and eleven column address bits and three bank address bits during a column operation. As a result, during a row operation (the first operation in the method 702), the buffer chip may receive two address bits more than are needed by any of the DRAM chips. The buffer chip stores (704) these two extra bits during the row operation (in addition to using them to select the correct one of the DRAM chips), then uses them later, during the column operation, to select the correct one of the DRAM chips.

The mapping between a system address (from the host system to the buffer chip) and a device address (from the buffer chip to a DRAM chip) may be performed in various manners. In one embodiment, lower order system row address and bank address bits may be mapped directly to the device row address and bank address bits, with the most significant system row address bits (and, optionally, the most significant bank address bits) being stored for use in the subsequent column operation. In one such embodiment, what is stored is the decoded version of those bits; in other words, the extra bits may be stored either prior to or after decoding. The stored bits may be stored, for example, in an internal lookup table (not shown) in the buffer chip, for one or more clock cycles.

As another example, the buffer chip may have four 512 Mb DRAM chips with which it emulates a single 2 Gb DRAM chip. The system will present fifteen row address bits, from which the buffer chip may use the fourteen low order bits (or, optionally, some other set of fourteen bits) to directly address the DRAM chips. The system will present three bank address bits, from which the buffer chip may use the two low order bits (or, optionally, some other set of two bits) to directly address the DRAM chips. During a row operation, the most significant bank address bit (or other unused bit) and the most significant row address bit (or other unused bit) are used to generate the four DRAM chip select signals, and are stored for later reuse. And during a subsequent column operation, the stored bits are again used to generate the four DRAM chip select signals. Optionally, the unused bank address is not stored during the row operation, as it will be re-presented during the subsequent column operation.

As yet another example, addresses may be mapped between four 1 Gb DRAM circuits to emulate a single 4 Gb DRAM circuit. Sixteen row address bits and three bank address bits come from the host system, of which the low order fourteen address bits and all three bank address bits are mapped directly to the DRAM circuits. During a row operation, the two most significant row address bits are decoded to generate four chip select signals, and are stored using the bank address bits as the index. During the subsequent column operation, the stored row address bits are again used to generate the four chip select signals.

A particular mapping technique may be chosen, to ensure that there are no unnecessary combinational logic circuits in the critical timing path between the address input pins and address output pins of the buffer chip. Corresponding combinational logic circuits may instead be used to generate the individual chip select signals. This may allow the capacitive loading on the address outputs of the buffer chip to be much higher than the loading on the individual chip select signal outputs of the buffer chip.

In another embodiment, the address mapping may be performed by the buffer chip using some of the bank address signals from the host system to generate the chip select signals. The buffer chip may store the higher order row address bits during a row operation, using the bank address as the index, and then use the stored address bits as part of the DRAM circuit bank address during a column operation.

For example, four 512 Mb DRAM chips may be used in emulating a single 2 Gb DRAM. Fifteen row address bits come from the host system, of which the low order fourteen are mapped directly to the DRAM chips. Three bank address bits come from the host system, of which the least significant bit is used as a DRAM circuit bank address bit for the DRAM chips. The most significant row address bit may be used as an additional DRAM circuit bank address bit. During a row operation, the two most significant bank address bits are decoded to generate the four chip select signals. The most significant row address bit may be stored during the row operation, and reused during the column operation with the least significant bank address bit, to form the DRAM circuit bank address.

The column address from the host system memory controller may be mapped directly as the column address to the DRAM chips in the stack, since each of the DRAM chips may have the same page size, regardless any differences in the capacities of the (asymmetrical) DRAM chips.

Optionally, address bit A[10] may be used by the memory controller to enable or disable auto-precharge during a column operation, in which case the buffer chip may forward that bit to the DRAM circuits without any modification during a column operation.

In various embodiments, it may be desirable to determine whether the simulated DRAM circuit behaves according to a desired DRAM standard or other design specification. Behavior of many DRAM circuits is specified by the JEDEC standards, and it may be desirable to exactly emulate a particular JEDEC standard DRAM. The JEDEC standard defines control signals that a DRAM circuit must accept and the behavior of the DRAM circuit as a result of such control signals. For example, the JEDEC specification for DDR2 DRAM is known as JESD79-2B. If it is desired to determine whether a standard is met, the following algorithm may be used. Using a set of software verification tools, it checks for formal verification of logic, that protocol behavior of the simulated DRAM circuit is the same as the desired standard or other design specification. Examples of suitable verification tools include: Magellan, supplied by Synopsys, Inc. of 700 E. Middlefield Rd., Mt. View, Calif. 94043; Incisive, supplied by Cadence Design Systems, Inc., of 2655 Sealy Ave., San Jose, Calif. 95134; tools supplied by Jasper Design Automation, Inc. of 100 View St. #100, Mt. View, Calif. 94041; Verix, supplied by Real Intent, Inc., of 505 N. Mathilda Ave. #210, Sunnyvale, Calif. 94085; 0-In, supplied by Mentor Graphics Corp. of 8005 SW Boeckman Rd., Wilsonville, Oreg. 97070; and others. These software verification tools use written assertions that correspond to the rules established by the particular DRAM protocol and specification. These written assertions are further included in the code that forms the logic description for the buffer chip. By writing assertions that correspond to the desired behavior of the emulated DRAM circuit, a proof may be constructed that determines whether the desired design requirements are met.

For instance, an assertion may be written that no two DRAM control signals are allowed to be issued to an address, control, and clock bus at the same time. Although one may know which of the various buffer chip/DRAM stack configurations and address mappings (such as those described above) are suitable, the verification process allows a designer to prove that the emulated DRAM circuit exactly meets the required standard etc. If, for example, an address mapping that uses a common bus for data and a common bus for address, results in a control and clock bus that does not meet a required specification, alternative designs for buffer chips with other bus arrangements or alternative designs for the sideband signal interconnect between two or more buffer chips may be used and tested for compliance. Such sideband signals convey the power management signals, for example.

Figure 8:
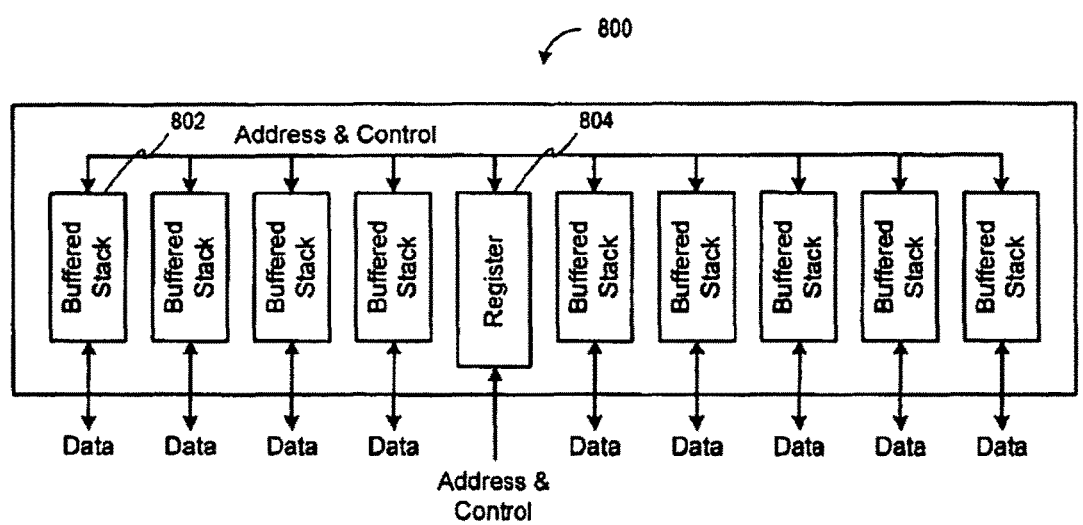
FIG. 8 shows a high capacity DIMM using buffered stacks of DRAM chips according to one embodiment of this invention.

FIG. 8 illustrates a high capacity DIMM 800 using a plurality of buffered stacks of DRAM circuits 802 and a register device 804, according to one embodiment of this invention. The register performs the addressing and control of the buffered stacks. In some embodiments, the DIMM may be an FB-DIMM, in which case the register is an AMB. In one embodiment the emulation is performed at the DIMM level.

Figure 9:
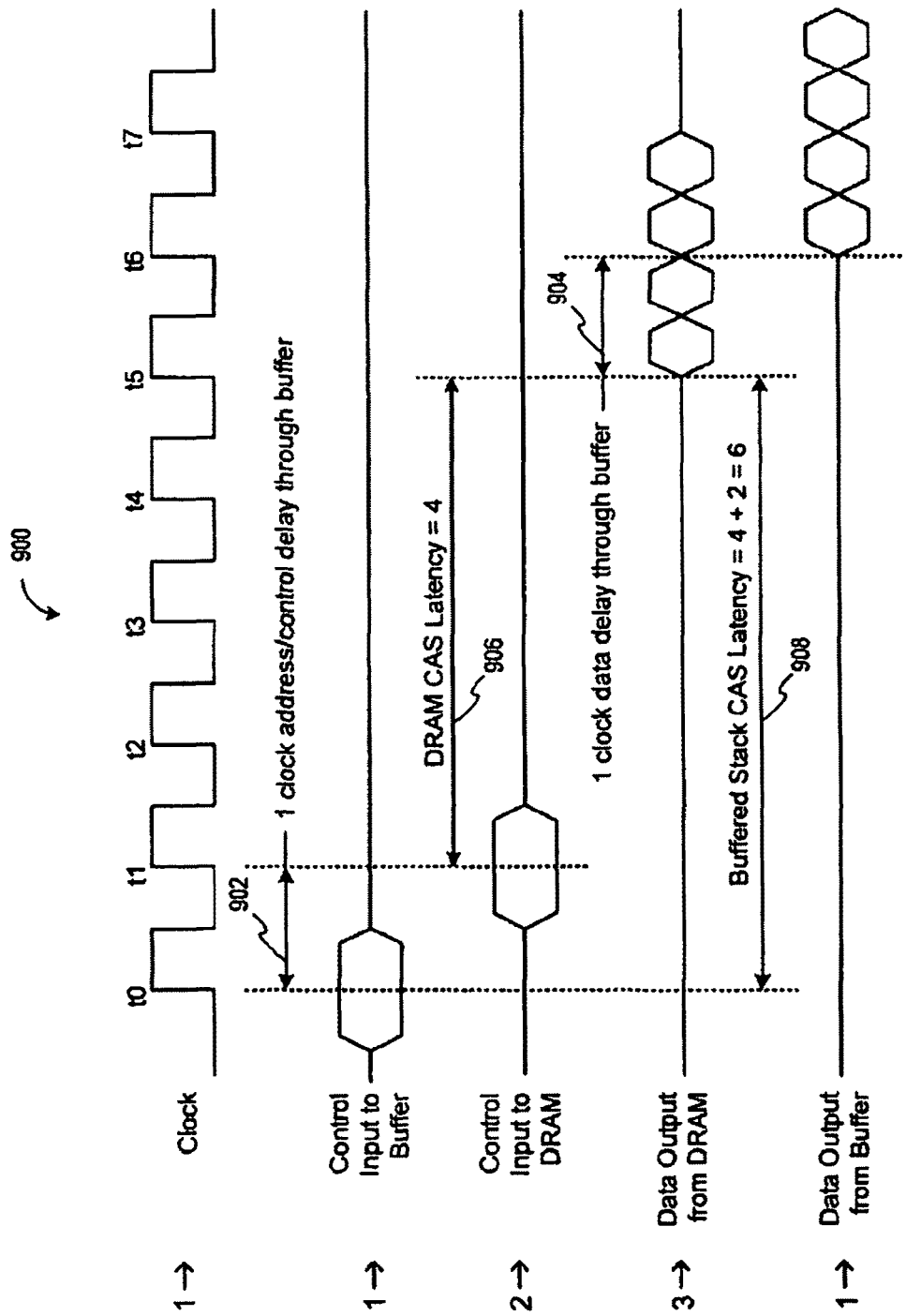
FIG. 9 is a timing diagram showing one embodiment of how the buffer chip makes a buffered stack of DRAM circuits appear to the system or memory controller to use longer column address strobe (CAS) latency DRAM chips than is actually used by the physical DRAM chips.

FIG. 9 is a timing diagram illustrating a timing design 900 of a buffer chip which makes a buffered stack of DRAM chips mimic a larger DRAM circuit having longer CAS latency, in accordance with another embodiment of this invention. Any delay through a buffer chip may be made transparent to the host system's memory controller, by using such a method. Such a delay may be a result of the buffer chip being located electrically between the memory bus of the host system and the stacked DRAM circuits, since some or all of the signals that connect the memory bus to the DRAM circuits pass through the buffer chip. A finite amount of time may be needed for these signals to traverse through the buffer chip. With the exception of register chips and AMBs, industry standard memory protocols may not comprehend the buffer chip that sits between the memory bus and the DRAM chips. Industry standards narrowly define the properties of a register chip and an AMB, but not the properties of the buffer chip of this embodiment. Thus, any signal delay caused by the buffer chip may cause a violation of the industry standard protocols.

In one embodiment, the buffer chip may cause a one-half clock cycle delay between the buffer chip receiving address and control signals from the host system memory controller (or, optionally, from a register chip or an AMB), and the address and control signals being valid at the inputs of the stacked DRAM circuits. Data signals may also have a one-half clock cycle delay in either direction to/from the host system. Other amounts of delay are, of course, possible, and the half-clock cycle example is for illustration only.

The cumulative delay through the buffer chip is the sum of a delay of the address and control signals and a delay of the data signals. FIG. 9 illustrates an example where the buffer chip is using DRAM chips having a native CAS latency of i clocks, and the buffer chip delay is j clocks, thus the buffer chip emulates a DRAM having a CAS latency of i+j clocks. In the example shown, the DRAM chips have a native CAS latency 906 of four clocks (from t1 to t5), and the total latency through the buffer chip is two clocks (one clock delay 902 from t0 to t1 for address and control signals, plus one clock delay 904 from t5 to t6 for data signals), and the buffer chip emulates a DRAM having a six clock CAS latency 908.

In FIG. 9 (and other timing diagrams), the reference numbers 1, 2, and/or 3 at the left margin indicate which of the interfaces correspond to the signals or values illustrated on the associated waveforms. For example, in FIG. 9: the "Clock" signal shown as a square wave on the uppermost waveform is indicated as belonging to the interface 1 between the host system and the buffer chip; the "Control Input to Buffer" signal is also part of the interface 1; the "Control Input to DRAM" waveform is part of the interface 2 from the buffer chip to the physical memory circuits; the "Data Output from DRAM" waveform is part of the interface 3 from the physical memory circuits to the buffer chip; and the "Data Output from Buffer" shown in the lowermost waveform is part of the interface 1 from the buffer chip to the host system.

Figure 10:
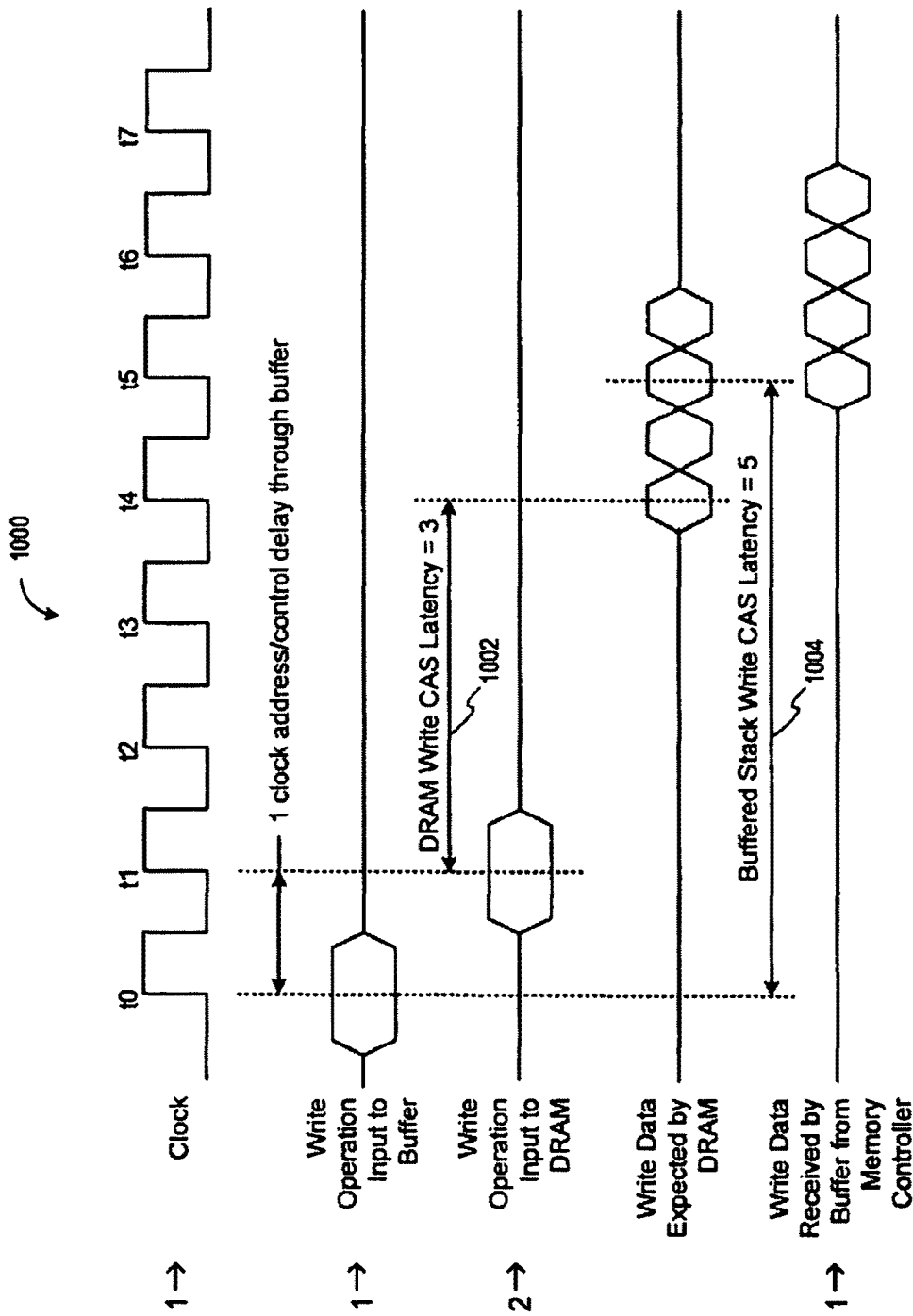
FIG. 10 shows a timing diagram showing the write data timing expected by DRAM in a buffered stack, in accordance with another embodiment of this invention.

FIG. 10 is a timing diagram illustrating a timing design 1000 of write data timing expected by a DRAM circuit in a buffered stack. Emulation of a larger capacity DRAM circuit having higher CAS latency (as in FIG. 9) may, in some implementations, create a problem with the timing of write operations. For example, with respect to a buffered stack of DDR2 SDRAM chips with a read CAS latency of four clocks which are used in emulating a single larger DDR2 SDRAM with a read CAS latency of six clocks, the DDR2 SDRAM protocol may specify that the write CAS latency 1002 is one less than the read CAS latency. Therefore, since the buffered stack appears as a DDR2 SDRAM with a read CAS latency of six clocks, the memory controller may use a buffered stack write CAS latency of five clocks 1004 when scheduling a write operation to the memory.

In the specific example shown, the memory controller issues the write operation at t0. After a one clock cycle delay through the buffer chip, the write operation is issued to the DRAM chips at t1. Because the memory controller believes it is connected to memory having a read CAS latency of six clocks and thus a write CAS latency of five clocks, it issues the write data at time t0+5=t5. But because the physical DRAM chips have a read CAS latency of four clocks and thus a write CAS latency of three clocks, they expect to receive the write data at time t1+3=t4. Hence the problem, which the buffer chip may alleviate by delaying write operations.

The waveform "Write Data Expected by DRAM" is not shown as belonging to interface 1, interface 2, or interface 3, for the simple reason that there is no such signal present in any of those interfaces. That waveform represents only what is expected by the DRAM, not what is actually provided to the DRAM.

Figure 11:
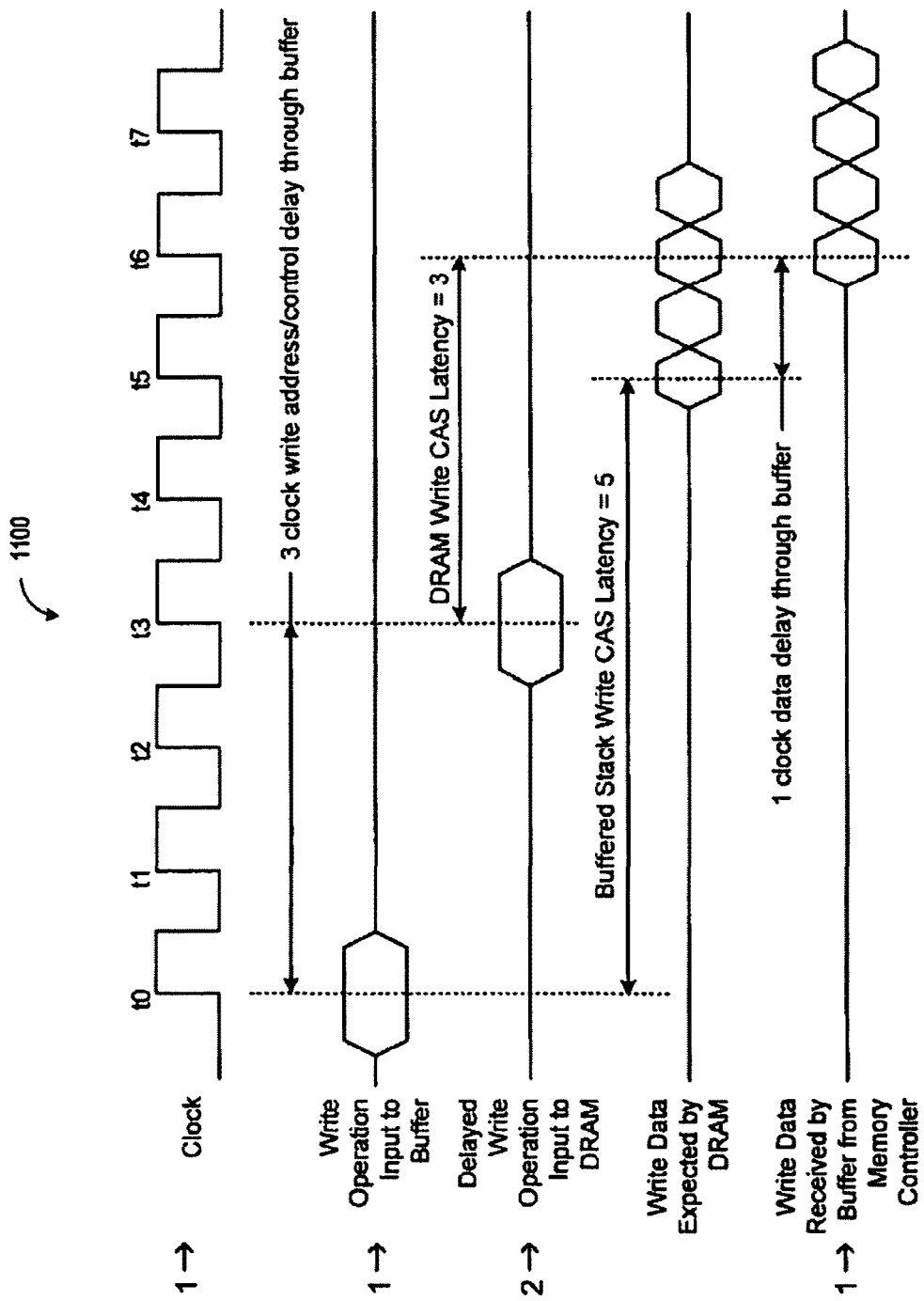
FIG. 11 is a timing diagram showing how write control signals are delayed by a buffer chip in accordance with another embodiment of this invention.

FIG. 11 is a timing illustrating a timing design 1100 showing how the buffer chip does this. The memory controller issues the write operation at t0. In FIG. 10, the write operation appeared at the DRAM circuits one clock later at t1, due to the inherent delay through the buffer chip. But in FIG. 11, in addition to the inherent one clock delay, the buffer chip has added an extra two clocks of delay to the write operation, which is not issued to the DRAM chips until t0+1+2=t3. Because the DRAM chips receive the write operation at t3 and have a write CAS latency of three clocks, they expect to receive the write data at t3+3=t6. Because the memory controller issued the write operation at t0, and it expects a write CAS latency of five clocks, it issues the write data at time t0+5=t5. After a one clock delay through the buffer chip, the write data arrives at the DRAM chips at t5+1=t6, and the timing problem is solved.

It should be noted that extra delay of j clocks (beyond the inherent delay) which the buffer chip deliberately adds before issuing the write operation to the DRAM is the sum j clocks of the inherent delay of the address and control signals and the inherent delay of the data signals. In the example shown, both those inherent delays are one clock, so j=2.

Figure 12:
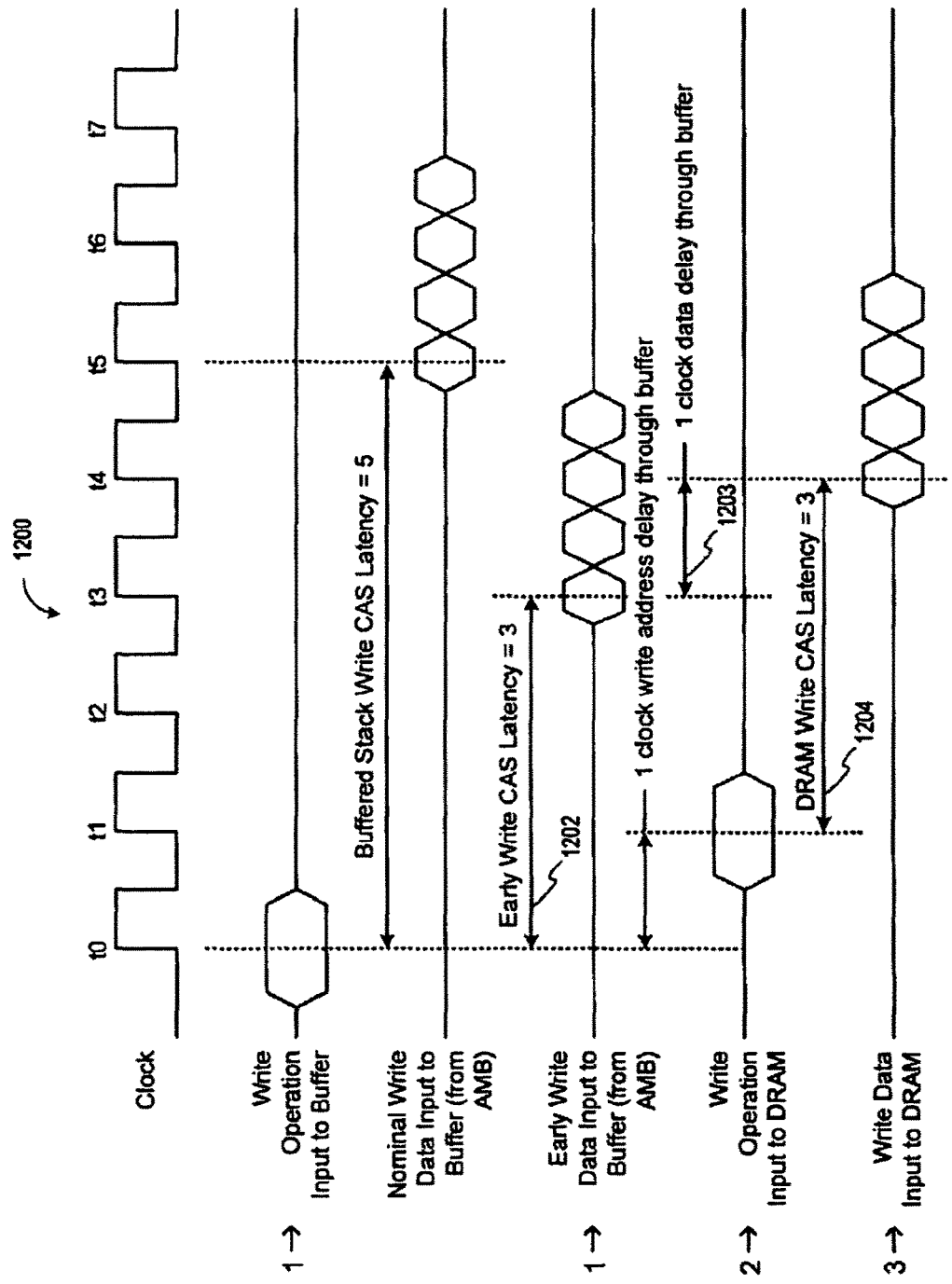
FIG. 12 is a timing diagram showing early write data from a memory controller or an advanced memory buffer (AMB) according to yet another embodiment of this invention.

FIG. 12 is a timing diagram illustrating operation of an FB-DIMM's AMB, which may be designed to send write data earlier to buffered stacks instead of delaying the write address and operation (as in FIG. 11). Specifically, it may use an early write CAS latency 1202 to compensate the timing of the buffer chip write operation. If the buffer chip has a cumulative (address and data) inherent delay of two clocks, the AMB may send the write data to the buffered stack two clocks early. This may not be possible in the case of registered DIMMs, in which the memory controller sends the write data directly to the buffered stacks (rather than via the AMB). In another embodiment, the memory controller itself could be designed to send write data early, to compensate for the j clocks of cumulative inherent delay caused by the buffer chip.

In the example shown, the memory controller issues the write operation at t0. After a one clock inherent delay through the buffer chip, the write operation arrives at the DRAM at t1. The DRAM expects the write data at t1+3=t4. The industry specification would suggest a nominal write data time of t0+5=t5, but the AMB (or memory controller), which already has the write data (which are provided with the write operation), is configured to perform an early write at t5−2=t3. After the inherent delay 1203 through the buffer chip, the write data arrive at the DRAM at t3+1=t4, exactly when the DRAM expects it—specifically, with a three-cycle DRAM Write CAS latency 1204 which is equal to the three-cycle Early Write CAS Latency 1202.

Figure 13:
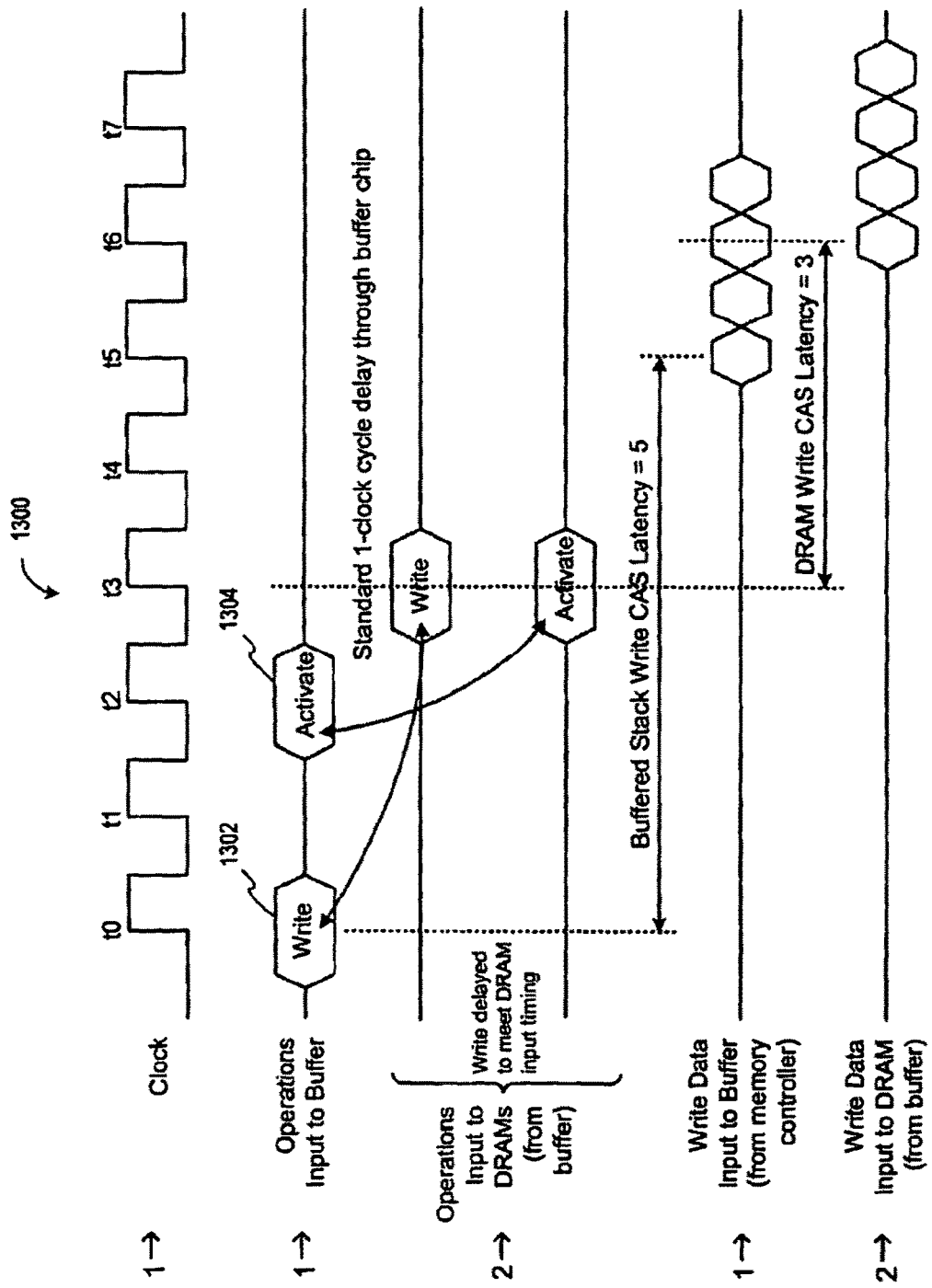
FIG. 13 is a timing diagram showing address bus conflicts caused by delayed write operations.

FIG. 13 is a timing diagram 1300 illustrating bus conflicts which can be caused by delayed write operations. The delaying of write addresses and write operations may be performed by a buffer chip, a register, an AMB, etc. in a manner that is completely transparent to the memory controller of the host system. And, because the memory controller is unaware of this delay, it may schedule subsequent operations such as activate or precharge operations, which may collide with the delayed writes on the address bus to the DRAM chips in the stack.

An example is shown, in which the memory controller issues a write operation 1302 at time t0. The buffer chip or AMB delays the write operation, such that it appears on the bus to the DRAM chips at time t3. Unfortunately, at time t2 the memory controller issued an activate operation (control signal) 1304 which, after a one-clock inherent delay through the buffer chip, appears on the bus to the DRAM chips at time t3, colliding with the delayed write.

Figure 14:
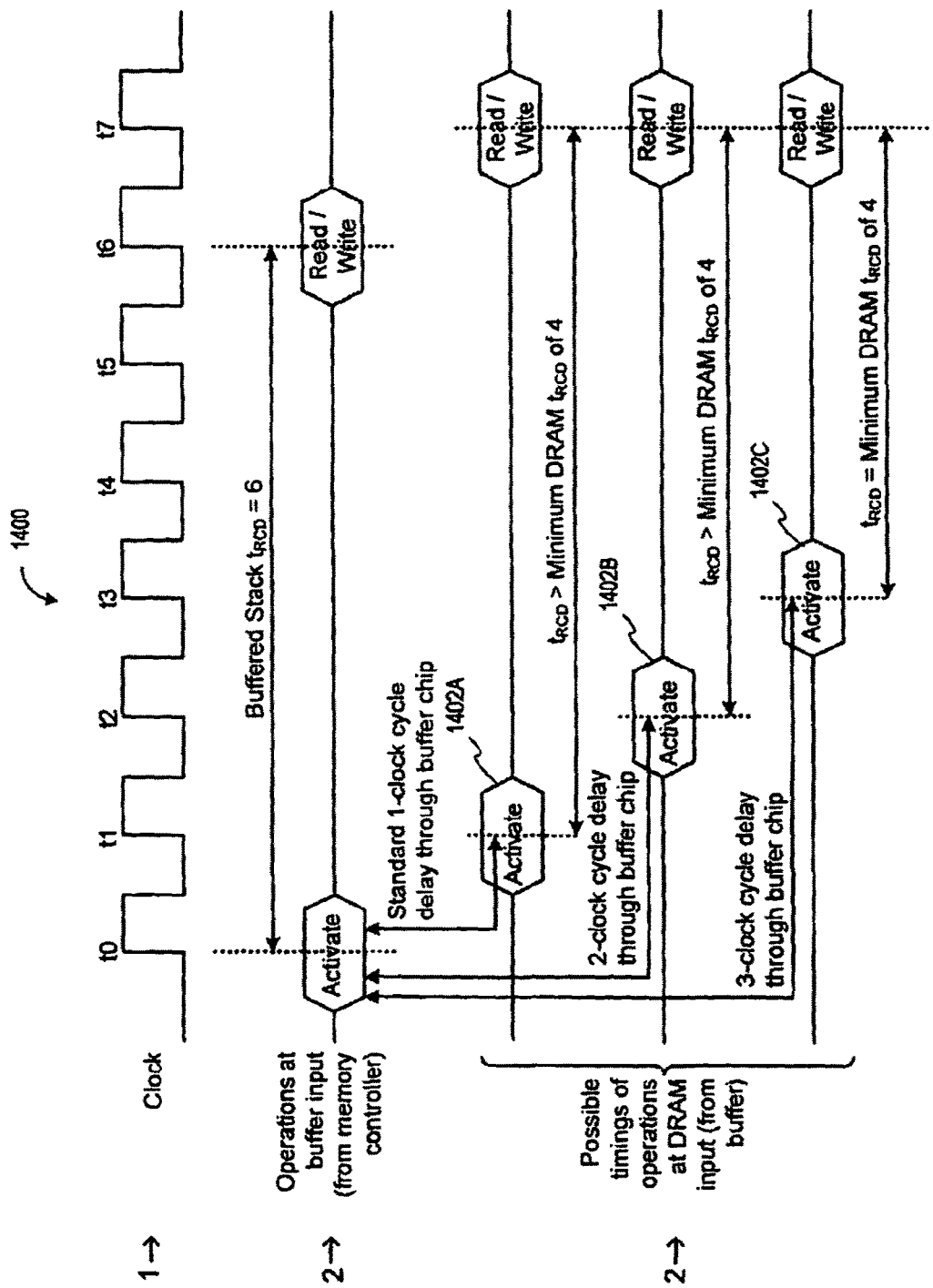
FIG. 14 is a timing diagram showing variable delay of an activate operation through a buffer chip.
Figure 15:
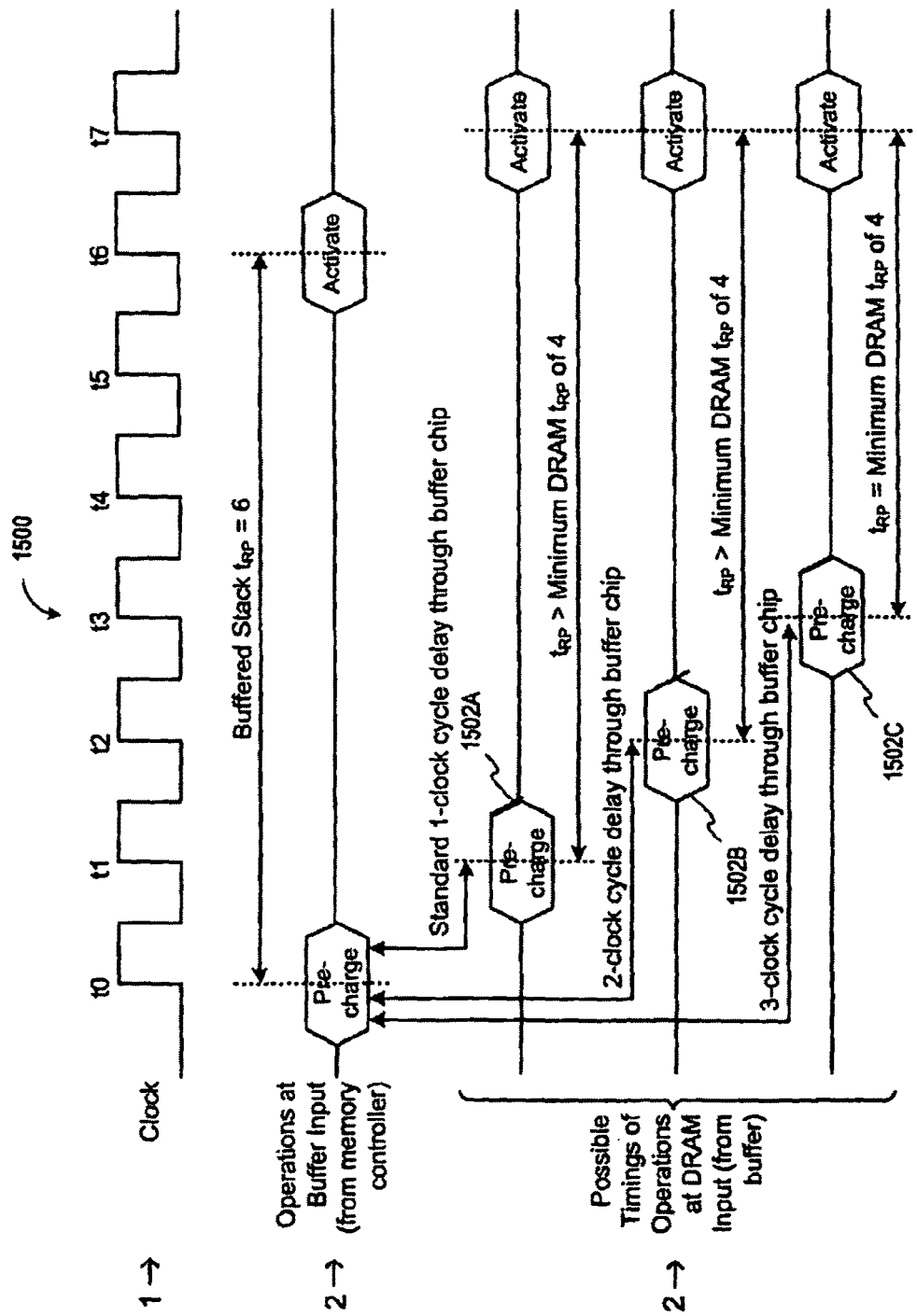
FIG. 15 is a timing diagram showing variable delay of a precharge operation through a buffer chip.

FIGS. 14 and 15 are a timing diagram 1400 and a timing diagram 1500 illustrating methods of avoiding such collisions. If the cumulative latency through the buffer chip is two clock cycles, and the native read CAS latency of the DRAM chips is four clock cycles, then in order to hide the delay of the address and control signals and the data signals through the buffer chip, the buffer chip presents the host system with an interface to an emulated memory having a read CAS latency of six clock cycles. And if the tRCD and tRP of the DRAM chips are four clock cycles each, the buffer chip tells the host system that they are six clock cycles each in order to allow the buffer chip to delay the activate and precharge operations to avoid collisions in a manner that is transparent to the host system.

For example, a buffered stack that uses 4-4-4 DRAM chips (that is, CAS latency=4, tRCD=4, and tRP=4) may appear to the host system as one larger DRAM that uses 6-6-6 timing.

Since the buffered stack appears to the host system's memory controller as having a tRCD of six clock cycles, the memory controller may schedule a column operation to a bank six clock cycles (at time t6) after an activate (row) operation (at time t0) to the same bank. However, the DRAM chips in the stack actually have a tRCD of four clock cycles. This gives the buffer chip time to delay the activate operation by up to two clock cycles, avoiding any conflicts on the address bus between the buffer chip and the DRAM chips, while ensuring correct read and write timing on the channel between the memory controller and the buffered stack.

As shown, the buffer chip may issue the activate operation to the DRAM chips one, two, or three clock cycles after it receives the activate operation from the memory controller, register, or AMB. The actual delay selected may depend on the presence or absence of other DRAM operations that may conflict with the activate operation, and may optionally change from one activate operation to another. In other words, the delay may be dynamic. A one-clock delay (1402A, 1502A) may be accomplished simply by the inherent delay through the buffer chip. A two-clock delay (1402B, 1502B) may be accomplished by adding one clock of additional delay to the one-clock inherent delay, and a three-clock delay (1402C, 1502C) may be accomplished by adding two clocks of additional delay to the one-clock inherent delay. A read, write, or activate operation issued by the memory controller at time t6 will, after a one-clock inherent delay through the buffer chip, be issued to the DRAM chips at time t7. A preceding activate or precharge operation issued by the memory controller at time t0 will, depending upon the delay, be issued to the DRAM chips at time t1, t2, or t3, each of which is at least the tRCD or tRP of four clocks earlier than the t7 issuance of the read, write, or activate operation.

Since the buffered stack appears to the memory controller to have a tRP of six clock cycles, the memory controller may schedule a subsequent activate (row) operation to a bank a minimum of six clock cycles after issuing a precharge operation to that bank. However, since the DRAM circuits in the stack actually have a tRP of four clock cycles, the buffer chip may have the ability to delay issuing the precharge operation to the DRAM chips by up to two clock cycles, in order to avoid any conflicts on the address bus, or in order to satisfy the tRAS requirements of the DRAM chips.

In particular, if the activate operation to a bank was delayed to avoid an address bus conflict, then the precharge operation to the same bank may be delayed by the buffer chip to satisfy the tRAS requirements of the DRAM. The buffer chip may issue the precharge operation to the DRAM chips one, two, or three clock cycles after it is received. The delay selected may depend on the presence or absence of address bus conflicts or tRAS violations, and may change from one precharge operation to another.

Figure 16:
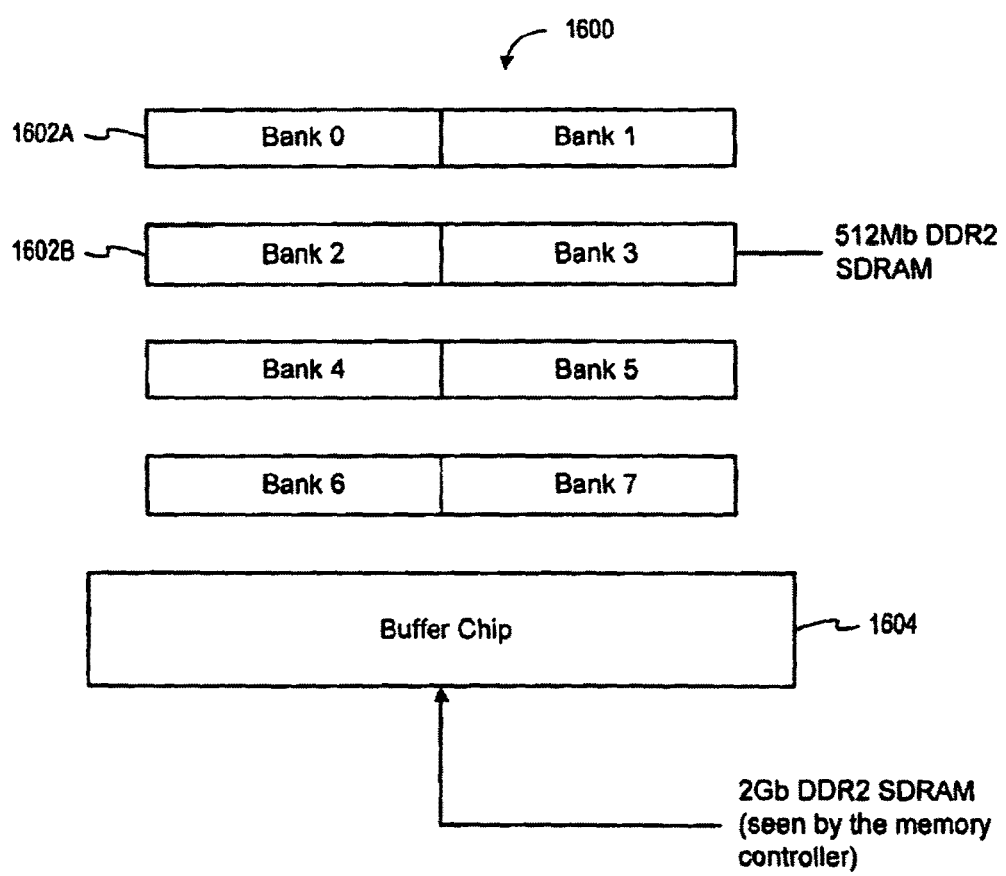
FIG. 16 shows a buffered stack of DRAM circuits and the buffer chip which presents them to the system as if they were a single, larger DRAM circuit, in accordance with one embodiment of this invention.

FIG. 16 illustrates a buffered stack 1600 according to one embodiment of this invention. The buffered stack includes four 512 Mb DDR2 DRAM circuits (chips) 1602 which a buffer chip 1604 maps to a single 2 Gb DDR2 DRAM.

Although the multiple DRAM chips appear to the memory controller as though they were a single, larger DRAM, the combined power dissipation of the actual DRAM chips may be much higher than the power dissipation of a monolithic DRAM of the same capacity. In other words, the physical DRAM may consume significantly more power than would be consumed by the emulated DRAM.

As a result, a DIMM containing multiple buffered stacks may dissipate much more power than a standard DIMM of the same actual capacity using monolithic DRAM circuits. This increased power dissipation may limit the widespread adoption of DIMMs that use buffered stacks. Thus, it is desirable to have a power management technique which reduces the power dissipation of DIMMs that use buffered stacks.

In one such technique, the DRAM circuits may be opportunistically placed in low power states or modes. For example, the DRAM circuits may be placed in a precharge power down mode using the clock enable (CKE) pin of the DRAM circuits.

A single rank registered DIMM (R-DIMM) may contain a plurality of buffered stacks, each including four ×4 512 Mb DDR2 SDRAM chips and appear (to the memory controller via emulation by the buffer chip) as a single ×4 2 Gb DDR2 SDRAM. The JEDEC standard indicates that a 2 Gb DDR2 SDRAM may generally have eight banks, shown in FIG. 16 as Bank 0 to Bank 7. Therefore, the buffer chip may map each 512 Mb DRAM chip in the stack to two banks of the equivalent 2 Gb DRAM, as shown; the first DRAM chip 1602A is treated as containing banks 0 and 1, 1602B is treated as containing banks 2 and 4, and so forth.

The memory controller may open and close pages in the DRAM banks based on memory requests it receives from the rest of the host system. In some embodiments, no more than one page may be able to be open in a bank at any given time. In the embodiment shown in FIG. 16, each DRAM chip may therefore have up to two pages open at a time. When a DRAM chip has no open pages, the power management scheme may place it in the precharge power down mode.

The clock enable inputs of the DRAM chips may be controlled by the buffer chip, or by another chip (not shown) on the R-DIMM, or by an AMB (not shown) in the case of an FB-DIMM, or by the memory controller, to implement the power management technique. The power management technique may be particularly effective if it implements a closed page policy.

Another optional power management technique may include mapping a plurality of DRAM circuits to a single bank of the larger capacity emulated DRAM. For example, a buffered stack (not shown) of sixteen ×4 256 Mb DDR2 SDRAM chips may be used in emulating a single ×4 4 Gb DDR2 SDRAM. The 4 Gb DRAM is specified by JEDEC as having eight banks of 512 Mbs each, so two of the 256 Mb DRAM chips may be mapped by the buffer chip to emulate each bank (whereas in FIG. 16 one DRAM was used to emulate two banks).

However, since only one page can be open in a bank at any given time, only one of the two DRAM chips emulating that bank can be in the active state at any given time. If the memory controller opens a page in one of the two DRAM chips, the other may be placed in the precharge power down mode. Thus, if a number p of DRAM chips are used to emulate one bank, at least p−1 of them may be in a power down mode at any given time; in other words, at least p−1 of the p chips are always in power down mode, although the particular powered down chips will tend to change over time, as the memory controller opens and closes various pages of memory.

As a caveat on the term "always" in the preceding paragraph, the power saving operation may comprise operating in precharge power down mode except when refresh is required.

Figure 17:
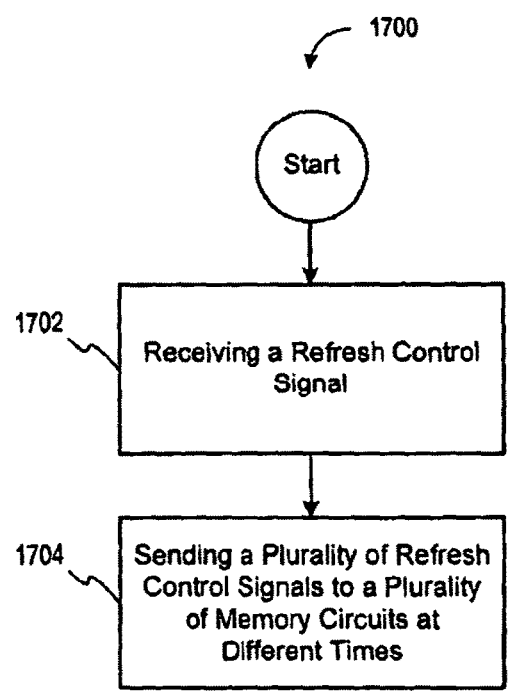
FIG. 17 is a flow chart showing a method of refreshing a plurality of memory circuits, in accordance with one embodiment of this invention.

FIG. 17 is a flow chart 1700 illustrating one embodiment of a method of refreshing a plurality of memory circuits. A refresh control signal is received (1702) e.g. from a memory controller which intends to refresh an emulated memory circuit. In response to receipt of the refresh control signal, a plurality of refresh control signals are sent (1704) e.g. by a buffer chip to a plurality of physical memory circuits at different times. These refresh control signals may optionally include the received refresh control signal or an instantiation or copy thereof. They may also, or instead, include refresh control signals that are different in at least one aspect (format, content, etc.) from the received signal.

In some embodiments, at least one first refresh control signal may be sent to a first subset of the physical memory circuits at a first time, and at least one second refresh control signal may be sent to a second subset of the physical memory circuits at a second time. Each refresh signal may be sent to one physical memory circuit, or to a plurality of physical memory circuits, depending upon the particular implementation.

The refresh control signals may be sent to the physical memory circuits after a delay in accordance with a particular timing. For example, the timing in which they are sent to the physical memory circuits may be selected to minimize an electrical current drawn by the memory, or to minimize a power consumption of the memory. This may be accomplished by staggering a plurality of refresh control signals. Or, the timing may be selected to comply with e.g. a tRFC parameter associated with the memory circuits.

To this end, physical DRAM circuits may receive periodic refresh operations to maintain integrity of data stored therein. A memory controller may initiate refresh operations by issuing refresh control signals to the DRAM circuits with sufficient frequency to prevent any loss of data in the DRAM circuits. After a refresh control signal is issued, a minimum time tRFC may be required to elapse before another control signal may be issued to that DRAM circuit. The tRFC parameter value may increase as the size of the DRAM circuit increases.

When the buffer chip receives a refresh control signal from the memory controller, it may refresh the smaller DRAM circuits within the span of time specified by the tRFC of the emulated DRAM circuit. Since the tRFC of the larger, emulated DRAM is longer than the tRFC of the smaller, physical DRAM circuits, it may not be necessary to issue any or all of the refresh control signals to the physical DRAM circuits simultaneously. Refresh control signals may be issued separately to individual DRAM circuits or to groups of DRAM circuits, provided that the tRFC requirements of all physical DRAMs has been met by the time the emulated DRAM's tRFC has elapsed. In use, the refreshes may be spaced in time to minimize the peak current draw of the combination buffer chip and DRAM circuit set during a refresh operation.

Figure 18:
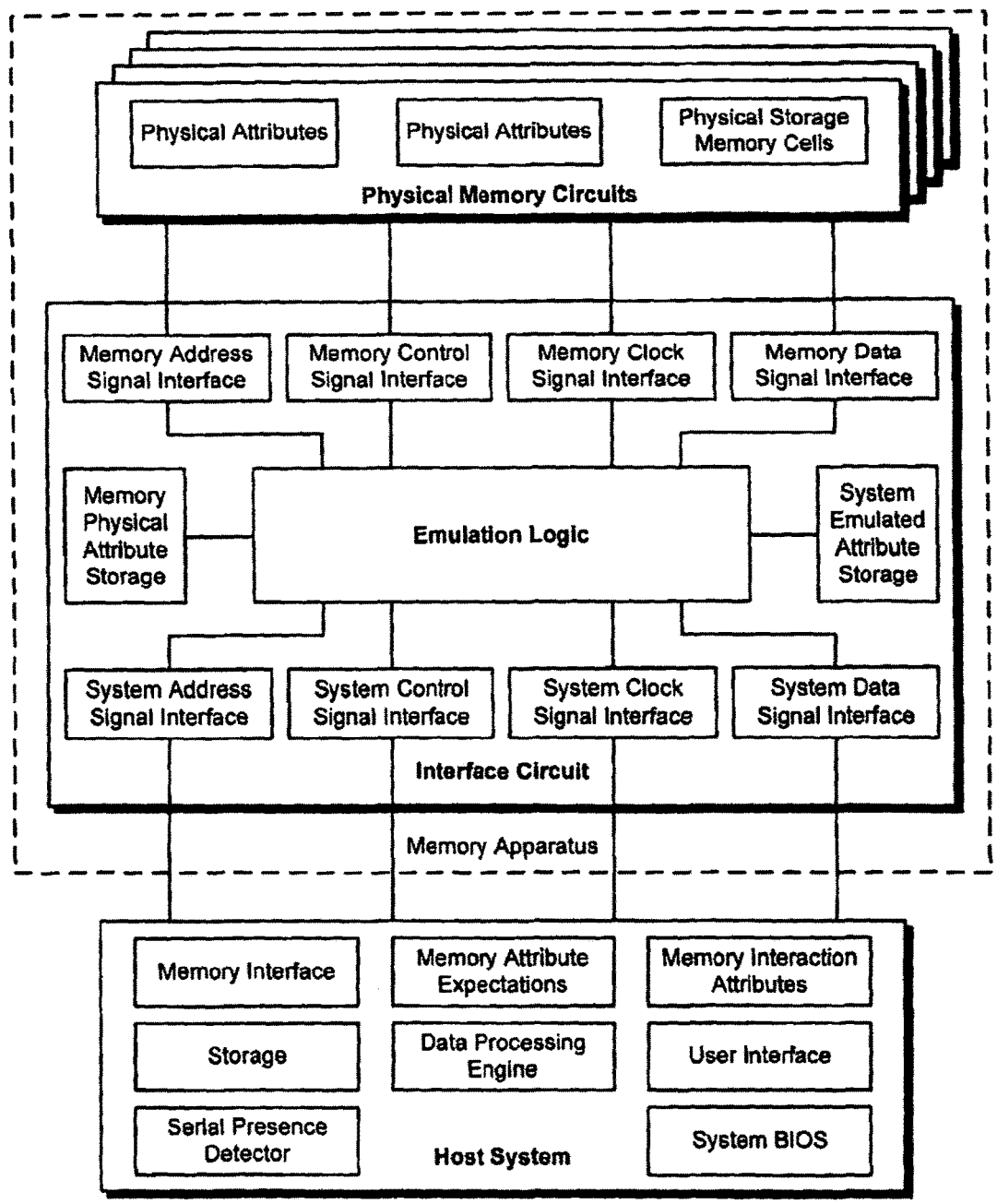
FIG. 18 shows a block diagram of another embodiment of the invention.

FIG. 18 illustrates one embodiment of an interface circuit such as may be utilized in any of the above-described memory systems, for interfacing between a system and memory circuits. The interface circuit may be included in the buffer chip, for example.

The interface circuit includes a system address signal interface for sending/receiving address signals to/from the host system, a system control signal interface for sending/receiving control signals to/from the host system, a system clock signal interface for sending/receiving clock signals to/from the host system, and a system data signal interface for sending/receiving data signals to/from the host system. The interface circuit further includes a memory address signal interface for sending/receiving address signals to/from the physical memory, a memory control signal interface for sending/receiving control signals to/from the physical memory, a memory clock signal interface for sending/receiving clock signals to/from the physical memory, and a memory data signal interface for sending/receiving data signals to/from the physical memory.

The host system includes a set of memory attribute expectations, or built-in parameters of the physical memory with which it has been designed to work (or with which it has been told, e.g. by the buffer circuit, it is working). Accordingly, the host system includes a set of memory interaction attributes, or built-in parameters according to which the host system has been designed to operate in its interactions with the memory. These memory interaction attributes and expectations will typically, but not necessarily, be embodied in the host system's memory controller.

In addition to physical storage circuits or devices, the physical memory itself has a set of physical attributes.

These expectations and attributes may include, by way of example only, memory timing, memory capacity, memory latency, memory functionality, memory type, memory protocol, memory power consumption, memory current requirements, and so forth.

The interface circuit includes memory physical attribute storage for storing values or parameters of various physical attributes of the physical memory circuits. The interface circuit further includes system emulated attribute storage. These storage systems may be read/write capable stores, or they may simply be a set of hard-wired logic or values, or they may simply be inherent in the operation of the interface circuit.

The interface circuit includes emulation logic which operates according to the stored memory physical attributes and the stored system emulation attributes, to present to the system an interface to an emulated memory which differs in at least one attribute from the actual physical memory. The emulation logic may, in various embodiments, alter a timing, value, latency, etc. of any of the address, control, clock, and/or data signals it sends to or receives from the system and/or the physical memory. Some such signals may pass through unaltered, while others may be altered. The emulation logic may be embodied as, for example, hard wired logic, a state machine, software executing on a processor, and so forth.

When one component is said to be "adjacent" another component, it should not be interpreted to mean that there is absolutely nothing between the two components, only that they are in the order indicated.

The physical memory circuits employed in practicing this invention may be any type of memory whatsoever, such as: DRAM, DDR DRAM, DDR2 DRAM, DDR3 DRAM, SDRAM, QDR DRAM, DRDRAM, FPM DRAM, VDRAM, EDO DRAM, BEDO DRAM, MDRAM, SGRAM, MRAM, IRAM, NAND flash, NOR flash, PSRAM, wetware memory, etc.

The physical memory circuits may be coupled to any type of memory module, such as: DIMM, R-DIMM, SO-DIMM, FB-DIMM, unbuffered DIMM, etc.

The system device which accesses the memory may be any type of system device, such as: desktop computer, laptop computer, workstation, server, consumer electronic device, television, personal digital assistant (PDA), mobile phone, printer or other peripheral device, etc.

Power-Related Embodiments

Figure 19:
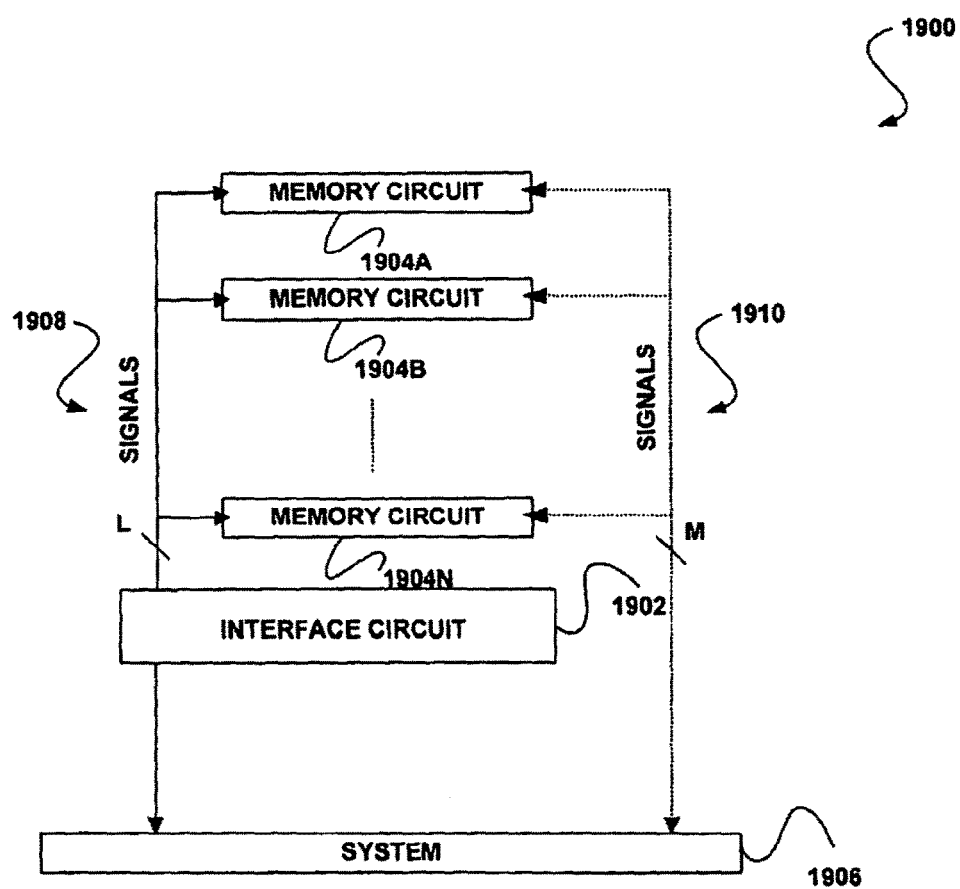
FIG. 19 illustrates a multiple memory circuit framework, in accordance with one embodiment.

FIG. 19 illustrates a multiple memory circuit framework 1900, in accordance with one embodiment. As shown, included are an interface circuit 1902, a plurality of memory circuits 1904A, 1904B, 1904N, and a system 1906. In the context of the present description, such memory circuits 1904A, 1904B, 1904N may include any circuit capable of serving as memory.

For example, in various embodiments, at least one of the memory circuits 1904A, 1904B, 1904N may include a monolithic memory circuit, a semiconductor die, a chip, a packaged memory circuit, or any other type of tangible memory circuit. In one embodiment, the memory circuits 1904A, 1904B, 1904N may take the form of a dynamic random access memory (DRAM) circuit. Such DRAM may take any form including, but not limited to, synchronous DRAM (SDRAM), double data rate synchronous DRAM (DDR SDRAM, DDR2 SDRAM, DDR3 SDRAM, etc.), graphics double data rate DRAM (GDDR, GDDR2, GDDR3, etc.), quad data rate DRAM (QDR DRAM), RAMBUS XDR DRAM (XDR DRAM), fast page mode DRAM (FPM DRAM), video DRAM (VDRAM), extended data out DRAM (EDO DRAM), burst EDO RAM (BEDO DRAM), multibank DRAM (MDRAM), synchronous graphics RAM (SGRAM), and/or any other type of DRAM.

In another embodiment, at least one of the memory circuits 1904A, 1904B, 1904N may include magnetic random access memory (MRAM), intelligent random access memory (IRAM), distributed network architecture (DNA) memory, window random access memory (WRAM), flash memory (e.g. NAND, NOR, etc.), pseudostatic random access memory (PSRAM), wetware memory, memory based on semiconductor, atomic, molecular, optical, organic, biological, chemical, or nanoscale technology, and/or any other type of volatile or nonvolatile, random or non-random access, serial or parallel access memory circuit.

Strictly as an option, the memory circuits 1904A, 1904B, 1904N may or may not be positioned on at least one dual in-line memory module (DIMM) (not shown). In various embodiments, the DIMM may include a registered DIMM (R-DIMM), a small outline-DIMM (SO-DIMM), a fully buffered DIMM (FB-DIMM), an unbuffered DIMM (UDIMM), single inline memory module (SIMM), a Mini-DIMM, a very low profile (VLP) R-DIMM, etc. In other embodiments, the memory circuits 1904A, 1904B, 1904N may or may not be positioned on any type of material forming a substrate, card, module, sheet, fabric, board, carrier or other any other type of solid or flexible entity, form, or object. Of course, in other embodiments, the memory circuits 1904A, 1904B, 1904N may or may not be positioned in or on any desired entity, form, or object for packaging purposes. Still yet, the memory circuits 1904A, 1904B, 1904N may or may not be organized into ranks. Such ranks may refer to any arrangement of such memory circuits 1904A, 1904B, 1904N on any of the foregoing entities, forms, objects, etc.

Further, in the context of the present description, the system 1906 may include any system capable of requesting and/or initiating a process that results in an access of the memory circuits 1904A, 1904B, 1904N. As an option, the system 1906 may accomplish this utilizing a memory controller (not shown), or any other desired mechanism. In one embodiment, such system 1906 may include a system in the form of a desktop computer, a lap-top computer, a server, a storage system, a networking system, a workstation, a personal digital assistant (PDA), a mobile phone, a television, a computer peripheral (e.g. printer, etc.), a consumer electronics system, a communication system, and/or any other software and/or hardware, for that matter.

The interface circuit 1902 may, in the context of the present description, refer to any circuit capable of interfacing (e.g. communicating, buffering, etc.) with the memory circuits 1904A, 1904B, 1904N and the system 1906. For example, the interface circuit 1902 may, in the context of different embodiments, include a circuit capable of directly (e.g. via wire, bus, connector, and/or any other direct communication medium, etc.) and/or indirectly (e.g. via wireless, optical, capacitive, electric field, magnetic field, electromagnetic field, and/or any other indirect communication medium, etc.) communicating with the memory circuits 1904A, 1904B, 1904N and the system 1906. In additional different embodiments, the communication may use a direct connection (e.g. point-to-point, single-drop bus, multi-drop bus, serial bus, parallel bus, link, and/or any other direct connection, etc.) or may use an indirect connection (e.g. through intermediate circuits, intermediate logic, an intermediate bus or busses, and/or any other indirect connection, etc.).

In additional optional embodiments, the interface circuit 1902 may include one or more circuits, such as a buffer (e.g. buffer chip, etc.), register (e.g. register chip, etc.), advanced memory buffer (AMB) (e.g. AMB chip, etc.), a component positioned on at least one DIMM, etc. Moreover, the register may, in various embodiments, include a JEDEC Solid State Technology Association (known as JEDEC) standard register (a JEDEC register), a register with forwarding, storing, and/or buffering capabilities, etc. In various embodiments, the register chips, buffer chips, and/or any other interface circuit(s) 1902 may be intelligent, that is, include logic that are capable of one or more functions such as gathering and/or storing information; inferring, predicting, and/or storing state and/or status; performing logical decisions; and/or performing operations on input signals, etc. In still other embodiments, the interface circuit 1902 may optionally be manufactured in monolithic form, packaged form, printed form, and/or any other manufactured form of circuit, for that matter.

In still yet another embodiment, a plurality of the aforementioned interface circuits 1902 may serve, in combination, to interface the memory circuits 1904A, 1904B, 1904N and the system 1906. Thus, in various embodiments, one, two, three, four, or more interface circuits 1902 may be utilized for such interfacing purposes. In addition, multiple interface circuits 1902 may be relatively configured or connected in any desired manner. For example, the interface circuits 1902 may be configured or connected in parallel, serially, or in various combinations thereof. The multiple interface circuits 1902 may use direct connections to each other, indirect connections to each other, or even a combination thereof. Furthermore, any number of the interface circuits 1902 may be allocated to any number of the memory circuits 1904A, 1904B, 1904N. In various other embodiments, each of the plurality of interface circuits 1902 may be the same or different. Even still, the interface circuits 1902 may share the same or similar interface tasks and/or perform different interface tasks.

While the memory circuits 1904A, 1904B, 1904N, interface circuit 1902, and system 1906 are shown to be separate parts, it is contemplated that any of such parts (or portion(s) thereof) may be integrated in any desired manner. In various embodiments, such optional integration may involve simply packaging such parts together (e.g. stacking the parts to form a stack of DRAM circuits, a DRAM stack, a plurality of DRAM stacks, a hardware stack, where a stack may refer to any bundle, collection, or grouping of parts and/or circuits, etc.) and/or integrating them monolithically. Just by way of example, in one optional embodiment, at least one interface circuit 1902 (or portion(s) thereof) may be packaged with at least one of the memory circuits 1904A, 1904B, 1904N. Thus, a DRAM stack may or may not include at least one interface circuit (or portion(s) thereof). In other embodiments, different numbers of the interface circuit 1902 (or portion(s) thereof) may be packaged together. Such different packaging arrangements, when employed, may optionally improve the utilization of a monolithic silicon implementation, for example.

The interface circuit 1902 may be capable of various functionality, in the context of different embodiments. For example, in one optional embodiment, the interface circuit 1902 may interface a plurality of signals 1908 that are connected between the memory circuits 1904A, 1904B, 1904N and the system 1906. The signals may, for example, include address signals, data signals, control signals, enable signals, clock signals, reset signals, or any other signal used to operate or associated with the memory circuits, system, or interface circuit(s), etc. In some optional embodiments, the signals may be those that: use a direct connection, use an indirect connection, use a dedicated connection, may be encoded across several connections, and/or may be otherwise encoded (e.g. time-multiplexed, etc.) across one or more connections.

In one aspect of the present embodiment, the interfaced signals 1908 may represent all of the signals that are connected between the memory circuits 1904A, 1904B, 1904N and the system 1906. In other aspects, at least a portion of signals 1910 may use direct connections between the memory circuits 1904A, 1904B, 1904N and the system 1906. Moreover, the number of interfaced signals 1908 (e.g. vs. a number of the signals that use direct connections 1910, etc.) may vary such that the interfaced signals 1908 may include at least a majority of the total number of signal connections between the memory circuits 1904A, 1904B, 1904N and the system 1906 (e.g. L>M, with L and M as shown in FIG. 19). In other embodiments, L may be less than or equal to M. In still other embodiments L and/or M may be zero.

In yet another embodiment, the interface circuit 1902 may or may not be operable to interface a first number of memory circuits 1904A, 1904B, 1904N and the system 1906 for simulating a second number of memory circuits to the system 1906. The first number of memory circuits 1904A, 1904B, 1904N shall hereafter be referred to, where appropriate for clarification purposes, as the "physical" memory circuits or memory circuits, but are not limited to be so. Just by way of example, the physical memory circuits may include a single physical memory circuit. Further, the at least one simulated memory circuit seen by the system 1906 shall hereafter be referred to, where appropriate for clarification purposes, as the at least one "virtual" memory circuit.

In still additional aspects of the present embodiment, the second number of virtual memory circuits may be more than, equal to, or less than the first number of physical memory circuits 1904A, 1904B, 1904N. Just by way of example, the second number of virtual memory circuits may include a single memory circuit. Of course, however, any number of memory circuits may be simulated.

In the context of the present description, the term simulated may refer to any simulating, emulating, disguising, transforming, modifying, changing, altering, shaping, converting, etc., that results in at least one aspect of the memory circuits 1904A, 1904B, 1904N appearing different to the system 1906. In different embodiments, such aspect may include, for example, a number, a signal, a memory capacity, a timing, a latency, a design parameter, a logical interface, a control system, a property, a behavior (e.g. power behavior including, but not limited to a power consumption, current consumption, current waveform, power parameters, power metrics, any other aspect of power management or behavior, etc.), and/or any other aspect, for that matter.

In different embodiments, the simulation may be electrical in nature, logical in nature, protocol in nature, and/or performed in any other desired manner. For instance, in the context of electrical simulation, a number of pins, wires, signals, etc. may be simulated. In the context of logical simulation, a particular function or behavior may be simulated. In the context of protocol, a particular protocol (e.g. DDR3, etc.) may be simulated. Further, in the context of protocol, the simulation may effect conversion between different protocols (e.g. DDR2 and DDR3) or may effect conversion between different versions of the same protocol (e.g. conversion of 4-4-4 DDR2 to 6-6-6 DDR2).

During use, in accordance with one optional power management embodiment, the interface circuit 1902 may or may not be operable to interface the memory circuits 1904A, 1904B, 1904N and the system 1906 for simulating at least one virtual memory circuit, where the virtual memory circuit includes at least one aspect that is different from at least one aspect of one or more of the physical memory circuits 1904A, 1904B, 1904N. Such aspect may, in one embodiment, include power behavior (e.g. a power consumption, current consumption, current waveform, any other aspect of power management or behavior, etc.). Specifically, in such embodiment, the interface circuit 1902 is operable to interface the physical memory circuits 1904A, 1904B, 1904N and the system 1906 for simulating at least one virtual memory circuit with a first power behavior that is different from a second power behavior of the physical memory circuits 1904A, 1904B, 1904N. Such power behavior simulation may effect or result in a reduction or other modification of average power consumption, reduction or other modification of peak power consumption or other measure of power consumption, reduction or other modification of peak current consumption or other measure of current consumption, and/or modification of other power behavior (e.g. parameters, metrics, etc.). In one embodiment, such power behavior simulation may be provided by the interface circuit 1902 performing various power management.

In another power management embodiment, the interface circuit 1902 may perform a power management operation in association with only a portion of the memory circuits. In the context of the present description, a portion of memory circuits may refer to any row, column, page, bank, rank, sub-row, sub-column, sub-page, sub-bank, sub-rank, any other subdivision thereof, and/or any other portion or portions of one or more memory circuits. Thus, in an embodiment where multiple memory circuits exist, such portion may even refer to an entire one or more memory circuits (which may be deemed a portion of such multiple memory circuits, etc.). Of course, again, the portion of memory circuits may refer to any portion or portions of one or more memory circuits. This applies to both physical and virtual memory circuits.

In various additional power management embodiments, the power management operation may be performed by the interface circuit 1902 during a latency associated with one or more commands directed to at least a portion of the plurality of memory circuits 1904A, 1904B, 1904N. In the context of the present description, such command(s) may refer to any control signal (e.g. one or more address signals; one or more data signals; a combination of one or more control signals; a sequence of one or more control signals; a signal associated with an activate (or active) operation, precharge operation, write operation, read operation, a mode register write operation, a mode register read operation, a refresh operation, or other encoded or direct operation, command or control signal; etc.). In one optional embodiment where the interface circuit 1902 is further operable for simulating at least one virtual memory circuit, such virtual memory circuit(s) may include a first latency that is different than a second latency associated with at least one of the plurality of memory circuits 1904A, 1904B, 1904N. In use, such first latency may be used to accommodate the power management operation.

Yet another embodiment is contemplated where the interface circuit 1902 performs the power management operation in association with at least a portion of the memory circuits, in an autonomous manner. Such autonomous performance refers to the ability of the interface circuit 1902 to perform the power management operation without necessarily requiring the receipt of an associated power management command from the system 1906.

In still additional embodiments, interface circuit 1902 may receive a first number of power management signals from the system 1906 and may communicate a second number of power management signals that is the same or different from the first number of power management signals to at least a portion of the memory circuits 1904A, 1904B, 1904N. In the context of the present description, such power management signals may refer to any signal associated with power management, examples of which will be set forth hereinafter during the description of other embodiments. In still another embodiment, the second number of power management signals may be utilized to perform power management of the portion(s) of memory circuits in a manner that is independent from each other and/or independent from the first number of power management signals received from the system 1906 (which may or may not also be utilized in a manner that is independent from each other). In even still yet another embodiment where the interface circuit 1902 is further operable for simulating at least one virtual memory circuit, a number of the aforementioned ranks (seen by the system 1906) may be less than the first number of power management signals.

In other power management embodiments, the interface circuit 1902 may be capable of a power management operation that takes the form of a power saving operation. In the context of the present description, the term power saving operation may refer to any operation that results in at least some power savings.

It should be noted that various power management operation embodiments, power management signal embodiments, simulation embodiments (and any other embodiments, for that matter) may or may not be used in conjunction with each other, as well as the various different embodiments that will hereinafter be described. To this end, more illustrative information will now be set forth regarding optional functionality/architecture of different embodiments which may or may not be implemented in the context of such interface circuit 1902 and the related components of FIG. 19, per the desires of the user. It should be strongly noted that the following information is set forth for illustrative purposes and should not be construed as limiting in any manner. For example, any of the following features may be optionally incorporated with or without the other features described.

Additional Power Management Embodiments

In one exemplary power management embodiment, the aforementioned simulation of a different power behavior may be achieved utilizing a power saving operation.

In one such embodiment, the power management, power behavior simulation, and thus the power saving operation may optionally include applying a power saving command to one or more memory circuits based on at least one state of one or more memory circuits. Such power saving command may include, for example, initiating a power down operation applied to one or more memory circuits. Further, such state may depend on identification of the current, past or predictable future status of one or more memory circuits, a predetermined combination of commands issued to the one or more memory circuits, a predetermined pattern of commands issued to the one or more memory circuits, a predetermined absence of commands issued to the one or more memory circuits, any command(s) issued to the one or more memory circuits, and/or any command(s) issued to one or more memory circuits other than the one or more memory circuits. In the context of the present description, such status may refer to any property of the memory circuit that may be monitored, stored, and/or predicted.

For example, at least one of a plurality of memory circuits may be identified that is not currently being accessed by the system. Such status identification may involve determining whether a portion(s) is being accessed in at least one of the plurality of memory circuits. Of course, any other technique may be used that results in the identification of at least one of the memory circuits (or portion(s) thereof) that is not being accessed, e.g. in a non-accessed state. In other embodiments, other such states may be detected or identified and used for power management.

In response to the identification of a memory circuit in a non-accessed state, a power saving operation may be initiated in association with the non-accessed memory circuit (or portion thereof). In one optional embodiment, such power saving operation may involve a power down operation (e.g. entry into a precharge power down mode, as opposed to an exit therefrom, etc.). As an option, such power saving operation may be initiated utilizing (e.g. in response to, etc.) a power management signal including, but not limited to a clock enable signal (CKE), chip select signal, in combination with other signals and optionally commands. In other embodiments, use of a non-power management signal (e.g. control signal, etc.) is similarly contemplated for initiating the power saving operation. Of course, however, it should be noted that anything that results in modification of the power behavior may be employed in the context of the present embodiment.

As mentioned earlier, the interface circuit may be operable to interface the memory circuits and the system for simulating at least one virtual memory circuit, where the virtual memory circuit includes at least one aspect that is different from at least one aspect of one or more of the physical memory circuits. In different embodiments, such aspect may include, for example, a signal, a memory capacity, a timing, a logical interface, etc. As an option, one or more of such aspects may be simulated for supporting a power management operation.

For example, the simulated timing, as described above, may include a simulated latency (e.g. time delay, etc.). In particular, such simulated latency may include a column address strobe (CAS) latency (e.g. a latency associated with accessing a column of data). Still yet, the simulated latency may include a row address to column address latency (tRCD). Thus, the latency may be that between the row address strobe (RAS) and CAS.

In addition, the simulated latency may include a row precharge latency (tRP). The tRP may include the latency to terminate access to an open row. Further, the simulated latency may include an activate to precharge latency (tRAS). The tRAS may include the latency between an activate operation and a precharge operation. Furthermore, the simulated latency may include a row cycle time (tRC). The tRC may include the latency between consecutive activate operations to the same bank of a DRAM circuit. In some embodiments, the simulated latency may include a read latency, write latency, or latency associated with any other operation(s), command(s), or combination or sequence of operations or commands. In other embodiments, the simulated latency may include simulation of any latency parameter that corresponds to the time between two events.

For example, in one exemplary embodiment using simulated latency, a first interface circuit may delay address and control signals for certain operations or commands by a clock cycles. In various embodiments where the first interface circuit is operating as a register or may include a register, a may not necessarily include the register delay (which is typically a one clock cycle delay through a JEDEC register). Also in the present exemplary embodiment, a second interface circuit may delay data signals by d clock cycles. It should be noted that the first and second interface circuits may be the same or different circuits or components in various embodiments. Further, the delays a and d may or may not be different for different memory circuits. In other embodiments, the delays a and d may apply to address and/or control and/or data signals. In alternative embodiments, the delays a and d may not be integer or even constant multiples of the clock cycle and may be less than one clock cycle or zero.

The cumulative delay through the interface circuits (e.g. the sum of the first delay a of the address and control signals through the first interface circuit and the second delay d of the data signals through the second interface circuit) may be j clock cycles (e.g. j=a+d). Thus, in a DRAM-specific embodiment, in order to make the delays a and d transparent to the memory controller, the interface circuits may make the stack of DRAM circuits appear to a memory controller (or any other component, system, or part(s) of a system) as one (or more) larger capacity virtual DRAM circuits with a read latency of i+j clocks, where i is the inherent read latency of the physical DRAM circuits.

To this end, the interface circuits may be operable for simulating at least one virtual memory circuit with a first latency that may be different (e.g. equal, longer, shorter, etc.) than a second latency of at least one of the physical memory circuits. The interface circuits may thus have the ability to simulate virtual DRAM circuits with a possibly different (e.g. increased, decreased, equal, etc.) read or other latency to the system, thus making transparent the delay of some or all of the address, control, clock, enable, and data signals through the interface circuits. This simulated aspect, in turn, may be used to accommodate power management of the DRAM circuits. More information regarding such use will be set forth hereinafter in greater detail during reference to different embodiments outlined in subsequent figures.

In still another embodiment, the interface circuit may be operable to receive a signal from the system and communicate the signal to at least one of the memory circuits after a delay. The signal may refer to one of more of a control signal, a data signal, a clock signal, an enable signal, a reset signal, a logical or physical signal, a combination or pattern of such signals, or a sequence of such signals, and/or any other signal for that matter. In various embodiments, such delay may be fixed or variable (e.g. a function of a current signal, and/or a previous signal, and/or a signal that will be communicated, after a delay, at a future time, etc.). In still other embodiments, the interface circuit may be operable to receive one or more signals from at least one of the memory circuits and communicate the signal(s) to the system after a delay.

As an option, the signal delay may include a cumulative delay associated with one or more of the aforementioned signals. Even still, the signal delay may result in a time shift of the signal (e.g. forward and/or back in time) with respect to other signals. Of course, such forward and backward time shift may or may not be equal in magnitude.

In one embodiment, the time shifting may be accomplished utilizing a plurality of delay functions which each apply a different delay to a different signal. In still additional embodiments, the aforementioned time shifting may be coordinated among multiple signals such that different signals are subject to shifts with different relative directions/magnitudes. For example, such time shifting may be performed in an organized manner. Yet again, more information regarding such use of delay in the context of power management will be set forth hereinafter in greater detail during reference to subsequent figures.

Embodiments with Varying Physical Stack Arrangements

FIGS. 20A-E show a stack of DRAM circuits 2000 that utilize one or more interface circuits, in accordance with various embodiments. As an option, the stack of DRAM circuits 2000 may be implemented in the context of the architecture of FIG. 19. Of course, however, the stack of DRAM circuits 2000 may be implemented in any other desired environment (e.g. using other memory types, using different memory types within a stack, etc.). It should also be noted that the aforementioned definitions may apply during the present description.

As shown in FIGS. 20A-E, one or more interface circuits 2002 may be placed electrically between an electronic system 2004 and a stack of DRAM circuits 2006A-D. Thus the interface circuits 2002 electrically sit between the electronic system 2004 and the stack of DRAM circuits 2006A-D. In the context of the present description, the interface circuit(s) 2002 may include any interface circuit that meets the definition set forth during reference to FIG. 19.

In the present embodiment, the interface circuit(s) 2002 may be capable of interfacing (e.g. buffering, etc.) the stack of DRAM circuits 2006A-D to electrically and/or logically resemble at least one larger capacity virtual DRAM circuit to the system 2004. Thus, a stack or buffered stack may be utilized. In this way, the stack of DRAM circuits 2006A-D may appear as a smaller quantity of larger capacity virtual DRAM circuits to the system 2004.

Just by way of example, the stack of DRAM circuits 2006A-D may include eight 512 Mb DRAM circuits. Thus, the interface circuit(s) 2002 may buffer the stack of eight 512 Mb DRAM circuits to resemble a single 4 Gb virtual DRAM circuit to a memory controller (not shown) of the associated system 2004. In another example, the interface circuit(s) 2002 may buffer the stack of eight 512 Mb DRAM circuits to resemble two 2 Gb virtual DRAM circuits to a memory controller of an associated system 2004.

Furthermore, the stack of DRAM circuits 2006A-D may include any number of DRAM circuits. Just by way of example, the interface circuit(s) 2002 may be connected to 1, 2, 4, 8 or more DRAM circuits 2006A-D. In alternate embodiments, to permit data integrity storage or for other reasons, the interface circuit(s) 2002 may be connected to an odd number of DRAM circuits 2006A-D. Additionally, the DRAM circuits 2006A-D may be arranged in a single stack. Of course, however, the DRAM circuits 2006A-D may also be arranged in a plurality of stacks The DRAM circuits 2006A-D may be arranged on, located on, or connected to a single side of the interface circuit(s) 2002, as shown in FIGS. 20A-D. As another option, the DRAM circuits 2006A-D may be arranged on, located on, or connected to both sides of the interface circuit(s) 2002 shown in FIG. 20E. Just by way of example, the interface circuit(s) 2002 may be connected to 16 DRAM circuits with 8 DRAM circuits on either side of the interface circuit(s) 2002, where the 8 DRAM circuits on each side of the interface circuit(s) 2002 are arranged in two stacks of four DRAM circuits. In other embodiments, other arrangements and numbers of DRAM circuits are possible (e.g. to implement error-correction coding, ECC, etc.)

The interface circuit(s) 2002 may optionally be a part of the stack of DRAM circuits 2006A-D. Of course, however, interface circuit(s) 2002 may also be separate from the stack of DRAM circuits 2006A-D. In addition, interface circuit(s) 2002 may be physically located anywhere in the stack of DRAM circuits 2006A-D, where such interface circuit(s) 2002 electrically sits between the electronic system 2004 and the stack of DRAM circuits 2006A-D.

Figure 20A:
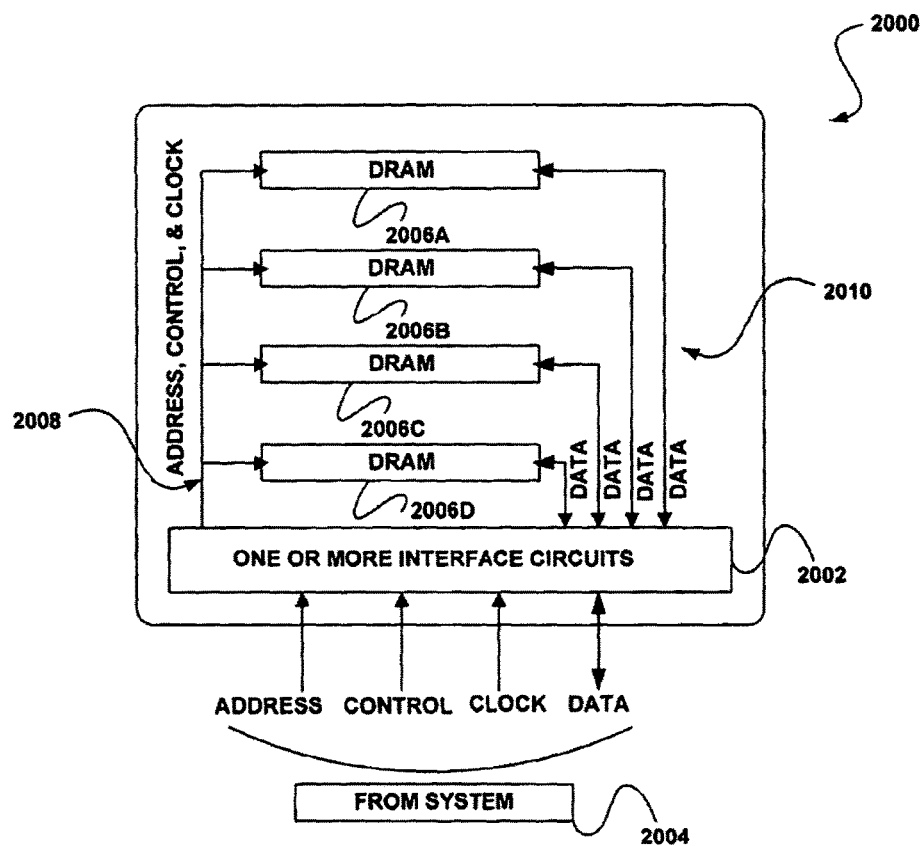
FIGS. 20A-E show a stack of dynamic random access memory (DRAM) circuits that utilize one or more interface circuits, in accordance with various embodiments.

In one embodiment, the interface circuit(s) 2002 may be located at the bottom of the stack of DRAM circuits 2006A-D (e.g. the bottom-most circuit in the stack) as shown in FIGS. 20A-2D. As another option, and as shown in FIG. 200E, the interface circuit(s) 2002 may be located in the middle of the stack of DRAM circuits 2006A-D. As still yet another option, the interface circuit(s) 2002 may be located at the top of the stack of DRAM circuits 2006A-D (e.g. the top-most circuit in the stack). Of course, however, the interface circuit(s) 2002 may also be located anywhere between the two extremities of the stack of DRAM circuits 2006A-D. In alternate embodiments, the interface circuit(s) 2002 may not be in the stack of DRAM circuits 2006A-D and may be located in a separate package(s).

The electrical connections between the interface circuit(s) 2002 and the stack of DRAM circuits 2006A-D may be configured in any desired manner. In one optional embodiment, address, control (e.g. command, etc.), and clock signals may be common to all DRAM circuits 2006A-D in the stack (e.g. using one common bus). As another option, there may be multiple address, control and clock busses.

As yet another option, there may be individual address, control and clock busses to each DRAM circuit 2006A-D. Similarly, data signals may be wired as one common bus, several busses, or as an individual bus to each DRAM circuit 2006A-D. Of course, it should be noted that any combinations of such configurations may also be utilized.

Figure 20B:
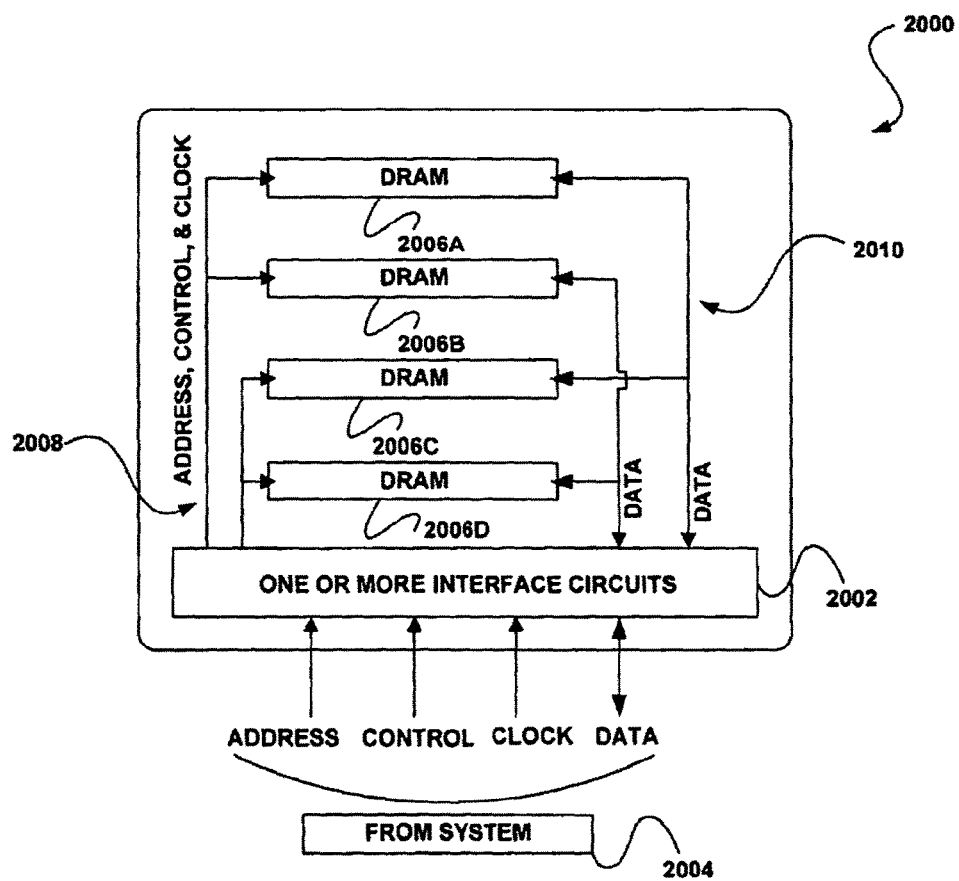
Figure 20C:
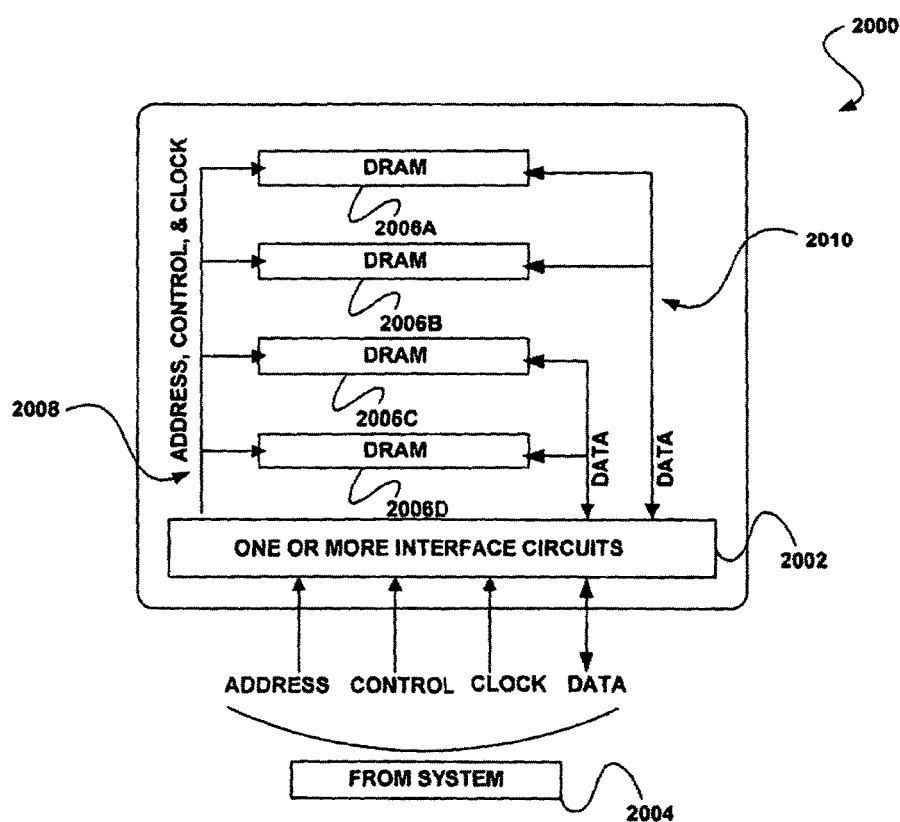
Figure 20D:
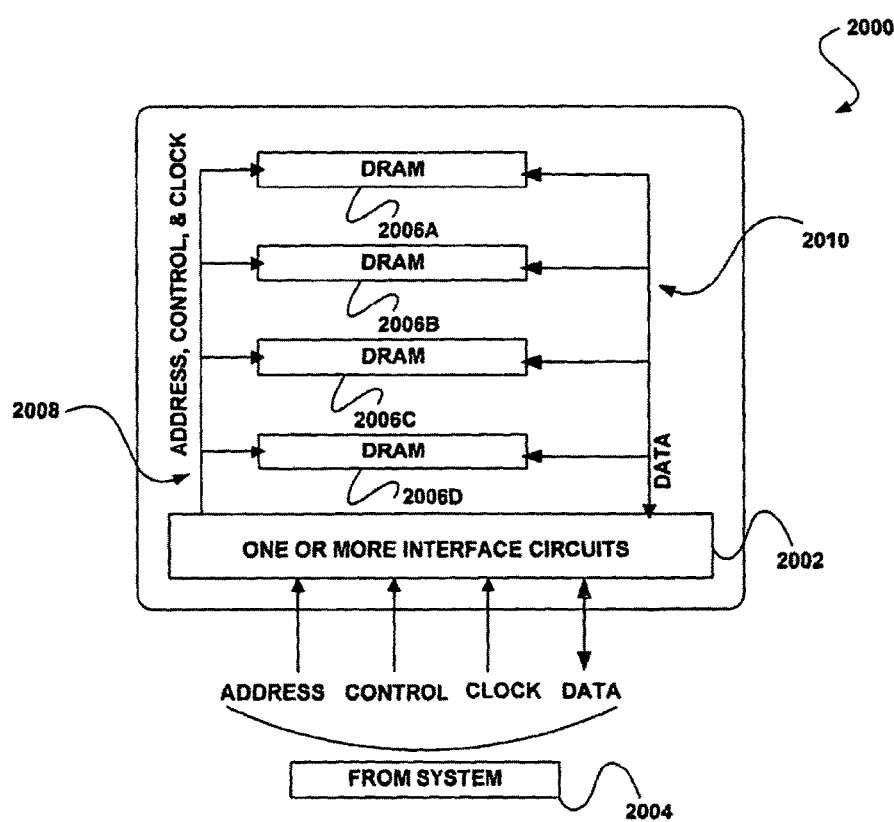
Figure 20E:
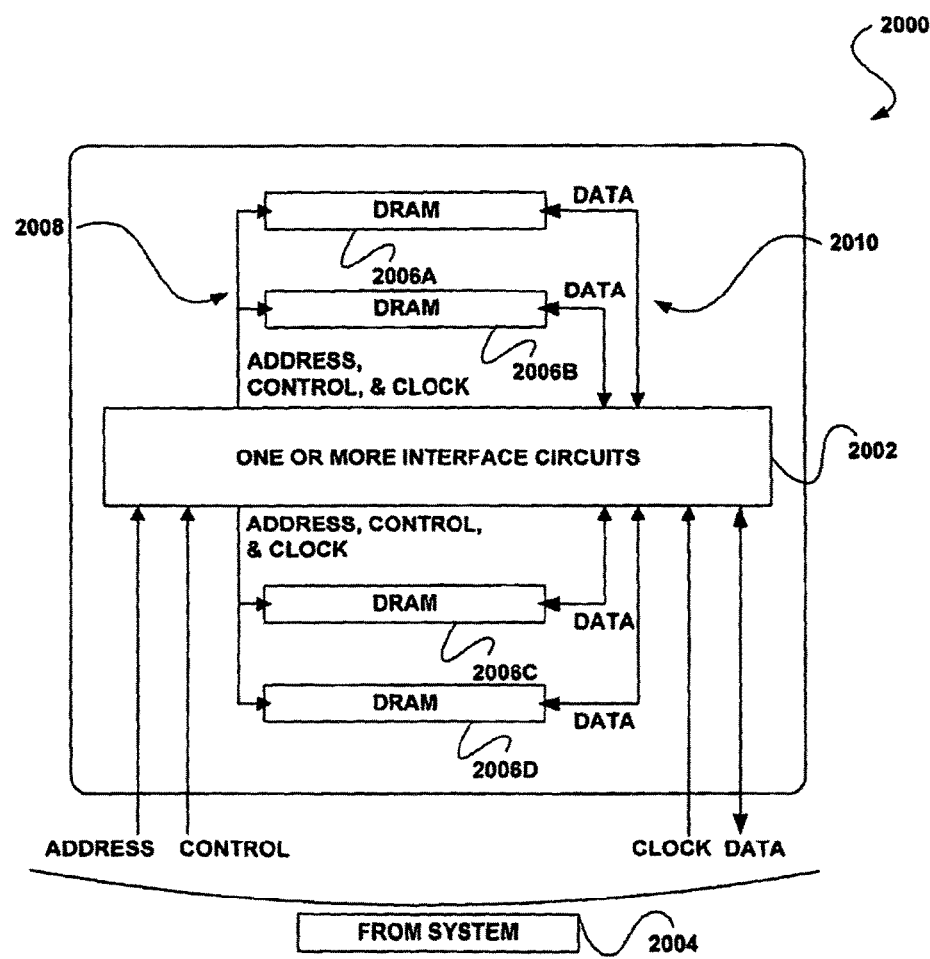

For example, as shown in FIG. 20A, the DRAM circuits 2006A-D may have one common address, control and clock bus 2008 with individual data busses 2010. In another example, as shown in FIG. 20B, the DRAM circuits 2006A-D may have two address, control and clock busses 2008 along with two data busses 2010. In still yet another example, as shown in FIG. 20C, the DRAM circuits 2006A-D may have one address, control and clock bus 2008 together with two data busses 2010. In addition, as shown in FIG. 20D, the DRAM circuits 2006A-D may have one common address, control and clock bus 2008 and one common data bus 2010. It should be noted that any other permutations and combinations of such address, control, clock and data buses may be utilized.

In one embodiment, the interface circuit(s) 2002 may be split into several chips that, in combination, perform power management functions. Such power management functions may optionally introduce a delay in various signals.

For example, there may be a single register chip that electrically sits between a memory controller and a number of stacks of DRAM circuits. The register chip may, for example, perform the signaling to the DRAM circuits. Such register chip may be connected electrically to a number of other interface circuits that sit electrically between the register chip and the stacks of DRAM circuits. Such interface circuits in the stacks of DRAM circuits may then perform the aforementioned delay, as needed.

In another embodiment, there may be no need for an interface circuit in each DRAM stack. In particular, the register chip may perform the signaling to the DRAM circuits directly. In yet another embodiment, there may be no need for a stack of DRAM circuits. Thus each stack may be a single memory (e.g. DRAM) circuit. In other implementations, combinations of the above implementations may be used. Just by way of example, register chips may be used in combination with other interface circuits, or registers may be utilized alone.

More information regarding the verification that a simulated DRAM circuit including any address, data, control and clock configurations behaves according to a desired DRAM standard or other design specification will be set forth hereinafter in greater detail.

Additional Embodiments with Different Physical Memory Module Arrangements

FIGS. 21A-D show a memory module 2100 which uses DRAM circuits or stacks of DRAM circuits (e.g. DRAM stacks) with various interface circuits, in accordance with different embodiments. As an option, the memory module 2100 may be implemented in the context of the architecture and environment of FIGS. 19 and/or 20. Of course, however, the memory module 2100 may be implemented in any desired environment. It should also be noted that the aforementioned definitions may apply during the present description.

Figure 21A:
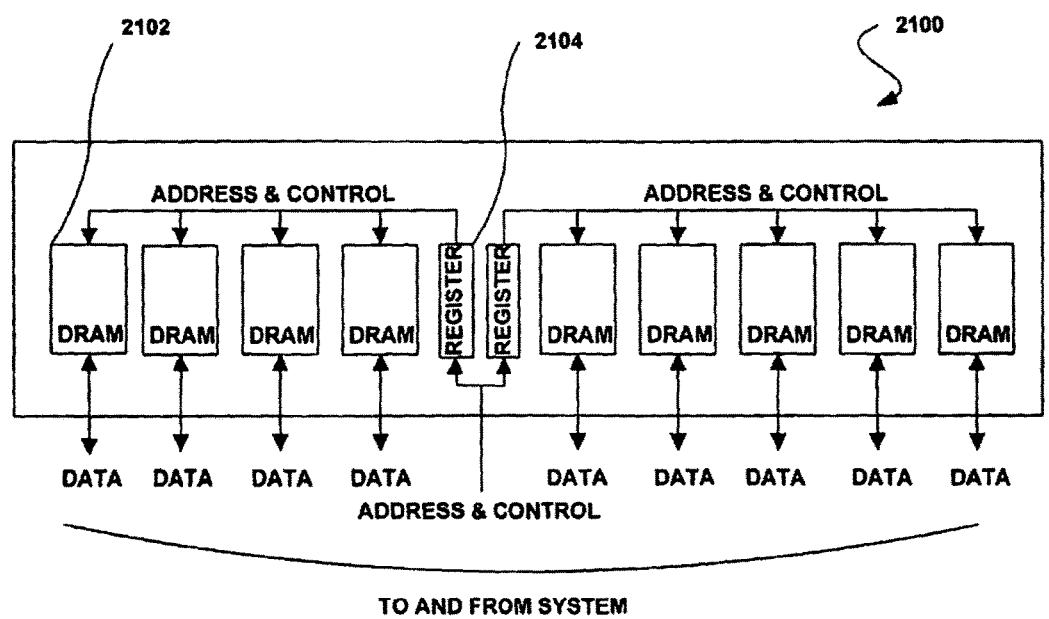
FIGS. 21A-D show a memory module which uses dynamic random access memory (DRAM) circuits with various interface circuits, in accordance with different embodiments.

FIG. 21A shows two register chips 2104 driving address and control signals to DRAM circuits 2102. The DRAM circuits 2102 may send/receive data signals to and/or from a system (e.g. memory controller) using the DRAM data bus, as shown.

Figure 21B:
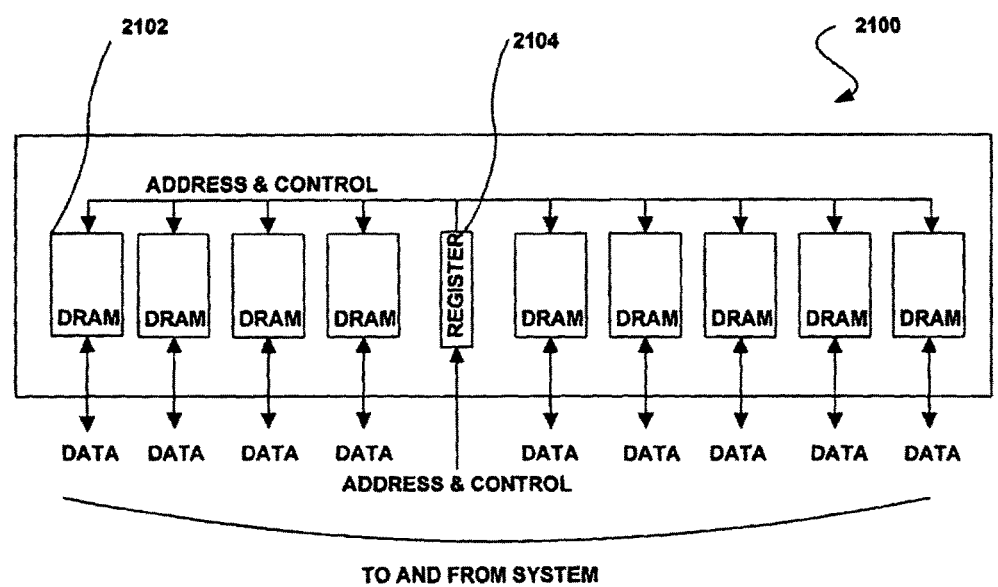

FIG. 21B shows one register chip 2104 driving address and control signals to DRAM circuits 2102. Thus, one, two, three, or more register chips 2104 may be utilized, in various embodiments.

Figure 21C:
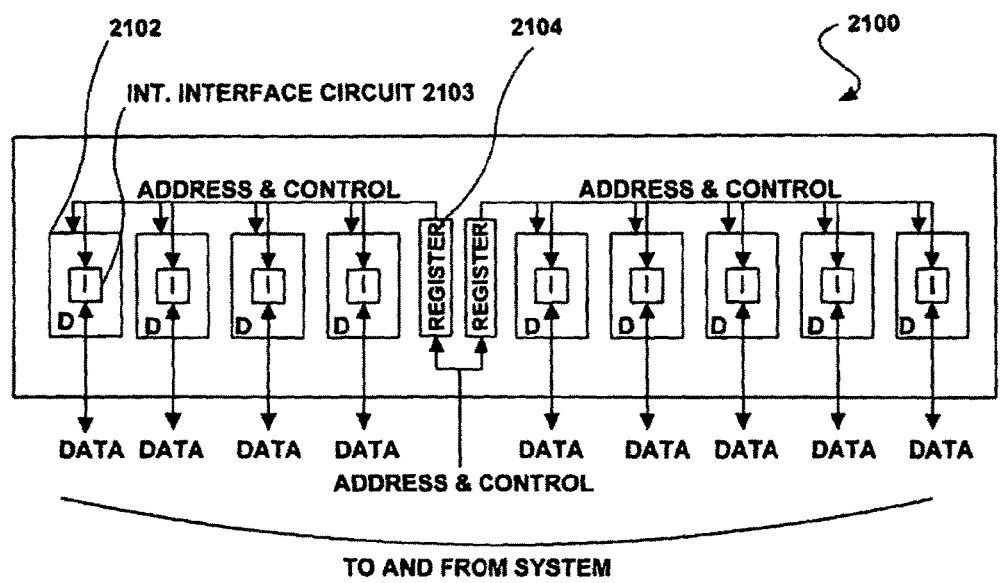

FIG. 21C shows register chips 2104 driving address and control signals to DRAM circuits 2102 and/or intelligent interface circuits 2103. In addition, the DRAM data bus is connected to the intelligent interface circuits 2103 (not shown explicitly). Of course, as described herein, and illustrated in FIGS. 21A and 21B, one, two, three or more register chips 2104 may be used. Furthermore, this FIG. illustrates that the register chip(s) 2104 may drive some, all, or none of the control and/or address signals to intelligent interface circuits 2103.

Figure 21D:
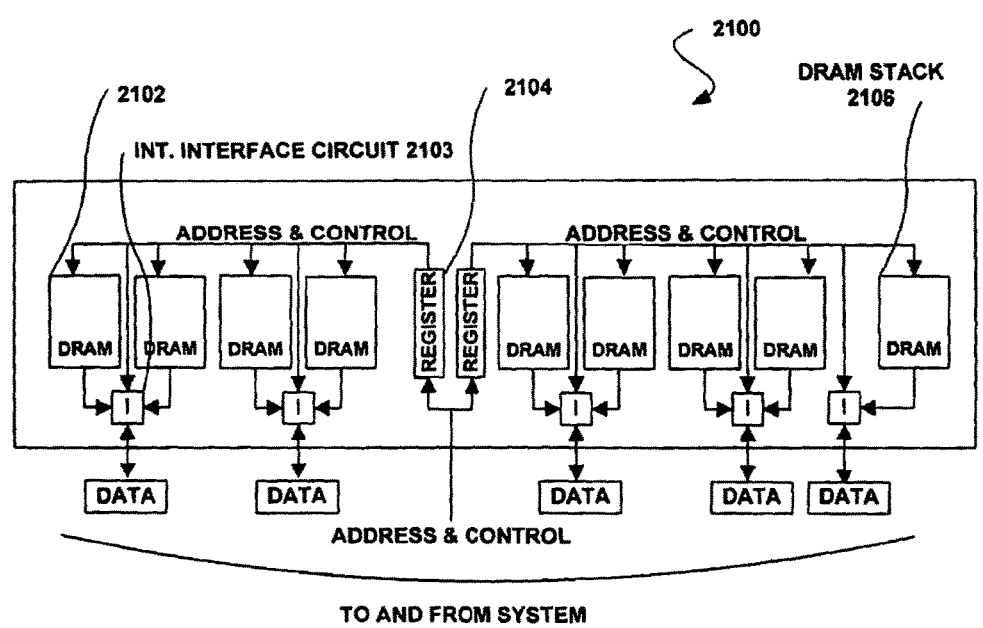

FIG. 21D shows register chips 2104 driving address and control signals to the DRAM circuits 2102 and/or intelligent interface circuits 2103. Furthermore, this FIG. illustrates that the register chip(s) 2104 may drive some, all, or none of the control and/or address signals to intelligent interface circuits 2103. Again, the DRAM data bus is connected to the intelligent interface circuits 2103. Additionally, this FIG. illustrates that either one (in the case of DRAM stack 2106) or two (in the case of the other DRAM stacks 2102) stacks of DRAM circuits 2102 may be associated with a single intelligent interface circuit 2103.

Of course, however, any number of stacks of DRAM circuits 2102 may be associated with each intelligent interface circuit 2103. As another option, an AMB chip may be utilized with an FB-DIMM, as will be described in more detail with respect to FIGS. 22A-E.

FIGS. 22A-E show a memory module 2200 which uses DRAM circuits or stacks of DRAM circuits (e.g. DRAM stacks) 2202 with an AMB chip 2204, in accordance with various embodiments. As an option, the memory module 2200 may be implemented in the context of the architecture and environment of FIGS. 19-21. Of course, however, the memory module 2200 may be implemented in any desired environment. It should also be noted that the aforementioned definitions may apply during the present description.

Figure 22A:
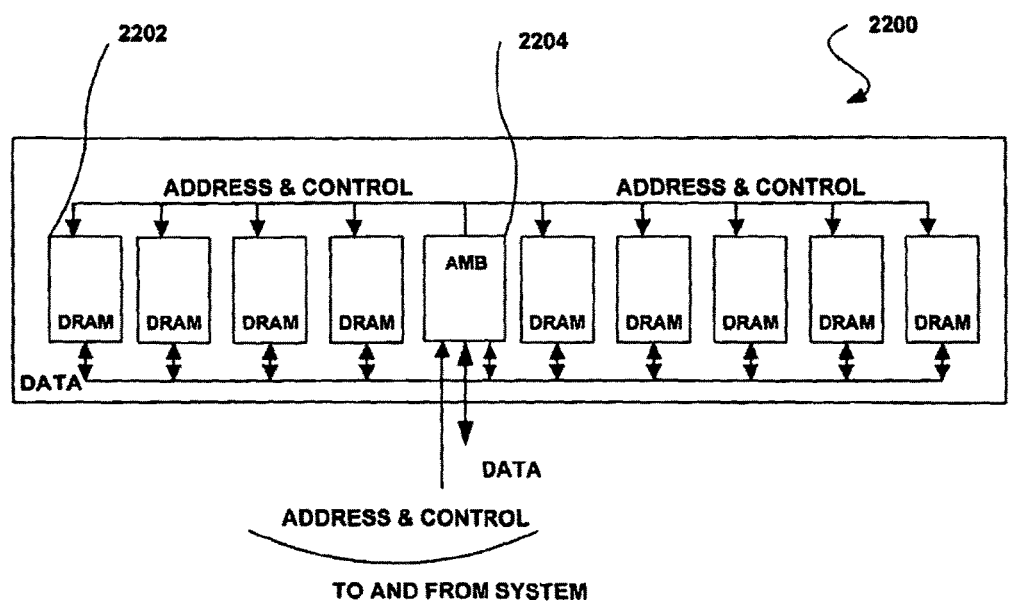
FIGS. 22A-E show a memory module which uses DRAM circuits with an advanced memory buffer (AMB) chip and various other interface circuits, in accordance with various embodiments.

FIG. 22A shows the AMB chip 2204 driving address and control signals to the DRAM circuits 2202. In addition, the AMB chip 2204 sends/receives data to/from the DRAM circuits 2202.

Figure 22B:
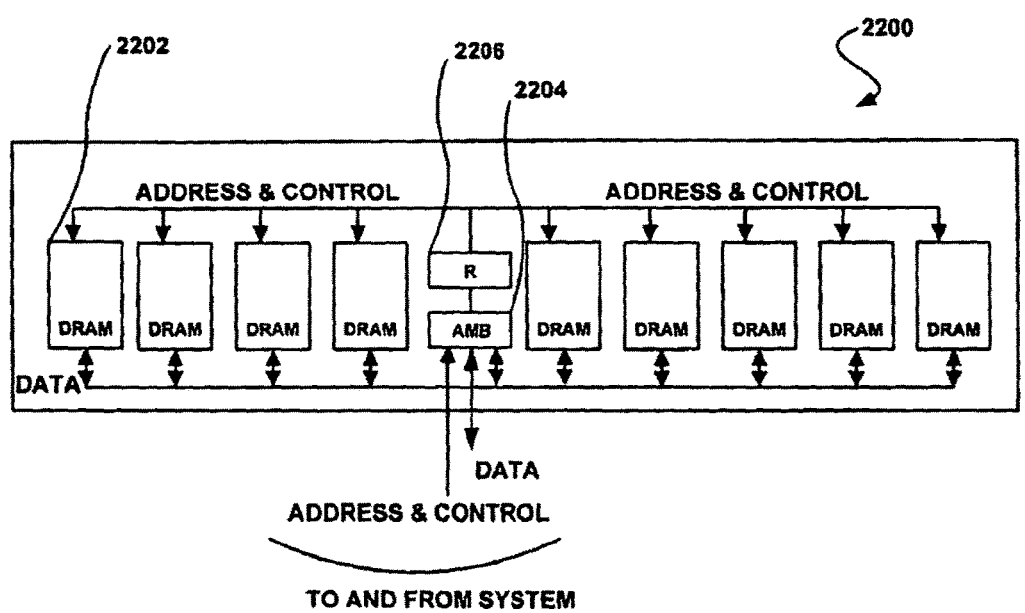

FIG. 22B shows the AMB chip 2204 driving address and control signals to a register 2206. In turn, the register 2206 may drive address and control signals to the DRAM circuits 2202. The DRAM circuits send/receive data to/from the AMB. Moreover, a DRAM data bus may be connected to the AMB chip 2204.

Figure 22C:
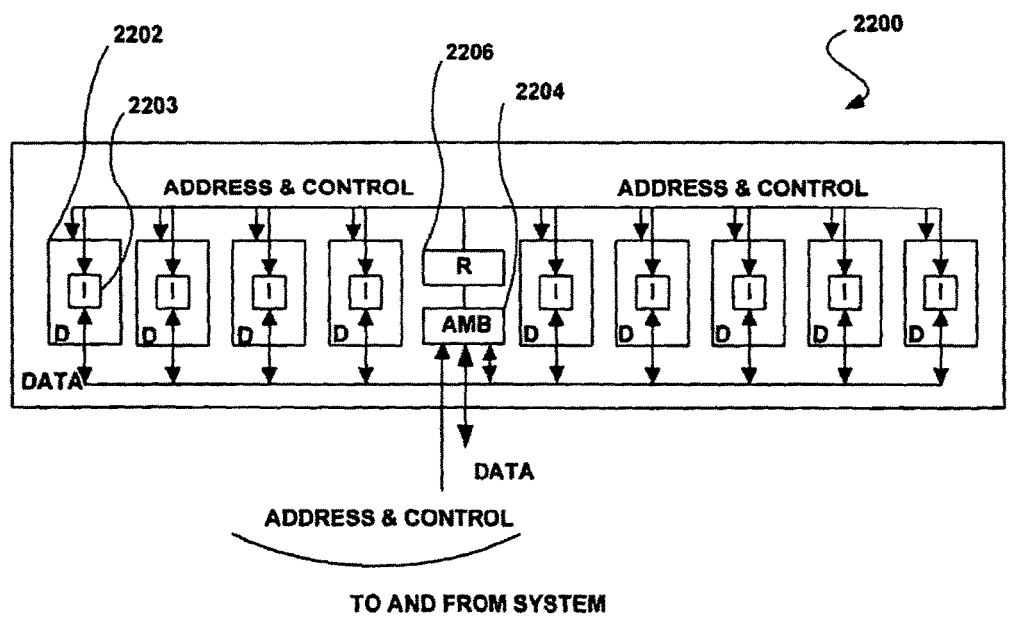

FIG. 22C shows the AMB chip 2204 driving address and control to the register 2206. In turn, the register 2206 may drive address and control signals to the DRAM circuits 2202 and/or the intelligent interface circuits 2203. This FIG. illustrates that the register 2206 may drive zero, one, or more address and/or control signals to one or more intelligent interface circuits 2203. Further, each DRAM data bus is connected to the interface circuit 2203 (not shown explicitly). The intelligent interface circuit data bus is connected to the AMB chip 2204. The AMB data bus is connected to the system.

Figure 22D:
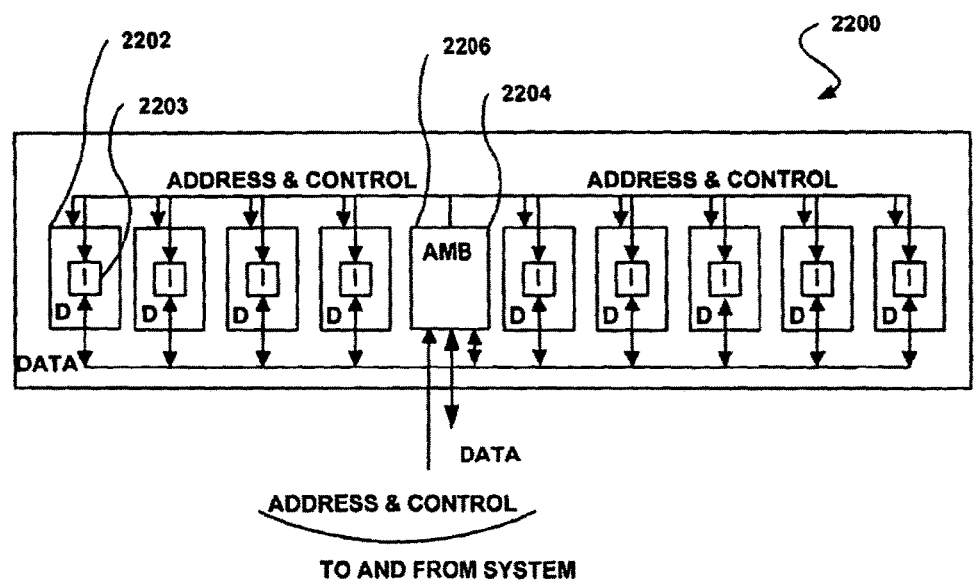

FIG. 22D shows the AMB chip 2204 driving address and/or control signals to the DRAM circuits 2202 and/or the intelligent interface circuits 2203. This FIG. illustrates that the AMB chip 2204 may drive zero, one, or more address and/or control signals to one or more intelligent interface circuits 2203. Moreover, each DRAM data bus is connected to the intelligent interface circuits 2203 (not shown explicitly). The intelligent interface circuit data bus is connected to the AMB chip 2204. The AMB data bus is connected to the system.

Figure 22E:
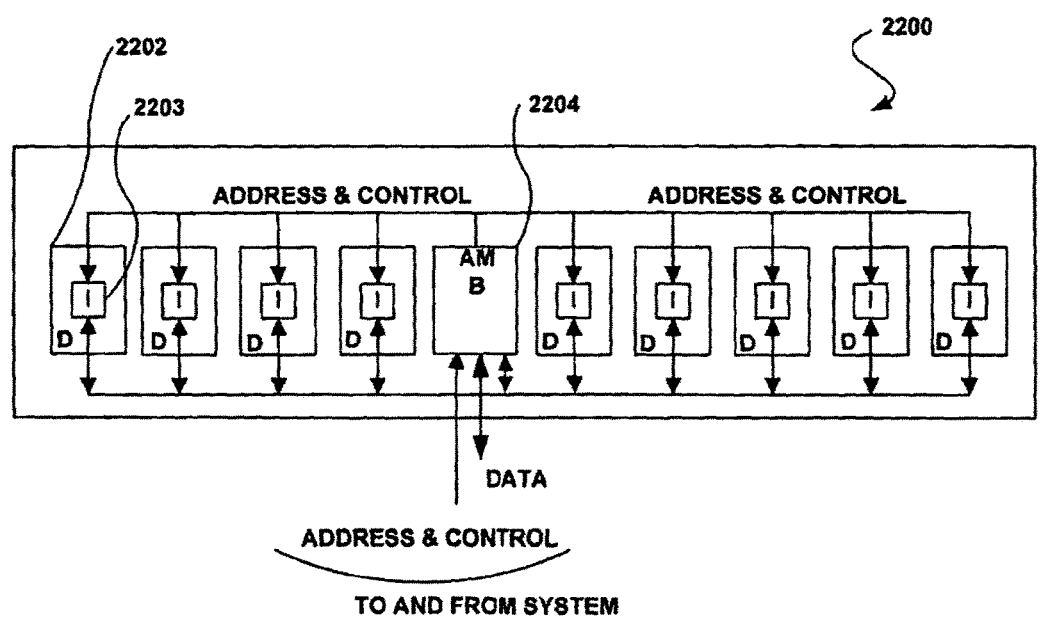

FIG. 22E shows the AMB chip 2204 driving address and control to one or more intelligent interface circuits 2203. The intelligent interface circuits 2203 then drive address and control to each DRAM circuit 2202 (not shown explicitly). Moreover, each DRAM data bus is connected to the intelligent interface circuits 2203 (also not shown explicitly). The intelligent interface circuit data bus is connected to the AMB chip 2204. The AMB data bus is connected to the system.

In other embodiments, combinations of the above implementations as shown in FIGS. 22A-E may be utilized. Just by way of example, one or more register chips may be utilized in conjunction with the intelligent interface circuits. In other embodiments, register chips may be utilized alone and/or with or without stacks of DRAM circuits.

Figure 23:
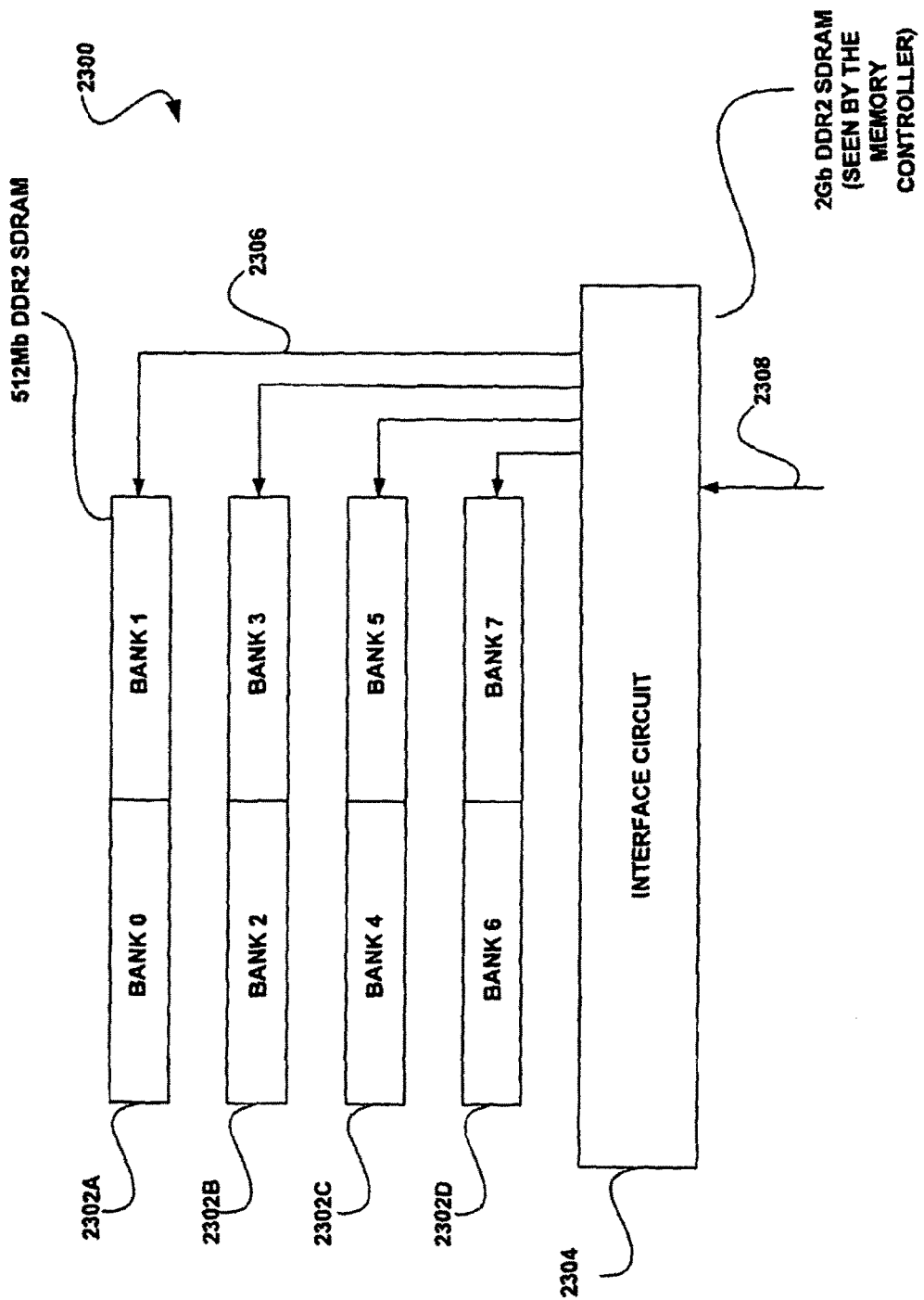
FIG. 23 shows a system in which four 512 Mb DRAM circuits are mapped to a single 2 Gb DRAM circuit, in accordance with yet another embodiment.

FIG. 23 shows a system 2300 in which four 512 Mb DRAM circuits appear, through simulation, as (e.g. mapped to) a single 2 Gb virtual DRAM circuit, in accordance with yet another embodiment. As an option, the system 2300 may be implemented in the context of the architecture and environment of FIGS. 19-22. Of course, however, the system 2300 may be implemented in any desired environment. It should also be noted that the aforementioned definitions may apply during the present description.

As shown in FIG. 23, a stack of memory circuits that is interfaced by the interface circuit for the purpose of simulation (e.g. a buffered stack) may include four 512 Mb physical DRAM circuits 2302A-D that appear to a memory controller as a single 2 Gb virtual DRAM circuit. In different embodiments, the buffered stack may include various numbers of physical DRAM circuits including two, four, eight, sixteen or even more physical DRAM circuits that appear to the memory controller as a single larger capacity virtual DRAM circuit or multiple larger capacity virtual DRAM circuits. In addition, the number of physical DRAM circuits in the buffered stack may be an odd number. For example, an odd number of circuits may be used to provide data redundancy or data checking or other features.

Also, one or more control signals (e.g. power management signals) 2306 may be connected between the interface circuit 2304 and the DRAM circuits 2302A-D in the stack. The interface circuit 2304 may be connected to a control signal (e.g. power management signal) 2308 from the system, where the system uses the control signal 2308 to control one aspect (e.g. power behavior) of the 2 Gb virtual DRAM circuit in the stack. The interface circuit 2304 may control the one aspect (e.g. power behavior) of all the DRAM circuits 2302A-D in response to a control signal 2308 from the system to the 2 Gb virtual DRAM circuit. The interface circuit 2304 may also, using control signals 2306, control the one aspect (e.g. power behavior) of one or more of the DRAM circuits 2302A-D in the stack in the absence of a control signal 2308 from the system to the 2 Gb virtual DRAM circuit.

The buffered stacks 2300 may also be used in combination together on a DIMM such that the DIMM appears to the memory controller as a larger capacity DIMM. The buffered stacks may be arranged in one or more ranks on the DIMM. All the virtual DRAM circuits on the DIMM that respond in parallel to a control signal 2308 (e.g. chip select signal, clock enable signal, etc.) from the memory controller belong to a single rank. However, the interface circuit 2304 may use a plurality of control signals 2306 instead of control signal 2308 to control DRAM circuits 2302A-D. The interface circuit 2304 may use all the control signals 2306 in parallel in response to the control signal 2308 to do power management of the DRAM circuits 2302A-D in one example. In another example, the interface circuit 2304 may use at least one but not all the control signals 2306 in response to the control signal 2308 to do power management of the DRAM circuits 2302A-D. In yet another example, the interface circuit 2304 may use at least one control signal 2306 in the absence of the control signal 2308 to do power management of the DRAM circuits 2302A-D.

More information regarding the verification that a memory module including DRAM circuits with various interface circuits behave according to a desired DRAM standard or other design specification will be set forth hereinafter in greater detail.

DRAM Bank Configuration Embodiments

The number of banks per DRAM circuit may be defined by JEDEC standards for many DRAM circuit technologies. In various embodiments, there may be different configurations that use different mappings between the physical DRAM circuits in a stack and the banks in each virtual DRAM circuit seen by the memory controller. In each configuration, multiple physical DRAM circuits 2302A-D may be stacked and interfaced by an interface circuit 2304 and may appear as at least one larger capacity virtual DRAM circuit to the memory controller. Just by way of example, the stack may include four 512 Mb DDR2 physical SDRAM circuits that appear to the memory controller as a single 2 Gb virtual DDR2 SDRAM circuit.

In one optional embodiment, each bank of a virtual DRAM circuit seen by the memory controller may correspond to a portion of a physical DRAM circuit. That is, each physical DRAM circuit may be mapped to multiple banks of a virtual DRAM circuit. For example, in one embodiment, four 512 Mb DDR2 physical SDRAM circuits through simulation may appear to the memory controller as a single 2 Gb virtual DDR2 SDRAM circuit. A 2 Gb DDR2 SDRAM may have eight banks as specified by the JEDEC standards. Therefore, in this embodiment, the interface circuit 2304 may map each 512 Mb physical DRAM circuit to two banks of the 2 Gb virtual DRAM. Thus, in the context of the present embodiment, a one-circuit-to-many-bank configuration (one physical DRAM circuit to many banks of a virtual DRAM circuit) may be utilized.

In another embodiment, each physical DRAM circuit may be mapped to a single bank of a virtual DRAM circuit. For example, eight 512 Mb DDR2 physical SDRAM circuits may appear to the memory controller, through simulation, as a single 4 Gb virtual DDR2 SDRAM circuit. A 4 Gb DDR2 SDRAM may have eight banks as specified by the JEDEC standards. Therefore, the interface circuit 2304 may map each 512 Mb physical DRAM circuit to a single bank of the 4 Gb virtual DRAM. In this way, a one-circuit-to-one-bank configuration (one physical DRAM circuit to one bank of a virtual DRAM circuit) may be utilized.

In yet another embodiment, a plurality of physical DRAM circuits may be mapped to a single bank of a virtual DRAM circuit. For example, sixteen 256 Mb DDR2 physical SDRAM circuits may appear to the memory controller, through simulation, as a single 4 Gb virtual DDR2 SDRAM circuit. A 4 Gb DDR2 SDRAM circuit may be specified by JEDEC to have eight banks, such that each bank of the 4 Gb DDR2 SDRAM circuit may be 512 Mb. Thus, two of the 256 Mb DDR2 physical SDRAM circuits may be mapped by the interface circuit 2304 to a single bank of the 4 Gb virtual DDR2 SDRAM circuit seen by the memory controller. Accordingly, a many-circuit-to-one-bank configuration (many physical DRAM circuits to one bank of a virtual DRAM circuit) may be utilized.

Thus, in the above described embodiments, multiple physical DRAM circuits 2302A-D in the stack may be buffered by the interface circuit 2304 and may appear as at least one larger capacity virtual DRAM circuit to the memory controller. Just by way of example, the buffered stack may include four 512 Mb DDR2 physical SDRAM circuits that appear to the memory controller as a single 2 Gb DDR2 virtual SDRAM circuit. In normal operation, the combined power dissipation of all four DRAM circuits 2302A-D in the stack when they are active may be higher than the power dissipation of a monolithic (e.g. constructed without stacks) 2 Gb DDR2 SDRAM.

In general, the power dissipation of a DIMM constructed from buffered stacks may be much higher than a DIMM constructed without buffered stacks. Thus, for example, a DIMM containing multiple buffered stacks may dissipate much more power than a standard DIMM built using monolithic DRAM circuits. However, power management may be utilized to reduce the power dissipation of DIMMs that contain buffered stacks of DRAM circuits. Although the examples described herein focus on power management of buffered stacks of DRAM circuits, techniques and methods described apply equally well to DIMMs that are constructed without stacking the DRAM circuits (e.g. a stack of one DRAM circuit) as well as stacks that may not require buffering.

Embodiments Involving Dram Power Management Latencies

In various embodiments, power management schemes may be utilized for one-circuit-to-many-bank, one-circuit-to-one-bank, and many-circuit-to-one-bank configurations. Memory (e.g. DRAM) circuits may provide external control inputs for power management. In DDR2 SDRAM, for example, power management may be initiated using the CKE and chip select (CS#) inputs and optionally in combination with a command to place the DDR2 SDRAM in various power down modes.

Four power saving modes for DDR2 SDRAM may be utilized, in accordance with various different embodiments (or even in combination, in other embodiments). In particular, two active power down modes, precharge power down mode, and self-refresh mode may be utilized. If CKE is de-asserted while CS# is asserted, the DDR2 SDRAM may enter an active or precharge power down mode. If CKE is de-asserted while CS# is asserted in combination with the refresh command, the DDR2 SDRAM may enter the self refresh mode.

If power down occurs when there are no rows active in any bank, the DDR2 SDRAM may enter precharge power down mode. If power down occurs when there is a row active in any bank, the DDR2 SDRAM may enter one of the two active power down modes. The two active power down modes may include fast exit active power down mode or slow exit active power down mode.

The selection of fast exit mode or slow exit mode may be determined by the configuration of a mode register. The maximum duration for either the active power down mode or the precharge power down mode may be limited by the refresh requirements of the DDR2 SDRAM and may further be equal to tRFC(MAX).

DDR2 SDRAMs may require CKE to remain stable for a minimum time of tCKE(MIN). DDR2 SDRAMs may also require a minimum time of tXP(MIN) between exiting precharge power down mode or active power down mode and a subsequent non-read command. Furthermore, DDR2 SDRAMs may also require a minimum time of tXARD (MIN) between exiting active power down mode (e.g. fast exit) and a subsequent read command. Similarly, DDR2 SDRAMs may require a minimum time of tXARDS(MIN)

between exiting active power down mode (e.g. slow exit) and a subsequent read command.

Just by way of example, power management for a DDR2 SDRAM may require that the SDRAM remain in a power down mode for a minimum of three clock cycles [e.g. tCKE(MIN)=3 clocks]. Thus, the SDRAM may require a power down entry latency of three clock cycles.

Also as an example, a DDR2 SDRAM may also require a minimum of two clock cycles between exiting a power down mode and a subsequent command [e.g. tXP(MIN)=2 clock cycles; tXARD(MIN)=2 clock cycles]. Thus, the SDRAM may require a power down exit latency of two clock cycles.

Of course, for other DRAM or memory technologies, the power down entry latency and power down exit latency may be different, but this does not necessarily affect the operation of power management described here.

Accordingly, in the case of DDR2 SDRAM, a minimum total of five clock cycles may be required to enter and then immediately exit a power down mode (e.g. three cycles to satisfy tCKE(min) due to entry latency plus two cycles to satisfy tXP(MIN) or tXARD(MIN) due to exit latency). These five clock cycles may be hidden from the memory controller if power management is not being performed by the controller itself. Of course, it should be noted that other restrictions on the timing of entry and exit from the various power down modes may exist.

In one exemplary embodiment, the minimum power down entry latency for a DRAM circuit may be n clocks. In addition, in the case of DDR2, n=3, three cycles may be required to satisfy tCKE(MIN). Also, the minimum power down exit latency of a DRAM circuit may be x clocks. In the case of DDR2, x=2, two cycles may be required to satisfy tXP(MIN) and tXARD(MIN). Thus, the power management latency of a DRAM circuit in the present exemplary embodiment may require a minimum of k=n+x clocks for the DRAM circuit to enter power down mode and exit from power down mode. (e.g. DDR2, k=3+2=5 clock cycles).

DRAM Command Operation Period Embodiments

DRAM operations such as precharge or activate may require a certain period of time to complete. During this time, the DRAM, or portion(s) thereof (e.g. bank, etc.) to which the operation is directed may be unable to perform another operation. For example, a precharge operation in a bank of a DRAM circuit may require a certain period of time to complete (specified as tRP for DDR2).

During tRP and after a precharge operation has been initiated, the memory controller may not necessarily be allowed to direct another operation (e.g. activate, etc.) to the same bank of the DRAM circuit. The period of time between the initiation of an operation and the completion of that operation may thus be a command operation period. Thus, the memory controller may not necessarily be allowed to direct another operation to a particular DRAM circuit or portion thereof during a command operation period of various commands or operations. For example, the command operation period of a precharge operation or command may be equal to tRP. As another example, the command operation period of an activate command may be equal to tRCD.

In general, the command operation period need not be limited to a single command. A command operation period can also be defined for a sequence, combination, or pattern of commands. The power management schemes described herein thus need not be limited to a single command and associated command operation period; the schemes may equally be applied to sequences, patterns, and combinations of commands. It should also be noted that a command may have a first command operation period in a DRAM circuit to which the command is directed to, and also have a second command operation period in another DRAM circuit to which the command is not directed to. The first and second command operation periods need not be the same. In addition, a command may have different command operation periods in different mappings of physical DRAM circuits to the banks of a virtual DRAM circuit, and also under different conditions.

It should be noted that the command operation periods may be specified in nanoseconds. For example, tRP may be specified in nanoseconds, and may vary according to the speed grade of a DRAM circuit. Furthermore, tRP may be defined in JEDEC standards (e.g. currently JEDEC Standard No. 21-C for DDR2 SDRAM). Thus, tRP may be measured as an integer number of clock cycles. Optionally, the tRP may not necessarily be specified to be an exact number clock cycles. For DDR2 SDRAMs, the minimum value of tRP may be equivalent to three clock cycles or more.

In additional exemplary embodiments, power management schemes may be based on an interface circuit identifying at least one memory (e.g. DRAM, etc.) circuit that is not currently being accessed by the system. In response to the identification of the at least one memory circuit, a power saving operation may be initiated in association with the at least one memory circuit.

In one embodiment, such power saving operation may involve a power down operation, and in particular, a precharge power down operation, using the CKE pin of the DRAM circuits (e.g. a CKE power management scheme). Other similar power management schemes using other power down control methods and power down modes, with different commands and alternative memory circuit technologies, may also be used.

If the CKE power-management scheme does not involve the memory controller, then the presence of the scheme may be transparent to the memory controller. Accordingly, the power down entry latency and the power down exit latency may be hidden from the memory controller. In one embodiment, the power down entry and exit latencies may be hidden from the memory controller by opportunistically placing at least one first DRAM circuit into a power down mode and, if required, bringing at least one second DRAM circuit out of power down mode during a command operation period when the at least one first DRAM circuit is not being accessed by the system.

The identification of the appropriate command operation period during which at least one first DRAM circuit in a stack may be placed in power down mode or brought out of power down mode may be based on commands directed to the first DRAM circuit (e.g. based on commands directed to itself) or on commands directed to a second DRAM circuit (e.g. based on commands directed to other DRAM circuits).

In another embodiment, the command operation period of the DRAM circuit may be used to hide the power down entry and/or exit latencies. For example, the existing command operation periods of the physical DRAM circuits may be used to the hide the power down entry and/or exit latencies if the delays associated with one or more operations are long enough to hide the power down entry and/or exit latencies. In yet another embodiment, the command operation period of a virtual DRAM circuit may be used to hide the power down entry and/or exit latencies by making the command operation period of the virtual DRAM circuit longer than the command operation period of the physical DRAM circuits.

Thus, the interface circuit may simulate a plurality of physical DRAM circuits to appear as at least one virtual DRAM circuit with at least one command operation period that is different from that of the physical DRAM circuits. This embodiment may be used if the existing command operation periods of the physical DRAM circuits are not long enough to hide the power down entry and/or exit latencies, thus necessitating the interface circuit to increase the command operation periods by simulating a virtual DRAM circuit with at least one different (e.g. longer, etc.) command operation period from that of the physical DRAM circuits.

Specific examples of different power management schemes in various embodiments are described below for illustrative purposes. It should again be strongly noted that the following information is set forth for illustrative purposes and should not be construed as limiting in any manner.

Row Cycle Time Based Power Management Embodiments

Row cycle time based power management is an example of a power management scheme that uses the command operation period of DRAM circuits to hide power down entry and exit latencies. In one embodiment, the interface circuit may place at least one first physical DRAM circuit into power down mode based on the commands directed to a second physical DRAM circuit. Power management schemes such as a row cycle time based scheme may be best suited for a many-circuit-to-one-bank configuration of DRAM circuits.

As explained previously, in a many-circuit-to-one-bank configuration, a plurality of physical DRAM circuits may be mapped to a single bank of a larger capacity virtual DRAM circuit seen by the memory controller. For example, sixteen 256 Mb DDR2 physical SDRAM circuits may appear to the memory controller as a single 4 Gb virtual DDR2 SDRAM circuit. Since a 4 Gb DDR2 SDRAM circuit is specified by the JEDEC standards to have eight physical banks, two of the 256 Mb DDR2 physical SDRAM circuits may be mapped by the interface circuit to a single bank of the virtual 4 Gb DDR2 SDRAM circuit.

In one embodiment, bank 0 of the virtual 4 Gb DDR2 SDRAM circuit may be mapped by the interface circuit to two 256 Mb DDR2 physical SDRAM circuits (e.g. DRAM A and DRAM B). However, since only one page may be open in a bank of a DRAM circuit (either physical or virtual) at any given time, only one of DRAM A or DRAM B may be in the active state at any given time. If the memory controller issues a first activate (e.g. page open, etc.) command to bank 0 of the 4 Gb virtual DRAM, that command may be directed by the interface circuit to either DRAM A or DRAM B, but not to both.

In addition, the memory controller may be unable to issue a second activate command to bank 0 of the 4 Gb virtual DRAM until a period tRC has elapsed from the time the first activate command was issued by the memory controller. In this instance, the command operation period of an activate command may be tRC. The parameter tRC may be much longer than the power down entry and exit latencies.

Therefore, if the first activate command is directed by the interface circuit to DRAM A, then the interface circuit may place DRAM B in the precharge power down mode during the activate command operation period (e.g. for period tRC). As another option, if the first activate command is directed by the interface circuit to DRAM B, then it may place DRAM A in the precharge power down mode during the command operation period of the first activate command. Thus, if p physical DRAM circuits (where p is greater than 1) are mapped to a single bank of a virtual DRAM circuit, then at least p−1 of the p physical DRAM circuits may be subjected to a power saving operation. The power saving operation may, for example, comprise operating in precharge power down mode except when refresh is required. Of course, power savings may also occur in other embodiments without such continuity.

Row Precharge Time Based Power Management Embodiments

Row precharge time based power management is an example of a power management scheme that, in one embodiment, uses the precharge command operation period (that is the command operation period of precharge commands, tRP) of physical DRAM circuits to hide power down entry and exit latencies. In another embodiment, a row precharge time based power management scheme may be implemented that uses the precharge command operation period of virtual DRAM circuits to hide power down entry and exit latencies. In these schemes, the interface circuit may place at least one DRAM circuit into power down mode based on commands directed to the same at least one DRAM circuit. Power management schemes such as the row precharge time based scheme may be best suited for many-circuit-to-one-bank and one-circuit-to-one-bank configurations of physical DRAM circuits. A row precharge time based power management scheme may be particularly efficient when the memory controller implements a closed page policy.

A row precharge time based power management scheme may power down a physical DRAM circuit after a precharge or autoprecharge command closes an open bank. This power management scheme allows each physical DRAM circuit to enter power down mode when not in use. While the specific memory circuit technology used in this example is DDR2 and the command used here is the precharge or autoprecharge command, the scheme may be utilized in any desired context. This power management scheme uses an algorithm to determine if there is any required delay as well as the timing of the power management in terms of the command operation period.

In one embodiment, if the tRP of a physical DRAM circuit [tRP(physical)] is larger than k (where k is the power management latency), then the interface circuit may place that DRAM circuit into precharge power down mode during the command operation period of the precharge or autoprecharge command. In this embodiment, the precharge power down mode may be initiated following the precharge or autoprecharge command to the open bank in that physical DRAM circuit. Additionally, the physical DRAM circuit may be brought out of precharge power down mode before the earliest time a subsequent activate command may arrive at the inputs of the physical DRAM circuit. Thus, the power down entry and power down exit latencies may be hidden from the memory controller.

In another embodiment, a plurality of physical DRAM circuits may appear to the memory controller as at least one larger capacity virtual DRAM circuit with a tRP(virtual) that is larger than that of the physical DRAM circuits [e.g. larger than tRP(physical)]. For example, the physical DRAM circuits may, through simulation, appear to the memory controller as a larger capacity virtual DRAM with tRP(virtual)

equal to tRP(physical)+m, where m may be an integer multiple of the clock cycle, or may be a non-integer multiple of the clock cycle, or may be a constant or variable multiple of the clock cycle, or may be less than one clock cycle, or may be zero. Note that m may or may not be equal to j. If tRP(virtual) is larger than k, then the interface circuit may place a physical DRAM circuit into precharge power down mode in a subsequent clock cycle after a precharge or autoprecharge command to the open bank in the physical DRAM circuit has been received by the physical DRAM circuit. Additionally, the physical DRAM circuit may be brought out of precharge power down mode before the earliest time a subsequent activate command may arrive at the inputs of the physical DRAM circuit. Thus, the power down entry and power down exit latency may be hidden from the memory controller.

In yet another embodiment, the interface circuit may make the stack of physical DRAM circuits appear to the memory controller as at least one larger capacity virtual DRAM circuit with tRP(virtual) and tRCD(virtual) that are larger than that of the physical DRAM circuits in the stack [e.g. larger than tRP(physical) and tRCD(physical) respectively, where tRCD(physical) is the tRCD of the physical DRAM circuits]. For example, the stack of physical DRAM circuits may appear to the memory controller as a larger capacity virtual DRAM with tRP(virtual) and tRCD(virtual) equal to [tRP(physical)+m] and tRCD(physical)+l] respectively. Similar to m, 1 may be an integer multiple of the clock cycle, or may be a non-integer multiple of the clock cycle, or may be constant or variable multiple of the clock cycle, or may be less than a clock cycle, or may be zero. Also, 1 may or may not be equal to j and/or m. In this embodiment, if tRP(virtual) is larger than n (where n is the power down entry latency defined earlier), and if 1 is larger than or equal to x (where x is the power down exit latency defined earlier), then the interface circuit may use the following sequence of events to implement a row precharge time based power management scheme and also hide the power down entry and exit latencies from the memory controller.

First, when a precharge or autoprecharge command is issued to an open bank in a physical DRAM circuit, the interface circuit may place that physical DRAM circuit into precharge power down mode in a subsequent clock cycle after the precharge or autoprecharge command has been received by that physical DRAM circuit. The interface circuit may continue to keep the physical DRAM circuit in the precharge power down mode until the interface circuit receives a subsequent activate command to that physical DRAM circuit.

Second, the interface circuit may then bring the physical DRAM circuit out of precharge power down mode by asserting the CKE input of the physical DRAM in a following clock cycle. The interface circuit may also delay the address and control signals associated with the activate command for a minimum of x clock cycles before sending the signals associated with the activate command to the physical DRAM circuit.

The row precharge time based power management scheme described above is suitable for many-circuit-to-one-bank and one-circuit-to-one-bank configurations since there is a guaranteed minimum period of time (e.g. a keep-out period) of at least tRP(physical) after a precharge command to a physical DRAM circuit during which the memory controller will not issue a subsequent activate command to the same physical DRAM circuit. In other words, the command operation period of a precharge command applies to the entire DRAM circuit. In the case of one-circuit-to-many-bank configurations, there is no guarantee that a precharge command to a first portion(s) (e.g. bank) of a physical DRAM circuit will not be immediately followed by an activate command to a second portion(s) (e.g. bank) of the same physical DRAM circuit. In this case, there is no keep-out period to hide the power down entry and exit latencies. In other words, the command operation period of a precharge command applies only to a portion of the physical DRAM circuit.

For example, four 512 Mb physical DDR2 SDRAM circuits through simulation may appear to the memory controller as a single 2 Gb virtual DDR2 SDRAM circuit with eight banks. Therefore, the interface circuit may map two banks of the 2 Gb virtual DRAM circuit to each 512 Mb physical DRAM circuit. Thus, banks 0 and 1 of the 2 Gb virtual DRAM circuit may be mapped to a single 512 Mb physical DRAM circuit (e.g. DRAM C). In addition, bank 0 of the virtual DRAM circuit may have an open page while bank 1 of the virtual DRAM circuit may have no open page.

When the memory controller issues a precharge or autoprecharge command to bank 0 of the 2 Gb virtual DRAM circuit, the interface circuit may signal DRAM C to enter the precharge power down mode after the precharge or autoprecharge command has been received by DRAM C. The interface circuit may accomplish this by de-asserting the CKE input of DRAM C during a clock cycle subsequent to the clock cycle in which DRAM C received the precharge or autoprecharge command. However, the memory controller may issue an activate command to the bank 1 of the 2 Gb virtual DRAM circuit on the next clock cycle after it issued the precharge command to bank 0 of the virtual DRAM circuit.

However, DRAM C may have just entered a power down mode and may need to exit power down immediately. As described above, a DDR2 SDRAM may require a minimum of k=5 clock cycles to enter a power down mode and immediately exit the power down mode. In this example, the command operation period of the precharge command to bank 0 of the 2 Gb virtual DRAM circuit may not be sufficiently long enough to hide the power down entry latency of DRAM C even if the command operation period of the activate command to bank 1 of the 2 Gb virtual DRAM circuit is long enough to hide the power down exit latency of DRAM C, which would then cause the simulated 2 Gb virtual DRAM circuit to not be in compliance with the DDR2 protocol. It is therefore difficult, in a simple fashion, to hide the power management latency during the command operation period of precharge commands in a one-circuit-to-many-bank configuration.

Row Activate Time Based Power Management Embodiments

Row activate time based power management is a power management scheme that, in one embodiment, may use the activate command operation period (that is the command operation period of activate commands) of DRAM circuits to hide power down entry latency and power down exit latency.

In a first embodiment, a row activate time based power management scheme may be used for one-circuit-to-many-bank configurations. In this embodiment, the power down entry latency of a physical DRAM circuit may be hidden behind the command operation period of an activate command directed to a different physical DRAM circuit. Additionally, the power down exit latency of a physical DRAM circuit may be hidden behind the command operation period of an activate command directed to itself. The activate command operation periods that are used to hide power down entry and exit latencies may be tRRD and tRCD respectively.

In a second embodiment, a row activate time based power management scheme may be used for many-circuit-to-one-bank and one-circuit-to-one-bank configurations. In this embodiment, the power down entry and exit latencies of a physical DRAM circuit may be hidden behind the command operation period of an activate command directed to itself. In this embodiment, the command operation period of an activate command may be tRCD.

In the first embodiment, a row activate time based power management scheme may place a first DRAM circuit that has no open banks into a power down mode when an activate command is issued to a second DRAM circuit if the first and second DRAM circuits are part of a plurality of physical DRAM circuits that appear as a single virtual DRAM circuit to the memory controller. This power management scheme may allow each DRAM circuit to enter power down mode when not in use. This embodiment may be used in one-circuit-to-many-bank configurations of DRAM circuits. While the specific memory circuit technology used in this example is DDR2 and the command used here is the activate command, the scheme may be utilized in any desired context. The scheme uses an algorithm to determine if there is any required delay as well as the timing of the power management in terms of the command operation period.

In a one-circuit-to-many-bank configuration, a plurality of banks of a virtual DRAM circuit may be mapped to a single physical DRAM circuit. For example, four 512 Mb DDR2 SDRAM circuits through simulation may appear to the memory controller as a single 2 Gb virtual DDR2 SDRAM circuit with eight banks. Therefore, the interface circuit may map two banks of the 2 Gb virtual DRAM circuit to each 512 Mb physical DRAM circuit. Thus, banks 0 and 1 of the 2 Gb virtual DRAM circuit may be mapped to a first 512 Mb physical DRAM circuit (e.g. DRAM P). Similarly, banks 2 and 3 of the 2 Gb virtual DRAM circuit may be mapped to a second 512 Mb physical DRAM circuit (e.g. DRAM Q), banks 4 and 5 of the 2 Gb virtual DRAM circuit may be mapped to a third 512 Mb physical DRAM circuit (e.g. DRAM R), and banks 6 and 7 of the 2 Gb virtual DRAM circuit may be mapped to a fourth 512 Mb physical DRAM circuit (e.g. DRAM S).

In addition, bank 0 of the virtual DRAM circuit may have an open page while all the other banks of the virtual DRAM circuit may have no open pages. When the memory controller issues a precharge or autoprecharge command to bank 0 of the 2 Gb virtual DRAM circuit, the interface circuit may not be able to place DRAM P in precharge power down mode after the precharge or autoprecharge command has been received by DRAM P. This may be because the memory controller may issue an activate command to bank 1 of the 2 Gb virtual DRAM circuit in the very next cycle. As described previously, a row precharge time based power management scheme may not be used in a one-circuit-to-many-bank configuration since there is no guaranteed keep-out period after a precharge or autoprecharge command to a physical DRAM circuit.

However, since physical DRAM circuits DRAM P, DRAM Q, DRAM R, and DRAM S all appear to the memory controller as a single 2 Gb virtual DRAM circuit, the memory controller may ensure a minimum period of time, tRRD(MIN), between activate commands to the single 2 Gb virtual DRAM circuit. For DDR2 SDRAMs, the active bank N to active bank M command period tRRD may be variable with a minimum value of tRRD(MIN) (e.g. 2 clock cycles, etc.).

The parameter tRRD may be specified in nanoseconds and may be defined in JEDEC Standard No. 21-C. For example, tRRD may be measured as an integer number of clock cycles. Optionally, tRRD may not be specified to be an exact number of clock cycles. The tRRD parameter may mean an activate command to a second bank B of a DRAM circuit (either physical DRAM circuit or virtual DRAM circuit) may not be able to follow an activate command to a first bank A of the same DRAM circuit in less than tRRD clock cycles.

If tRRD(MIN)=n (where n is the power down entry latency), a first number of physical DRAM circuits that have no open pages may be placed in power down mode when an activate command is issued to another physical DRAM circuit that through simulation is part of the same virtual DRAM circuit. In the above example, after a precharge or autoprecharge command has closed the last open page in DRAM P, the interface circuit may keep DRAM P in precharge standby mode until the memory controller issues an activate command to one of DRAM Q, DRAM R, and DRAM S. When the interface circuit receives the above-mentioned activate command, it may then immediately place DRAM P into precharge power down mode if tRRD(MIN)≥n.

Optionally, when one of the interface circuits is a register, the above power management scheme may be used even if tRRD(MIN)<n as long as tRRD(MIN)=n−1. In this optional embodiment, the additional typical one clock cycle delay through a JEDEC register helps to hide the power down entry latency if tRRD(MIN) by itself is not sufficiently long to hide the power down entry latency.

The above embodiments of a row activate time power management scheme require 1 to be larger than or equal to x (where x is the power down exit latency) so that when the memory controller issues an activate command to a bank of the virtual DRAM circuit, and if the corresponding physical DRAM circuit is in precharge power down mode, the interface circuit can hide the power down exit latency of the physical DRAM circuit behind the row activate time tRCD of the virtual DRAM circuit. The power down exit latency may be hidden because the interface circuit may simulate a plurality of physical DRAM circuits as a larger capacity virtual DRAM circuit with tRCD(virtual)=tRCD(physical)+1, where tRCD(physical) is the tRCD of the physical DRAM circuits.

Therefore, when the interface circuit receives an activate command that is directed to a DRAM circuit that is in precharge power down mode, it will delay the activate command by at least x clock cycles while simultaneously bringing the DRAM circuit out of power down mode. Since 1≥x, the command operation period of the activate command may overlap the power down exit latency, thus allowing the interface circuit to hide the power down exit latency behind the row activate time.

Using the same example as above, DRAM P may be placed into precharge power down mode after the memory controller issued a precharge or autoprecharge command to the last open page in DRAM P and then issued an activate command to one of DRAM Q, DRAM R, and DRAM S. At a later time, when the memory controller issues an activate command to DRAM P, the interface circuit may immediately bring DRAM P out of precharge power down mode while delaying the activate command to DRAM P by at least x clock cycles. Since 1≥x, DRAM P may be ready to receive the delayed activate command when the interface circuit sends the activate command to DRAM P.

For many-circuit-to-one-bank and one-circuit-to-one-bank configurations, another embodiment of the row activate time based power management scheme may be used. For both many-circuit-to-one-bank and one-circuit-to-one-bank configurations, an activate command to a physical DRAM circuit may have a keep-out or command operation period of at least tRCD(virtual) clock cycles [tRCD(virtual) =tRCD(physical)+1]. Since each physical DRAM circuit is mapped to one bank (or portion(s) thereof) of a larger capacity virtual DRAM circuit, it may be certain that no command may be issued to a physical DRAM circuit for a minimum of tRCD(virtual) clock cycles after an activate command has been issued to the physical DRAM circuit.

If tRCD(physical) or tRCD(virtual) is larger than k (where k is the power management latency), then the interface circuit may place the physical DRAM circuit into active power down mode on the clock cycle after the activate command has been received by the physical DRAM circuit and bring the physical DRAM circuit out of active power down mode before the earliest time a subsequent read or write command may arrive at the inputs of the physical DRAM circuit. Thus, the power down entry and power down exit latencies may be hidden from the memory controller.

The command and power down mode used for the activate command based power-management scheme may be the activate command and precharge or active power down modes, but other similar power down schemes may use different power down modes, with different commands, and indeed even alternative DRAM circuit technologies may be used.

Refresh Cycle Time Based Power Management Embodiments

Refresh cycle time based power management is a power management scheme that uses the refresh command operation period (that is the command operation period of refresh commands) of virtual DRAM circuits to hide power down entry and exit latencies. In this scheme, the interface circuit places at least one physical DRAM circuit into power down mode based on commands directed to a different physical DRAM circuit. A refresh cycle time based power management scheme that uses the command operation period of virtual DRAM circuits may be used for many-circuit-to-one-bank, one-circuit-to-one-bank, and one-circuit-to-many-bank configurations.

Refresh commands to a DRAM circuit may have a command operation period that is specified by the refresh cycle time, tRFC. The minimum and maximum values of the refresh cycle time, tRFC, may be specified in nanoseconds and may further be defined in the JEDEC standards (e.g. JEDEC Standard No. 21-C for DDR2 SDRAM, etc.). In one embodiment, the minimum value of tRFC [e.g. tRFC(MIN)] may vary as a function of the capacity of the DRAM circuit. Larger capacity DRAM circuits may have larger values of tRFC(MIN) than smaller capacity DRAM circuits. The parameter tRFC may be measured as an integer number of clock cycles, although optionally the tRFC may not be specified to be an exact number clock cycles.

A memory controller may initiate refresh operations by issuing refresh control signals to the DRAM circuits with sufficient frequency to prevent any loss of data in the DRAM circuits. After a refresh command is issued to a DRAM circuit, a minimum time (e.g. denoted by tRFC) may be required to elapse before another command may be issued to that DRAM circuit. In the case where a plurality of physical DRAM circuits through simulation by an interface circuit may appear to the memory controller as at least one larger capacity virtual DRAM circuit, the command operation period of the refresh commands (e.g. the refresh cycle time, tRFC) from the memory controller may be larger than that required by the DRAM circuits. In other words, tRFC (virtual)>tRFC(physical), where tRFC(physical) is the refresh cycle time of the smaller capacity physical DRAM circuits.

When the interface circuit receives a refresh command from the memory controller, it may refresh the smaller capacity physical DRAM circuits within the span of time specified by the tRFC associated with the larger capacity virtual DRAM circuit. Since the tRFC of the virtual DRAM circuit may be larger than that of the associated physical DRAM circuits, it may not be necessary to issue refresh commands to all of the physical DRAM circuits simultaneously. Refresh commands may be issued separately to individual physical DRAM circuits or may be issued to groups of physical DRAM circuits, provided that the tRFC requirement of the physical DRAM circuits is satisfied by the time the tRFC of the virtual DRAM circuit has elapsed.

In one exemplary embodiment, the interface circuit may place a physical DRAM circuit into power down mode for some period of the tRFC of the virtual DRAM circuit when other physical DRAM circuits are being refreshed. For example, four 512 Mb physical DRAM circuits (e.g. DRAM W, DRAM X, DRAM Y, DRAM Z) through simulation by an interface circuit may appear to the memory controller as a 2 Gb virtual DRAM circuit. When the memory controller issues a refresh command to the 2 Gb virtual DRAM circuit, it may not issue another command to the 2 Gb virtual DRAM circuit at least until a period of time, tRFC(MIN) (virtual), has elapsed.

Since the tRFC(MIN)(physical) of the 512 Mb physical DRAM circuits (DRAM W, DRAM X, DRAM Y, and DRAM Z) may be smaller than the tRFC(MIN)(virtual) of the 2 Gb virtual DRAM circuit, the interface circuit may stagger the refresh commands to DRAM W, DRAM X, DRAM Y, DRAM Z such that that total time needed to refresh all the four physical DRAM circuits is less than or equal to the tRFC(MIN)(virtual) of the virtual DRAM circuit. In addition, the interface circuit may place each of the physical DRAM circuits into precharge power down mode either before or after the respective refresh operations.

For example, the interface circuit may place DRAM Y and DRAM Z into power down mode while issuing refresh commands to DRAM W and DRAM X. At some later time, the interface circuit may bring DRAM Y and DRAM Z out of power down mode and issue refresh commands to both of them. At a still later time, when DRAM W and DRAM X have finished their refresh operation, the interface circuit may place both of them in a power down mode. At a still later time, the interface circuit may optionally bring DRAM W and DRAM X out of power down mode such that when DRAM Y and DRAM Z have finished their refresh operations, all four DRAM circuits are in the precharge standby state and ready to receive the next command from the memory controller. In another example, the memory controller may place DRAM W, DRAM X, DRAM Y, and DRAM Z into precharge power down mode after the respective refresh operations if the power down exit latency of the DRAM circuits may be hidden behind the command operation period of the activate command of the virtual 2 Gb DRAM circuit.

FB-DIMM Power Management Embodiments

Figure 24:
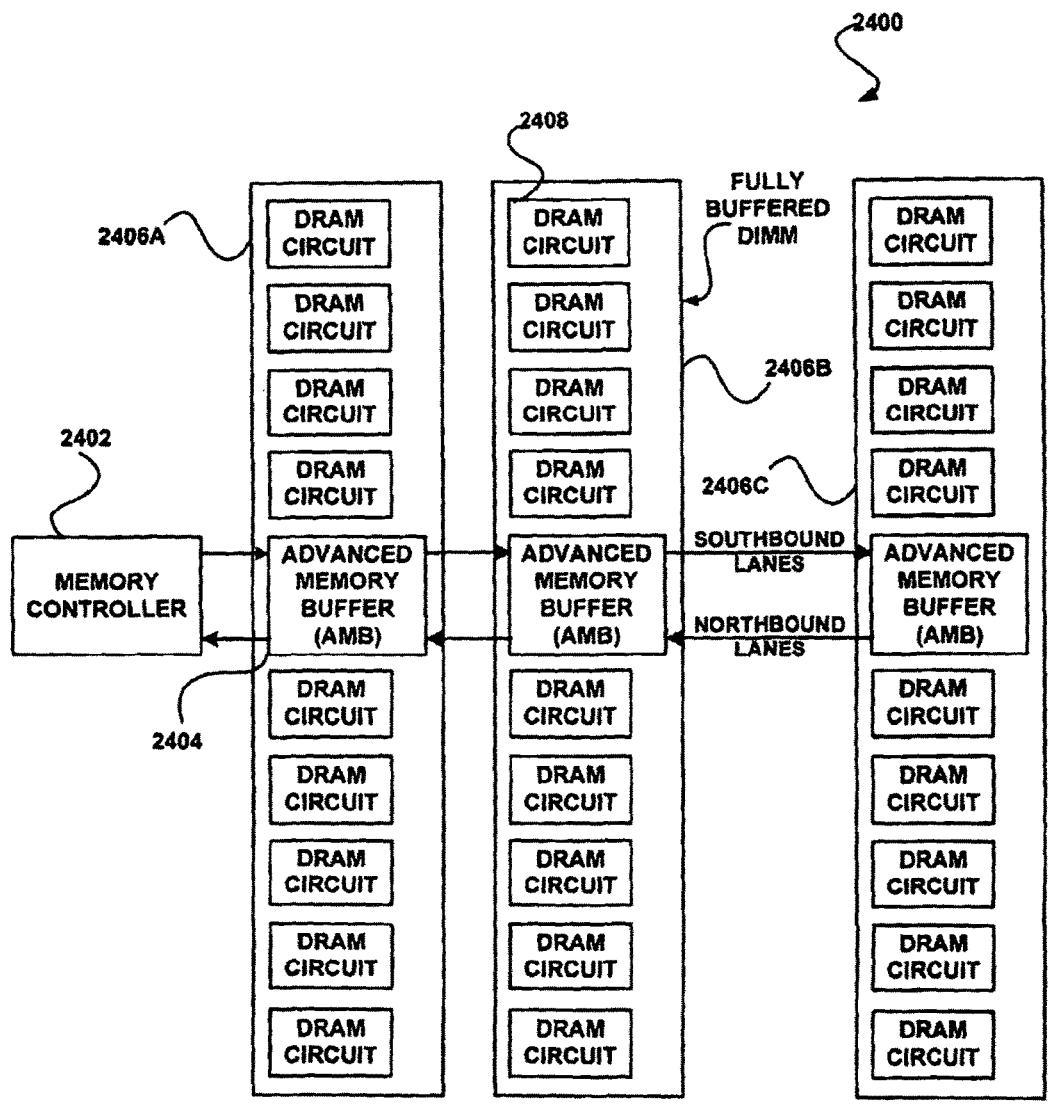
FIG. 24 shows a memory system comprising FB-DIMM modules using DRAM circuits with AMB chips, in accordance with another embodiment.

FIG. 24 shows a memory system 2400 comprising FB-DIMM modules using DRAM circuits with AMB chips, in accordance with another embodiment. As an option, the memory system 2400 may be implemented in the context of the architecture and environment of FIGS. 19-23. Of course, however, the memory system 2400 may be implemented in any desired environment. It should also be noted that the aforementioned definitions may apply during the present description.

As described herein, the memory circuit power management scheme may be associated with an FB-DIMM memory system that uses DDR2 SDRAM circuits. However, other memory circuit technologies such as DDR3 SDRAM, Mobile DDR SDRAM, etc. may provide similar control inputs and modes for power management and the example described in this section can be used with other types of buffering schemes and other memory circuit technologies. Therefore, the description of the specific example should not be construed as limiting in any manner.

In an FB-DIMM memory system 2400, a memory controller 2402 may place commands and write data into frames and send the frames to interface circuits (e.g. AMB chip 2404, etc.). Further, in the FB-DIMM memory system 2400, there may be one AMB chip 2404 on each of a plurality of DIMMs 2406A-C. For the memory controller 2402 to address and control DRAM circuits, it may issue commands that are placed into frames.

The command frames or command and data frames may then be sent by the memory controller 2402 to the nearest AMB chip 2404 through a dedicated outbound path, which may be denoted as a southbound lane. The AMB chip 2404 closest to the memory controller 2402 may then relay the frames to the next AMB chip 2404 via its own southbound lane. In this manner, the frames may be relayed to each AMB chip 2404 in the FB-DIMM memory channel.

In the process of relaying the frames, each AMB chip 2404 may partially decode the frames to determine if a given frame contains commands targeted to the DRAM circuits on that the associated DIMM 2406A-C. If a frame contains a read command addressed to a set of DRAM circuits on a given DIMM 2406A-C, the AMB chip 2404 on the associated DIMM 2406A-C accesses DRAM circuits 2408 to retrieve the requested data. The data may be placed into frames and returned to the memory controller 2402 through a similar frame relay process on the northbound lanes as that described for the southbound lanes.

Two classes of scheduling algorithms may be utilized for AMB chips 2404 to return data frames to the memory controller 2402, including variable-latency scheduling and fixed-latency scheduling. With respect to variable latency scheduling, after a read command is issued to the DRAM circuits 2408, the DRAM circuits 2408 return data to the AMB chip 2404. The AMB chip 2404 then constructs a data frame, and as soon as it can, places the data frame onto the northbound lanes to return the data to the memory controller 2402. The variable latency scheduling algorithm may ensure the shortest latency for any given request in the FB-DIMM channel.

However, in the variable latency scheduling algorithm, DRAM circuits 2408 located on the DIMM (e.g. the DIMM 2406A, etc.) that is closest to the memory controller 2402 may have the shortest access latency, while DRAM circuits 2408 located on the DIMM (e.g. the DIMM 2406C, etc.) that is at the end of the channel may have the longest access latency. As a result, the memory controller 2402 may be sophisticated, such that command frames may be scheduled appropriately to ensure that data return frames do not collide on the northbound lanes.

In a FB-DIMM memory system 2400 with only one or two DIMMs 2406A-C, variable latency scheduling may be easily performed since there may be limited situations where data frames may collide on the northbound lanes. However, variable latency scheduling may be far more difficult if the memory controller 2402 has to be designed to account for situations where the FB-DIMM channel can be configured with one DIMM, eight DIMMs, or any other number of DIMMs. Consequently, the fixed latency scheduling algorithm may be utilized in an FB-DIMM memory system 2400 to simplify memory controller design.

In the fixed latency scheduling algorithm, every DIMM 2406A-C is configured to provide equal access latency from the perspective of the memory controller 2402. In such a case, the access latency of every DIMM 2406A-C may be equalized to the access latency of the slowest-responding DIMM (e.g. the DIMM 2406C, etc.). As a result, the AMB chips 2404 that are not the slowest responding AMB chip 2404 (e.g. the AMB chip 2404 of the DIMM 2406C, etc.) may be configured with additional delay before it can upload the data frames into the northbound lanes.

From the perspective of the AMB chips 2404 that are not the slowest responding AMB chip 2404 in the system, data access occurs as soon as the DRAM command is decoded and sent to the DRAM circuits 2408. However, the AMB chips 2404 may then hold the data for a number of cycles before this data is returned to the memory controller 2402 via the northbound lanes. The data return delay may be different for each AMB chip 2404 in the FB-DIMM channel.

Since the role of the data return delay is to equalize the memory access latency for each DIMM 2406A-C, the data return delay value may depend on the distance of the DIMM 2406A-C from the memory controller 2402 as well as the access latency of the DRAM circuits 2408 (e.g. the respective delay values may be computed for each AMB chip 2404 in a given FB-DIMM channel, and programmed into the appropriate AMB chip 2404.

In the context of the memory circuit power management scheme, the AMB chips 2404 may use the programmed delay values to perform differing classes of memory circuit power management algorithms. In cases where the programmed data delay value is larger than $k=n+x$, where n is the minimum power down entry latency, x is the minimum power down exit latency, and k is the cumulative sum of the two, the AMB chip 2404 can provide aggressive power management before and after every command. In particular, the large delay value ensures that the AMB chip 2404 can place DRAM circuits 2408 into power down modes and move them to active modes as needed.

In the cases where the programmed data delay value is smaller than k, but larger than x, the AMB chip 2404 can place DRAM circuits 2408 into power down modes selectively after certain commands, as long as these commands provide the required command operation periods to hide the minimum power down entry latency. For example, the AMB chip 2404 can choose to place the DRAM circuits 2408 into a power down mode after a refresh command, and the DRAM circuits 2408 can be kept in the power down mode until a command is issued by the memory controller 2402 to access the specific set of DRAM circuits 2408. Finally, in cases where the programmed data delay is smaller than x, the AMB chip 2404 may choose to implement power management algorithms to a selected subset of DRAM circuits 2408.

There are various optional characteristics and benefits available when using CKE power management in FB-DIMMs. First, there is not necessarily a need for explicit CKE commands, and therefore there is not necessarily a need to use command bandwidth. Second, granularity is provided, such that CKE power management will power down DRAM circuits as needed in each DIMM. Third, the CKE power management can be most aggressive in the DIMM that is closest to the controller (e.g. the DIMM closest to the memory controller which contains the AMB chip that consumes the highest power because of the highest activity rates).

Other Embodiments

While many examples of power management schemes for memory circuits have been described above, other implementations are possible. For DDR2, for example, there may be approximately 15 different commands that could be used with a power management scheme. The above descriptions allow each command to be evaluated for suitability and then appropriate delays and timing may be calculated. For other memory circuit technologies, similar power saving schemes and classes of schemes may be derived from the above descriptions.

The schemes described are not limited to be used by themselves. For example, it is possible to use a trigger that is more complex than a single command in order to initiate power management. In particular, power management schemes may be initiated by the detection of combinations of commands, or patterns of commands, or by the detection of an absence of commands for a certain period of time, or by any other mechanism.

Power management schemes may also use multiple triggers including forming a class of power management schemes using multiple commands or multiple combinations of commands. Power management schemes may also be used in combination. Thus, for example, a row precharge time based power management scheme may be used in combination with a row activate time command based power management scheme.

The description of the power management schemes in the above sections has referred to an interface circuit in order to perform the act of signaling the DRAM circuits and for introducing delay if necessary. An interface circuit may optionally be a part of the stack of DRAM circuits. Of course, however, the interface circuit may also be separate from the stack of DRAM circuits. In addition, the interface circuit may be physically located anywhere in the stack of DRAM circuits, where such interface circuit electrically sits between the electronic system and the stack of DRAM circuits.

In one implementation, for example, the interface circuit may be split into several chips that in combination perform the power management functions described. Thus, for example, there may be a single register chip that electrically sits between the memory controller and a number of stacks of DRAM circuits. The register chip may optionally perform the signaling to the DRAM circuits.

The register chip may further be connected electrically to a number of interface circuits that sit electrically between the register chip and a stack of DRAM circuits. The interface circuits in the stacks of DRAM circuits may then perform the required delay if it is needed. In another implementation there may be no need for an interface circuit in each DRAM stack. In that case, the register chip can perform the signaling to the DRAM circuits directly. In yet another implementation, a plurality of register chips and buffer chips may sit electrically between the stacks of DRAM circuits and the system, where both the register chips and the buffer chips perform the signaling to the DRAM circuits as well as delaying the address, control, and data signals to the DRAM circuits. In another implementation there may be no need for a stack of DRAM circuits. Thus each stack may be a single memory circuit.

Further, the power management schemes described for the DRAM circuits may also be extended to the interface circuits. For example, the interface circuits have information that a signal, bus, or other connection will not be used for a period of time. During this period of time, the interface circuits may perform power management on themselves, on other interface circuits, or cooperatively. Such power management may, for example, use an intelligent signaling mechanism (e.g. encoded signals, sideband signals, etc.) between interface circuits (e.g. register chips, buffer chips, AMB chips, etc.).

It should thus be clear that the power management schemes described here are by way of specific examples for a particular technology, but that the methods and techniques are very general and may be applied to any memory circuit technology to achieve control over power behavior including, for example, the realization of power consumption savings and management of current consumption behavior.

DRAM Circuit Configuration Verification Embodiments

In the various embodiments described above, it may be desirable to verify that the simulated DRAM circuit including any power management scheme or CAS latency simulation or any other simulation behaves according to a desired DRAM standard or other design specification. A behavior of many DRAM circuits is specified by the JEDEC standards and it may be desirable, in some embodiments, to exactly simulate a particular JEDEC standard DRAM. The JEDEC standard may define control signals that a DRAM circuit must accept and the behavior of the DRAM circuit as a result of such control signals. For example, the JEDEC specification for a DDR2 SDRAM may include JESD79-2B (and any associated revisions).

If it is desired, for example, to determine whether a JEDEC standard is met, an algorithm may be used. Such algorithm may check, using a set of software verification tools for formal verification of logic, that protocol behavior of the simulated DRAM circuit is the same as a desired standard or other design specification. This formal verification may be feasible because the DRAM protocol described in a DRAM standard may, in various embodiments, be limited to a few protocol commands (e.g. approximately 15 protocol commands in the case of the JEDEC DDR2 specification, for example).

Examples of the aforementioned software verification tools include MAGELLAN supplied by SYNOPSYS, or other software verification tools, such as INCISIVE supplied by CADENCE, verification tools supplied by JASPER, VERIX supplied by REAL INTENT, 0-IN supplied by MENTOR CORPORATION, etc. These software verification tools may use written assertions that correspond to the rules established by the DRAM protocol and specification.

The written assertions may be further included in code that forms the logic description for the interface circuit. By writing assertions that correspond to the desired behavior of the simulated DRAM circuit, a proof may be constructed that determines whether the desired design requirements are met. In this way, one may test various embodiments for compliance with a standard, multiple standards, or other design specification.

For example, assertions may be written that there are no conflicts on the address bus, command bus or between any clock, control, enable, reset or other signals necessary to operate or associated with the interface circuits and/or DRAM circuits. Although one may know which of the various interface circuit and DRAM stack configurations and address mappings that have been described herein are suitable, the aforementioned algorithm may allow a designer to prove that the simulated DRAM circuit exactly meets the required standard or other design specification. If, for example, an address mapping that uses a common bus for data and a common bus for address results in a control and clock bus that does not meet a required specification, alternative designs for the interface circuit with other bus arrangements or alternative designs for the interconnect between the components of the interface circuit may be used and tested for compliance with the desired standard or other design specification.

While the foregoing is directed to embodiments of the present invention, other and further embodiments of the invention may be devised without departing from the basic scope thereof.

What is claimed is:

1. A sub-system, comprising:
   an interface circuit adapted for coupling with a plurality of physical memory circuits and a system, the interface circuit configured to:
   interface the plurality of physical memory circuits and the system to emulate a virtual memory circuit having a command operation period for performing a particular operation on the virtual memory circuit that is longer than a latency associated with performing a power-management operation on a physical memory circuit of the plurality of physical memory circuits;
   receive a command from the system directed to the virtual memory circuit to perform the particular operation;
   determine that the command is directed to a first physical memory circuit of the plurality of physical memory circuits; and
   in response to determining that the command is directed to the first physical memory circuit of the plurality of physical memory circuits, perform a power-management operation on a second, different physical memory circuit of the plurality of physical memory circuits.

2. The sub-system of claim 1, wherein interfacing the plurality of physical memory circuits and the system to emulate the virtual memory circuit comprises:
   using the plurality of physical memory circuits to emulate the virtual memory circuit; and
   presenting the virtual memory circuit to the system, wherein the virtual memory circuit appears to the system as having the command operation period for performing the particular operation.

3. The sub-system of claim 1, wherein the virtual memory circuit has a larger memory capacity than a memory capacity of any one of the physical memory circuits.

4. The sub-system of claim 1, wherein the command comprises an activate command.

5. The sub-system of claim 1, wherein the command comprises a page open command.

6. The sub-system of claim 1, wherein performing the power-management on the second, different memory circuit of the plurality of physical memory circuits further comprises placing the second physical memory circuit in a power down mode.

7. The sub-system of claim 1, wherein performing the power-management on the second, different memory circuit of the plurality of physical memory circuits further comprises placing the second physical memory circuit in a pre-charge power down mode.

8. The sub-system of claim 1, wherein the command operation period is longer than a power down entry latency or a power down exit latency of a portion of the other physical memory circuits.

9. A method comprising:
   interfacing, by an interface circuit adapted for coupling with a plurality of physical memory circuits and a system, the plurality of physical memory circuits and the system to emulate a virtual memory circuit having a command operation period for performing a particular operation on the virtual memory circuit that is longer than a latency associated with performing a power-management operation on a physical memory circuit of the plurality of physical memory circuits;
   receiving a command from the system directed to the virtual memory circuit to perform the particular operation;
   determining that the command is directed to a first physical memory circuit of the plurality of physical memory circuits; and
   in response to determining that the command is directed to the first physical memory circuit of the plurality of physical memory circuits, performing a power-management operation on a second, different physical memory circuit of the plurality of physical memory circuits.

10. The method of claim 9, wherein interfacing the plurality of physical memory circuits and the system to emulate the virtual memory circuit comprises:
    using the plurality of physical memory circuits to emulate the virtual memory circuit; and
    presenting the virtual memory circuit to the system, wherein the virtual memory circuit appears to the system as having the command operation period for performing the particular operation.

11. The method of claim 9, wherein the virtual memory circuit has a larger memory capacity than a memory capacity of any one of the physical memory circuits.

12. The method of claim 9, wherein the command comprises an activate command.

13. The method of claim 9, wherein the command comprises a page open command.

14. The method of claim 9, wherein performing the power-management on the second, different memory circuit of the plurality of physical memory circuits further comprises placing the second physical memory circuit in a power down mode.

15. The method of claim 9, wherein performing the power-management on the second, different memory circuit of the plurality of physical memory circuits further comprises placing the second physical memory circuit in a pre-charge power down mode.

16. The method of claim 9, wherein the command operation period is longer than a power down entry latency or a power down exit latency of a portion of the other physical memory circuits.

17. A system, comprising:
a plurality of physical memory circuits; and
an interface circuit adapted for coupling with the plurality of physical memory circuits and a host system, the interface circuit configured to:
interface the plurality of physical memory circuits and the host system to emulate a virtual memory circuit having a command operation period for performing a particular operation on the virtual memory circuit that is longer than a latency associated with performing a power-management operation on a physical memory circuit of the plurality of physical memory circuits;
receive a command from the host system directed to the virtual memory circuit to perform the particular operation;
determine that the command is directed to a first physical memory circuit of the plurality of physical memory circuits; and
in response to determining that the command is directed to the first physical memory circuit of the plurality of physical memory circuits, perform a power-management operation on a second, different physical memory circuit of the plurality of physical memory circuits.

18. The system of claim 17, wherein interfacing the plurality of physical memory circuits and the host system to emulate the virtual memory circuit comprises:
using the plurality of physical memory circuits to emulate the virtual memory circuit; and
presenting the virtual memory circuit to the host system, wherein the virtual memory circuit appears to the host system as having the command operation period for performing the particular operation.

19. The system of claim 17, wherein the virtual memory circuit has a larger memory capacity than a memory capacity of any one of the physical memory circuits.

20. The system of claim 17, wherein performing the power-management on the second, different memory circuit of the plurality of physical memory circuits further comprises placing the second physical memory circuit in a power down mode.

* * * * *